US009687957B2

United States Patent
Miyazaki et al.

(10) Patent No.: US 9,687,957 B2
(45) Date of Patent: Jun. 27, 2017

(54) SUBSTRATE PROCESSING APPARATUS, SUBSTRATE PROCESSING METHOD, SUBSTRATE HOLDING MECHANISM, AND SUBSTRATE HOLDING METHOD

(71) Applicant: EBARA CORPORATION, Tokyo (JP)

(72) Inventors: Mitsuru Miyazaki, Tokyo (JP); Seiji Katsuoka, Tokyo (JP); Naoki Matsuda, Tokyo (JP); Junji Kunisawa, Tokyo (JP); Kenichi Kobayashi, Tokyo (JP); Hiroshi Sotozaki, Tokyo (JP); Hiroyuki Shinozaki, Tokyo (JP); Osamu Nabeya, Tokyo (JP); Shinya Morisawa, Tokyo (JP); Takahiro Ogawa, Tokyo (JP); Natsuki Makino, Tochigi (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 14/530,589

(22) Filed: Oct. 31, 2014

(65) Prior Publication Data
US 2015/0050863 A1 Feb. 19, 2015

Related U.S. Application Data

(60) Division of application No. 14/309,152, filed on Jun. 19, 2014, now Pat. No. 9,358,662, which is a (Continued)

(30) Foreign Application Priority Data

Jun. 4, 2008 (JP) ................................ 2008-147220
Jul. 24, 2008 (JP) ................................ 2008-190834
Apr. 28, 2009 (JP) ................................ 2009-108671

(51) Int. Cl.
*B24B 37/34* (2012.01)
*H01L 21/677* (2006.01)
(Continued)

(52) U.S. Cl.
CPC ...... *B24B 37/345* (2013.01); *H01L 21/30625* (2013.01); *H01L 21/67219* (2013.01);
(Continued)

(58) Field of Classification Search
CPC ....... B24B 37/345; B24B 37/32; B24B 15/08; B24B 7/24; B24B 21/18; B24B 21/00;
(Continued)

(56) References Cited

U.S. PATENT DOCUMENTS 5,397,212 A 3/1995 Watanabe et al.
5,647,792 A 7/1997 Katsuoka et al.
(Continued)

FOREIGN PATENT DOCUMENTS

EP 1034887 A2 9/2000
EP 1204139 A1 5/2002
(Continued)

OTHER PUBLICATIONS

Isobe et al.; "Newly Developed CMP System F-REX 300SII"; Ebara Times, No. 213(Oct. 2006); 8 pages; abstract and English translation.
(Continued)

*Primary Examiner* — Dung Van Nguyen
(74) *Attorney, Agent, or Firm* — Baker & Hostetler LLP

(57) ABSTRACT

An apparatus for processing a substrate is disclosed. The apparatus includes a polishing section configured to polish a substrate, a transfer mechanism configured to transfer the substrate, and a cleaning section configured to clean and dry the polished substrate. The cleaning section has plural cleaning lines for cleaning plural substrates. The plural cleaning lines have plural cleaning modules and plural transfer robots for transferring the substrates.

29 Claims, 42 Drawing Sheets

Related U.S. Application Data continuation of application No. 12/457,175, filed on Jun. 3, 2009, now Pat. No. 8,795,032.

(51) Int. Cl.
*H01L 21/67* (2006.01)
*H01L 21/306* (2006.01)

(52) U.S. Cl.
CPC .. *H01L 21/67739* (2013.01); *H01L 21/67742* (2013.01); *H01L 21/67754* (2013.01); *Y10T 137/0318* (2015.04); *Y10T 137/8593* (2015.04)

(58) Field of Classification Search
CPC ... B24B 21/04; B24B 37/30; H01L 21/67739; H01L 21/67219; H01L 21/67051
See application file for complete search history.

(56) References Cited

U.S. PATENT DOCUMENTS

| | | | |
|---|---|---|---|
| 5,738,574 A | 4/1998 | Tolles et al. | |
| 5,931,723 A | 8/1999 | Katsuoka et al. | |
| 5,934,984 A * | 8/1999 | Togawa | B24B 37/105 414/936 |
| 6,077,385 A | 6/2000 | Kimura et al. | |
| 6,092,542 A | 7/2000 | Matsuda et al. | |
| 6,139,677 A | 10/2000 | Togawa et al. | |
| 6,141,812 A | 11/2000 | Matsuda et al. | |
| 6,168,684 B1 | 1/2001 | Mitsuhashi et al. | |
| 6,248,009 B1 | 6/2001 | Ito et al. | |
| 6,269,548 B1 | 8/2001 | Shinozaki et al. | |
| 6,308,361 B1 | 10/2001 | Matsuda et al. | |
| 6,312,312 B1 * | 11/2001 | Togawa | B23Q 7/06 451/288 |
| 6,321,463 B1 | 11/2001 | Shinozaki | |
| 6,332,826 B1 | 12/2001 | Katsuoka et al. | |
| 6,354,922 B1 | 3/2002 | Sakurai et al. | |
| 6,358,121 B1 | 3/2002 | Zuniga | |
| 6,373,159 B1 | 4/2002 | Shinozaki | |
| 6,413,146 B1 | 7/2002 | Katsuoka et al. | |
| 6,440,320 B1 | 8/2002 | Shinozaki | |
| 6,494,220 B1 | 12/2002 | Matsuda et al. | |
| 6,494,985 B1 | 12/2002 | Sotozaki et al. | |
| 6,558,239 B2 | 5/2003 | Kunisawa et al. | |
| 6,616,512 B2 | 9/2003 | Sotozaki | |
| 6,629,883 B2 | 10/2003 | Katsuoka et al. | |
| 6,643,882 B1 | 11/2003 | Sotozaki et al. | |
| 6,689,257 B2 | 2/2004 | Mishima et al. | |
| 6,729,946 B2 | 5/2004 | Kimura | |
| 6,811,658 B2 | 11/2004 | Hongo et al. | |
| 6,851,152 B2 | 2/2005 | Sotozaki et al. | |
| 6,878,044 B2 | 4/2005 | Sakurai et al. | |
| 6,918,814 B2 | 7/2005 | Katsuoka et al. | |
| 7,055,535 B2 | 6/2006 | Kunisawa et al. | |
| 7,063,598 B2 * | 6/2006 | Isobe | B24B 37/345 451/285 |
| 7,087,117 B2 | 8/2006 | Katsuoka et al. | |
| 7,101,255 B2 | 9/2006 | Katsuoka et al. | |
| 7,108,589 B2 | 9/2006 | Kimura et al. | |
| 7,163,895 B2 | 1/2007 | Togawa et al. | |
| 7,208,074 B2 | 4/2007 | Mishima et al. | |
| 7,235,135 B2 | 6/2007 | Miyazaki et al. | |
| 7,368,016 B2 | 5/2008 | Katsuoka et al. | |
| 2004/0261944 A1 | 12/2004 | Wakabayashi et al. | |
| 2007/0232193 A1 | 10/2007 | Yasuda et al. | |
| 2008/0035181 A1 | 2/2008 | Takahashi et al. | |
| 2008/0070479 A1 | 3/2008 | Nabeya et al. | |
| 2009/0067959 A1 | 3/2009 | Takahashi et al. | |

FOREIGN PATENT DOCUMENTS

| | | |
|---|---|---|
| JP | 05-200669 A | 8/1993 |
| JP | 09-117857 A | 5/1997 |
| JP | 09-277161 A | 10/1997 |
| JP | 10-050794 A | 2/1998 |
| JP | 10-113863 A | 5/1998 |
| JP | 10-144774 A | 5/1998 |
| JP | 10-247674 A | 9/1998 |
| JP | 10-303170 A | 11/1998 |
| JP | 11-058226 A | 3/1999 |
| JP | 11-090355 A | 4/1999 |
| JP | 11-162893 A | 6/1999 |
| JP | 2001-135604 A | 5/2001 |
| JP | 2001-274217 A | 10/2001 |
| JP | 2001-518704 A | 10/2001 |
| JP | 2001-326201 A | 11/2001 |
| JP | 2002-110609 A | 4/2002 |
| JP | 2002-198329 A | 7/2002 |
| JP | 2003-053661 A | 2/2003 |
| JP | 2003-100850 A | 4/2003 |
| JP | 2003-142444 A | 5/2003 |
| JP | 2003-320238 A | 11/2003 |
| JP | 2005-123485 A | 5/2005 |
| JP | 4067307 B2 | 3/2008 |
| JP | 2008-294233 A | 12/2008 |
| WO | WO 99/17342 A1 | 4/1999 |
| WO | WO 01/84621 A1 | 11/2001 |
| WO | WO 2005/037488 A1 | 4/2005 |

OTHER PUBLICATIONS

Kobayashi et al.; "Improved-Throughput, Clean Chemical Mechanical Polishing System" Ebara Times, No. 188(Jul. 2000); abstract and English Translation.

* cited by examiner

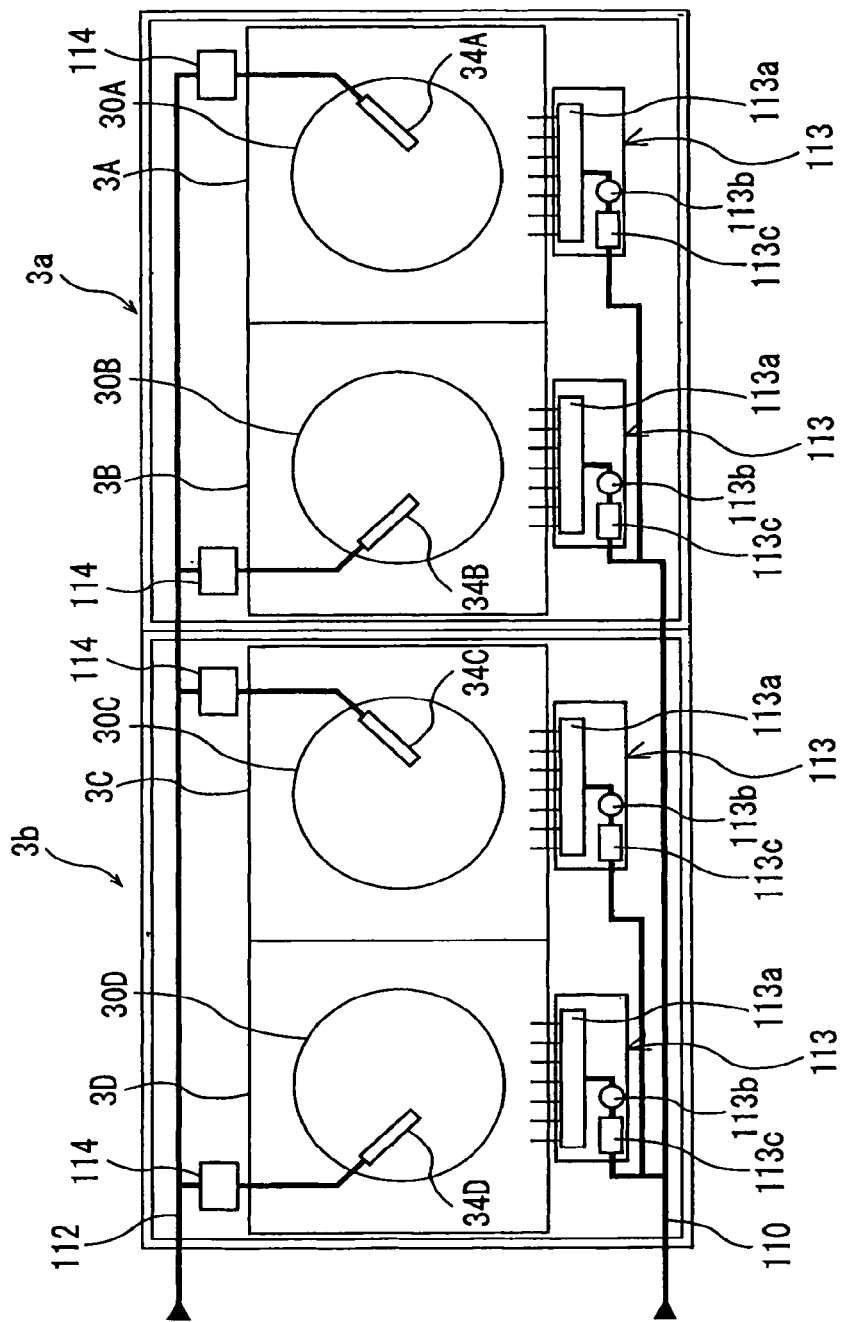

SUBSTRATE PROCESSING APPARATUS, SUBSTRATE PROCESSING METHOD, SUBSTRATE HOLDING MECHANISM, AND SUBSTRATE HOLDING METHOD

CROSS REFERENCE TO RELATED APPLICATIONS

This application is a divisional of U.S. patent application Ser. No. 14/309,152, filed Jun. 19, 2014, which is a continuation of U.S. patent application Ser. No. 12/457,175, filed Jun. 3, 2009, now U.S. Pat. No. 8,795,032, issued December Aug. 5, 2014, which claims the benefits of Japanese Patent Application No. 2009-108671, filed Apr. 28, 2009, Japanese Patent Application No. 2008-190834, filed Jul. 24, 2008, and Japanese Patent Application No. 2008-147220, filed Jun. 4, 2008, the disclosures of which are incorporated herein by reference in their entireties.

BACKGROUND OF THE INVENTION

Field of the Invention

The present invention relates to a substrate processing apparatus and a substrate processing method, and more particularly to a substrate processing apparatus and a substrate processing method for use in polishing a substrate, such as a semiconductor wafer, to provide a planarized surface of the substrate.

The present invention also relates to a substrate holding mechanism and a substrate holding method, and more particularly to a substrate holding mechanism suitable for use in a cleaning apparatus and a drying apparatus for a substrate such as a semiconductor wafer.

The present invention also relates to units and several types of components and mechanisms for use in a substrate processing apparatus.

Description of the Related Art

The trend of a semiconductor device in recent years has been a highly integrated structure, which entails finer interconnects of a circuit and a smaller distance between the interconnects. In fabrication of the semiconductor device, many kinds of materials are deposited in a shape of film on a silicon wafer repeatedly to form a multilayer structure. It is important for forming the multilayer structure to planarize a surface of a wafer. A polishing apparatus for performing chemical mechanical polishing (CMP) is typically used as one technique of planarizing the surface of the wafer. This type of apparatus is often called a chemical mechanical polishing apparatus.

This chemical mechanical polishing (CMP) apparatus typically includes a polishing table supporting a polishing pad thereon, a top ring for holding a wafer, and a nozzle for supplying a polishing liquid onto the polishing pad. When polishing a wafer, the top ring presses the wafer against the polishing pad, while the polishing liquid is supplied onto the polishing pad. In this state, the top ring and the polishing table are moved relative to each other, whereby the wafer is polished to have a planarized surface.

A substrate processing apparatus is an apparatus which has, in addition to the CMP apparatus, functions of cleaning the polished wafer and drying the cleaned wafer. In this substrate processing apparatus, there is a need to improve a throughput in substrate processing. Since the substrate processing apparatus has a variety of processing sections including a polishing section and a cleaning section, a processing delay in each processing section results in a decrease in the throughput of the substrate processing apparatus in its entirety. For example, in a conventional substrate processing apparatus, only a single cleaning line is provided, while plural polishing units are provided. Consequently, plural polished wafers cannot be cleaned and dried simultaneously. Moreover, of plural processes on the cleaning line (e.g., a primary cleaning process, a secondary cleaning process, and a drying process), the slowest process becomes a rate-limiting step in all processes and thus decides a processing time (i.e., throughput) of all processes.

The throughput of the substrate processing apparatus in its entirety can be affected not only by the processing sections, such as the polishing section and the cleaning section, but also by a transfer mechanism for transferring a wafer. Further, wafer transferring operations between the top ring and the transfer mechanism can also affect the overall throughput. In this manner, the throughput of the substrate processing apparatus as a whole depends on a variety of processing operations and transferring operations.

For example, the substrate processing apparatus has a linear transporter for transferring a wafer between polishing units. This linear transporter moves the wafer linearly in a horizontal direction to thereby transfer the wafer to a wafer-transfer position in each polishing unit. Then, the wafer is pushed upward to the top ring by a pusher which is provided separately from the linear transporter. In this manner, since the horizontal movement and the vertical movement of the wafer are performed by the linear transporter and the pusher separately, a long time is needed in transferring the wafer.

The pusher is provided in the wafer-transfer position for each polishing unit. In addition, each pusher needs an XY stage for fine adjustment of the wafer-transfer position between the top ring and the pusher. Consequently, the wafer transfer mechanism has complicated structure as a whole and entails a lot of accompanying wires and pipes to be provided. Moreover, if the transfer mechanism breaks down, it is necessary to access the wafer-transfer position for repair, and this can make it difficult to restore the transfer mechanism.

A long downtime of the substrate processing apparatus as a result of a failure and maintenance thereof leads to an increase in cost for processing a wafer. For this reason, easy maintenance has recently been required for the substrate processing apparatus. It is also required to reduce components of the substrate processing apparatus to simplify the structure thereof and to achieve a lower cost.

For example, the top ring swings between a polishing position above the polishing pad and the wafer-transfer position. Accordingly, a swinging mechanism for the top ring requires a regular maintenance. This swinging mechanism includes bearings for supporting a swing shaft of the top ring, a motor and reduction gears for driving the swing shaft. A top ring head, which supports the top ring, is mounted on an upper end of the relatively long swing shaft, and the reduction gears and the motor are coupled to a lower end of the swing shaft. A bearing case is arranged around the bearings. This bearing case extends through a polisher pan which partitions a polishing room and a lower room below the polishing room. Further, the bearing case is located below the polisher pan. A top ring assembly, including the top ring and the top ring head, is relatively long and heavy. Therefore, the top ring assembly may present disadvantages in maintenance thereof.

In the conventional substrate processing apparatus, a pressure adjuster for adjusting a pressing force of the top ring against a substrate is provided outside the top ring head. This arrangement entails a long distance between the pressure adjuster and the top ring and may cause a delay in an actual change in the pressing force in response to a command for changing the pressing force against the substrate.

Pure water is used for cleaning a top ring and a dresser provided in each of the polishing units of the substrate processing apparatus. In a conventional structure, the pure water is supplied from a single header to the polishing units through plural pipes. This structure may present a problem that a flow rate of the pure water in one polishing unit becomes unstable as a result of use of the pure water in the other.

In the fabrication processes of the semiconductor device, cleaning and drying of a substrate (e.g., a semiconductor wafer) are performed after a polishing process and a plating process. For example, in cleaning of the substrate, a substrate holding mechanism holds the substrate and rotates the substrate. In this state, a cleaning liquid is supplied onto the substrate. A mechanism having an actuator for driving chucks so as to hold the substrate is known as a conventional substrate holding mechanism.

SUMMARY OF THE INVENTION

The present invention has been made in view of the above drawbacks. It is therefore a first object of the present invention to provide a substrate processing apparatus, a component unit of the substrate processing apparatus, and a substrate processing method capable of achieving a high throughput.

It is a second object of the present invention to provide a pure water supply mechanism and pure water supply method capable of supplying pure water stably to plural polishing units.

It is a third object of the present invention to provide a top ring assembly capable of responding promptly to a command for changing a pressing force against a substrate.

It is a fourth object of the present invention to improve the conventional substrate holding mechanism and to provide a substrate holding mechanism and a substrate holding method capable of holding a substrate with a simple structure.

One aspect of the present invention for achieving the above first object is to provide an apparatus for processing a substrate. The apparatus includes: a polishing section configured to polish a substrate; a transfer mechanism configured to transfer the substrate; and a cleaning section configured to clean and dry the polished substrate. The cleaning section has plural cleaning lines for cleaning plural substrates.

According to the present invention, even when plural substrates are carried successively into the cleaning section, these substrates can be sorted into the plural cleaning lines as needed and can be cleaned in parallel. Further, because the substrates can be sorted into the plural cleaning lines according to times required for cleaning and drying the substrates, a throughput of the overall process can be improved. Moreover, by equalizing processing times in the plural cleaning lines, the throughput of the overall process can be further improved.

In this specification, the term "cleaning line" means a route of a substrate in the cleaning section when cleaned by plural cleaning modules. The cleaning section according to the present invention has advantages that, while it has a function of cleaning a single substrate successively, it also has a function of cleaning plural substrates simultaneously.

In a preferred aspect of the present invention, the cleaning section includes a sorting mechanism configured to sort the polished substrates into the plural cleaning lines. With this configuration, the substrates (e.g., wafers) can be sorted according to the process times in the plural cleaning lines. Therefore, the process times of the plural cleaning lines can be equalized.

In a preferred aspect of the present invention, the plural cleaning lines include plural primary cleaning modules for performing a primary cleaning operation on the substrate and plural secondary cleaning modules for performing a secondary cleaning operation on the substrate. With this configuration, in the event of a failure of a cleaning module, it is possible to repair or replace the cleaning module without stopping the cleaning process of the substrate.

In a preferred aspect of the present invention, the plural primary cleaning modules are aligned along a vertical direction and the plural secondary cleaning modules are aligned along a vertical direction. With this configuration, a footprint (i.e., an installation area of the apparatus installed in a clean room or the like) can be small. In this case, it is possible to transfer a substrate between the plural primary cleaning modules or between the plural secondary cleaning modules.

In a preferred aspect of the present invention, the cleaning section includes a first transfer robot which can access the plural primary cleaning modules and the plural secondary cleaning modules, and a second transfer robot which can access the plural secondary cleaning modules. With this configuration, the substrate can be transferred promptly and securely by the two transfer robots.

In a preferred aspect of the present invention, the plural cleaning lines include a temporary base on which the substrate is placed temporarily. With this configuration, a time of carrying the substrate in and out the cleaning module can be adjusted. Further, the route of the substrate in the cleaning section can be changed flexibly.

In a preferred aspect of the present invention, the cleaning section includes plural drying modules for drying the plural substrates cleaned by the plural cleaning lines. With this configuration, the substrate can be extracted in a dried state from the substrate processing apparatus. Therefore, the dry-in-dry-out type substrate processing apparatus can be provided.

In a preferred aspect of the present invention, the plural drying modules are aligned along a vertical direction. With this configuration, the footprint can be small.

Another aspect of the present invention is to provide a method of processing a substrate. The method includes: polishing plural substrates; transferring the polished substrates to plural cleaning lines; sorting the polished substrates into the plural cleaning lines; cleaning the polished substrates in the plural cleaning lines; and drying the cleaned substrates. According to the present invention, even when plural substrates are carried successively into a cleaning section, these substrates can be sorted into the plural cleaning lines as needed and can be cleaned in parallel. Further, because the substrates can be sorted into the plural cleaning lines according to times required for cleaning and drying the substrates, a throughput of the overall process can be improved. Moreover, by equalizing processing times in the plural cleaning lines, the throughput of the overall process can be further improved.

In a preferred aspect of the present invention, the cleaning of the polished substrates comprises cleaning the polished substrates in parallel in the plural cleaning lines. Since the substrates are cleaned in parallel, the cleaning time for these plural substrates can be shortened.

In a preferred aspect of the present invention, the cleaning of the polished substrates comprises cleaning the polished substrates at predetermined time intervals in the plural cleaning lines. Since the plural substrates are cleaned at the predetermined time intervals, even when the cleaned substrates are needed to be transferred one by one, the transfer robot can carry out the cleaned substrates successively at certain time intervals. Therefore, the transferring operation does not become a rate-limiting step, and the throughput of the overall process can be improved.

Another aspect of the present invention is to provide an apparatus for processing a substrate. The apparatus includes: a polishing section configured to polish a substrate using a top ring configured to apply a pressing force to the substrate by pressure of a fluid; a transfer mechanism configured to transfer the substrate; a cleaning section configured to clean and dry the polished substrate; and a pressure adjuster for adjusting the pressure of the fluid. The top ring is swingably coupled to a support shaft via a top ring head, and the pressure adjuster is provided on the top ring head.

The present invention can solve the following conventional drawbacks. In a conventional substrate processing apparatus, a single pressure adjuster for plural polishing units is provided outside the top ring head. Consequently, if one of the plural polishing units breaks down, the operation of the pressure adjuster for adjusting pressures in all of the top rings should be stopped. According to the present invention, even in a case where plural polishing units are provided in the polishing section, the pressure adjuster is provided for each top ring in each of the polishing units, and therefore the operation of the polishing unit, which is not in trouble, can continue. Therefore, the decrease in the throughput of the substrate process in its entirety can be prevented. From a viewpoint of lightweight of the top ring head, it is preferable to realize downsizing of a rotating mechanism and a swinging mechanism for the top ring. In addition, it is preferable that components (e.g., a top ring housing) of the top ring head and the top ring be made from a lightweight material, such as vinyl chloride resin or fluororesin.

Further, the present invention can improve a delay in response of the pressing force of the top ring, which has been a drawback in the conventional substrate processing apparatus. Specifically, in the conventional substrate processing apparatus, the pressure adjuster is provided outside the top ring head, as described above. This arrangement entails a long distance between the pressure adjuster and the top ring and can cause a delay in an actual change in the pressing force in response to a command for changing the pressing force against the substrate. According to the present invention, because the pressure adjuster is provided on the top ring head, the distance between the pressure adjuster and the top ring is short, as compared with the conventional structure. Therefore, the response of the fluid pressure can be improved, and the pressing force can be changed rapidly according to a raised portion and a recess portion of the surface of the substrate. As a result, the pressing force of the top ring against the substrate can be controlled appropriately and accurately.

In a preferred aspect of the present invention, the apparatus further includes a swinging mechanism configured to swing the top ring around the support shaft. The swinging mechanism is arranged on the top ring head.

In a preferred aspect of the present invention, the top ring head is removably coupled to the support shaft.

With this configuration, the maintenance can be easily conducted. Further, the maintenance of individual top ring head can be performed without stopping the overall substrate processing operations.

According to the above-described configuration, the pressure adjuster and the swinging mechanism are provided on the top ring head itself, which allows an easy access. Therefore, it is not necessary to remove other device units adjacent thereto when the maintenance of the pressure adjuster and the swinging mechanism is to be conducted. Further, the top ring, the top ring head, the pressure adjuster, and the swinging mechanism can be provided as one module (unit). Therefore, replacement of components of the swinging mechanism, such a bearing, a motor, and reduction gears, can be conducted for each module. As a result, an apparatus downtime (i.e., a time when a device is not in operation during the maintenance thereof) can be reduced. In the high-throughput substrate processing apparatus, a reduction in the apparatus downtime leads to a decrease in cost for processing substrates. In this manner, the substrate processing apparatus according to the present invention can allow the maintenance of the devices as the components thereof while allowing the continuous operation of the apparatus. For example, even if maintenance frequency increases as the operation time of the apparatus increases, the substrate processing apparatus can be used continuously. In addition, thanks to easy replacement and restoration operations, the substrate processing apparatus with a long useful life can be provided.

Another aspect of the present invention is to provide an apparatus for processing a substrate. The apparatus includes: a polishing section having plural polishing units each configured to polish a substrate; a transfer mechanism configured to transfer the substrate between the plural polishing units; and a cleaning section configured to clean and dry the polished substrate. The transfer mechanism includes plural transfer stages arranged on two travel axes at different heights, plural horizontal drive mechanisms configured to move the plural transfer stages along the two travel axes in horizontal directions, and plural elevating mechanisms configured to move the plural transfer stages independently in vertical directions.

With this configuration, the substrate can be transferred in the horizontal direction and the vertical direction simultaneously. Therefore, a time for transferring the substrate can be shortened. Further, a conventionally-required pusher can be omitted. Therefore, the structure can be simple and the easy maintenance of the transfer mechanism can be realized. As a result, the downtime of the substrate processing apparatus can be shortened. Hence, an improved maintenance of the substrate processing apparatus can be realized, and the throughput of the substrate processing apparatus can be improved.

In a preferred aspect of the present invention, the apparatus further includes: a pass stage arranged on a travel axis at a height differing from the heights of the two travel axes; and a horizontal drive mechanism configured to move the pass stage along the travel axis in a horizontal direction. With this configuration, plural substrates can be moved simultaneously in the horizontal directions at different heights. Therefore, the throughput of the substrate processing apparatus can be improved.

Another aspect of the present invention is to provide an apparatus for processing a substrate. The apparatus includes: a polishing section having a vertically-movable top ring configured to hold a substrate, the top ring including a top ring body and a retainer ring which is vertically movable relative to the top ring body; a transfer mechanism having a vertically-movable transfer stage configured to transfer and receive the substrate to and from the top ring; and a retainer ring station arranged between the top ring and the transfer stage. The retainer ring station includes plural push-up mechanisms configured to push the retainer ring upward.

Another aspect of the present invention is to provide a retainer ring station on which a top ring is to be placed. The top ring has a top ring body and a retainer ring which is vertically movable relative to the top ring body. The retainer ring station includes plural push-up mechanisms configured to push the retainer ring upward.

Because the retainer ring of the top ring is pushed upward by the retainer ring station which is provided independently of the top ring and the transfer stage, the top ring and the transfer stage can move closer to and away from each other substantially simultaneously without waiting each other when the substrate is to be transferred between the top ring and the transfer stage. Therefore, a time of transferring the substrate between the top ring and the transfer stage can be shortened. Further, releasing of the substrate from the top ring is not hindered by the retainer ring, and therefore the substrate can be securely released from the top ring. In a case of providing plural polishing units, the substrates can be securely released from the top rings and times of transferring the substrates to the transfer stages can be securely controlled. Therefore, the times of transferring the substrates between the top rings and the transfer stages can be equalized. As a result, the throughput of the substrate processing operations in their entirety can be improved.

In a preferred aspect of the present invention, each of the plural push-up mechanisms includes a push-up pin arranged to be brought into contact with the retainer ring and a spring configured to push the push-up pin upward.

In a preferred aspect of the present invention, the retainer ring station has a wear measuring device configured to measure an amount of wear of the retainer ring while the plural push-up mechanisms are pushing the retainer ring upward.

In a preferred aspect of the present invention, the wear measuring device includes a contact member arranged to be brought into contact with an lower surface of the retainer ring, a spring configured to push the contact member upward, a linear guide vertically movably supporting the contact member, and a displacement measuring device configured to measure a displacement of the contact member. With this configuration, the wear of the retainer ring can be measured without lowering the throughput of the substrate processing apparatus in its entirety.

Another aspect of the present invention is to provide a method of processing a substrate. The method includes: moving a top ring to a transfer position; transferring a substrate to the transfer position by a transfer stage; lowering the top ring to bring a retainer ring of the top ring into contact with push-up mechanisms to cause the push-up mechanisms to push the retainer ring upward; during the lowering of the top ring, elevating the transfer stage; transferring the substrate from the transfer stage to the top ring; moving the substrate from the transfer position to a polishing position; and polishing the substrate.

According to the present invention, the top ring and the transfer stage can move closer to and away from each other substantially simultaneously without waiting each other when the substrate is to be transferred between the top ring and the transfer stage. Therefore, a time of transferring the substrate between the top ring and the transfer stage can be shortened. Further, releasing of the substrate from the top ring is not hindered by the retainer ring, and therefore the substrate can be securely released from the top ring. In a case of providing plural polishing units, the substrates can be securely released from the top rings and times of transferring the substrates to the transfer stages can be securely controlled. Therefore, the times of transferring the substrates between the top rings and the transfer stages can be equalized. As a result, the throughput of the substrate processing operations in their entirety can be improved.

Another aspect of the present invention is to provide an atomizer for cleaning a polishing surface of a polishing pad with a high-pressure fluid. The atomizer includes: an arm having an ejection hole for the fluid; reinforcing members provided on both sides of the arm; a fluid passage in fluid communication with the ejection hole; and a swing shaft rotatably supporting the arm. The arm is capable of swinging between a cleaning position where the polishing surface is cleaned and an idle position where a maintenance operation is performed.

According to the present invention, the maintenance (e.g., replacement of the polishing pad) can be performed simply by moving the arm to the idle position. Therefore, it is not necessary to remove and attach the atomizer when the maintenance operation is performed. As a result, the throughput of the apparatus can be improved.

One aspect of the present invention for achieving the above second object is to provide a mechanism for supplying pure water to plural polishing units. The mechanism includes: plural distribution controllers provided respectively in the plural polishing units; and a pure water supply pipe configured to provide fluid communication between a pure water supply source and the plural distribution controllers.

Another aspect of the present invention is to provide a method of supplying pure water to plural polishing units. The method includes: supplying pure water to plural distribution controllers provided respectively in plural polishing units; and supplying the pure water from the plural distribution controllers to points of use in the plural polishing units.

According to the present invention, because the flow rate of the pure water is controlled at each of the polishing units, use of the pure water in one polishing unit hardly affects use of the pure water in the other. Therefore, stable supply of the pure water can be realized. In this manner, the present invention can solve a conventional problem in which the flow rate of the pure water in one polishing unit becomes unstable as a result of use of the pure water in the other.

One aspect of the present invention for achieving the above third object is to provide a top ring assembly including: a top ring configured to apply a pressing force to a substrate by pressure of a fluid; a top ring head configured to support the top ring; and a pressure adjuster configured to adjust the pressure of the fluid. The pressure adjuster is mounted on the top ring head.

According to the present invention, because the pressure adjuster is provided on the top ring head, the distance between the pressure adjuster and the top ring is short, as compared with the conventional structure. Therefore, the response of the fluid pressure can be improved, and the pressing force can be changed rapidly according to a raised portion and a recess portion of the surface of the substrate. As a result, the pressing force of the top ring against the substrate can be controlled appropriately and accurately.

One aspect of the present invention for achieving the above fourth object is to provide a substrate holding mechanism including: a base; substrate-support members supported by the base and configured to be movable in a vertical direction relative to the base; substrate-clamp portions provided on upper ends of the substrate-support members, respectively; a drive mechanism configured to move the substrate-support members in the vertical direction; and a pressing mechanism configured to cause at least one of the substrate-clamp portions on at least one of the substrate-support members to press a substrate in conjunction with a downward movement of the substrate-support members and configured to cause the at least one of the substrate-clamp portions to move away from the substrate in conjunction with an upward movement of the substrate-support members.

In a preferred aspect of the present invention, the pressing mechanism comprises a rotating mechanism configured to rotate the at lease one of the substrate-support members about its own axis in conjunction with the upward movement and the downward movement of the substrate-support members.

In a preferred aspect of the present invention, the at least one of substrate-clamp portions is a cylindrical clamp arranged eccentrically with respect to the axis of the at least one of substrate-support members.

In a preferred aspect of the present invention, the pressing mechanism includes: a first magnet attached to one of the base and the at least one of substrate-support members; and a second magnet attached to the other one of the base and the at least one of substrate-support members. The first magnet is arranged so as to be in close proximity to the second magnet when the substrate-support members are moved downward, and the first magnet and the second magnet are arranged such that a magnetic force acting between the first magnet and the second magnet in close proximity to each other causes the at least one of substrate-support members to move in a direction such that the at least one of substrate-clamp portions presses a periphery of the substrate.

In a preferred aspect of the present invention, a third magnet is further attached to the at least one of substrate-support members or the base to which the second magnet is attached; and the first magnet is arranged so as to be in close proximity to one of the second magnet and the third magnet when the substrate-support members are moved vertically.

In a preferred aspect of the present invention, when the first magnet and the second magnet come close to each other, the magnetic force acting between the first magnet and the second magnet rotates the at least one of substrate-support members about its own axis in a direction such that the at least one of substrate-clamp portions presses the periphery of the substrate, and when the first magnet and the third magnet come close to each other, a magnetic force acting between the first magnet and the third magnet rotates the at least one of substrate-support members about its own axis in a direction such that the at least one of substrate-clamp portions moves away from the periphery of the substrate.

In a preferred aspect of the present invention, the second magnet and the third magnet are arranged away from each other in the vertical direction.

In a preferred aspect of the present invention, the at least one of substrate-support members has a groove extending along its axis, a protrusion is provided on the base, and the protrusion roughly engages the groove.

In a preferred aspect of the present invention, the pressing mechanism includes: a helical groove formed on the at least one of substrate-support members; and a pin provided on the base. The pin roughly engages the helical groove.

In a preferred aspect of the present invention, the substrate-support members comprise at least four substrate-support members, and two of the at least four substrate-support members, which face each other, are moved in the vertical direction without rotation.

In a preferred aspect of the present invention, the substrate holding mechanism further includes a mechanism configured to rotate the base and the substrate-support members.

Another aspect of the present invention is to provide a substrate holding mechanism including: a base; substrate-support members supported by the base; substrate-clamp portions and positioning portions provided on upper ends of the substrate-support members; and a rotating mechanism configured to rotate at least one of the substrate-support members about its own axis. The substrate-clamp portions are arranged eccentrically with respect to axes of the substrate-support members, and each of the positioning portions has a side surface curved along a circle located concentrically with respect to an axis of each substrate-support member.

Another aspect of the present invention is to provide a substrate holding method including: placing a substrate onto plural substrate-support members; performing a holding process of holding the substrate by lowering the plural substrate-support members to cause substrate-clamp portions on upper ends of the plural substrate-support members to press the substrate; and performing a releasing process of releasing the substrate by elevating the plural substrate-support members to cause the substrate-clamp portions to move away from the substrate.

In a preferred aspect of the present invention, the holding process is performed by rotating at least one of the plural substrate-support members so as to cause at least one of the substrate-clamp portions on the at least one of the plural substrate-support members to press the substrate.

In a preferred aspect of the present invention, two of the plural substrate-support members, which face each other, are moved in the vertical direction without rotation.

Another aspect of the present invention is to provide a method of cleaning a substrate while holding the substrate. This method includes: performing a holding process of holding the substrate by pressing the substrate with substrate-clamp portions on upper ends of plural substrate-support members covered with a spin cover; performing a cleaning process of cleaning the substrate by supplying a cleaning liquid onto the substrate held by the substrate-clamp portions while rotating the substrate; and performing a releasing process of releasing the substrate by elevating the plural substrate-support members to cause the substrate-clamp portions to move away from the substrate. The holding process and the releasing process are performed by vertical movements of the plural substrate-support members.

Another aspect of the present invention is to provide a method of drying a substrate while holding the substrate. This method includes: performing a holding process of holding the substrate by pressing the substrate with substrate-clamp portions on upper ends of plural substrate-support members covered with a spin cover; performing a drying process of drying the substrate by supplying a vapor, containing isopropyl alcohol, onto the substrate held by the substrate-clamp portions while rotating the substrate; and performing a releasing process of releasing the substrate by elevating the plural substrate-support members to cause the substrate-clamp portions to move away from the substrate. The holding process and the releasing process are performed by vertical movements of the plural substrate-support members.

According to the above-described present invention, the throughput in the substrate processing operations can be improved. In addition, the substrate processing apparatus which allows an easy maintenance thereof can be realized, and units constituting such apparatus can be provided.

Further, according to the present invention, because the force of holding the substrate is generated by the vertical movements of the substrate-support members, it is not necessary to provide an electric actuator. Therefore, the substrate holding mechanism with a simple structure can be realized. The substrate holding mechanism according to the present invention can be applied to a cleaning apparatus for cleaning a substrate by supplying a cleaning liquid onto the substrate while rotating the substrate and a drying apparatus for dying a substrate by rotating the substrate. Because the substrate holding mechanism according to the present invention has a simple structure and is lightweight, a rotational load on the rotating assembly can be reduced, and therefore a long life of the substrate holding mechanism can be realized. Furthermore, the substrate holding mechanism according to the present invention has an advantage that a small amount of cleaning liquid is scattered around.

BRIEF DESCRIPTION OF THE DRAWINGS

FIG. 14 is a schematic view showing pure-water supply pipes provided in a polishing section;

DETAILED DESCRIPTION OF THE PREFERRED EMBODIMENTS

Figure 1:
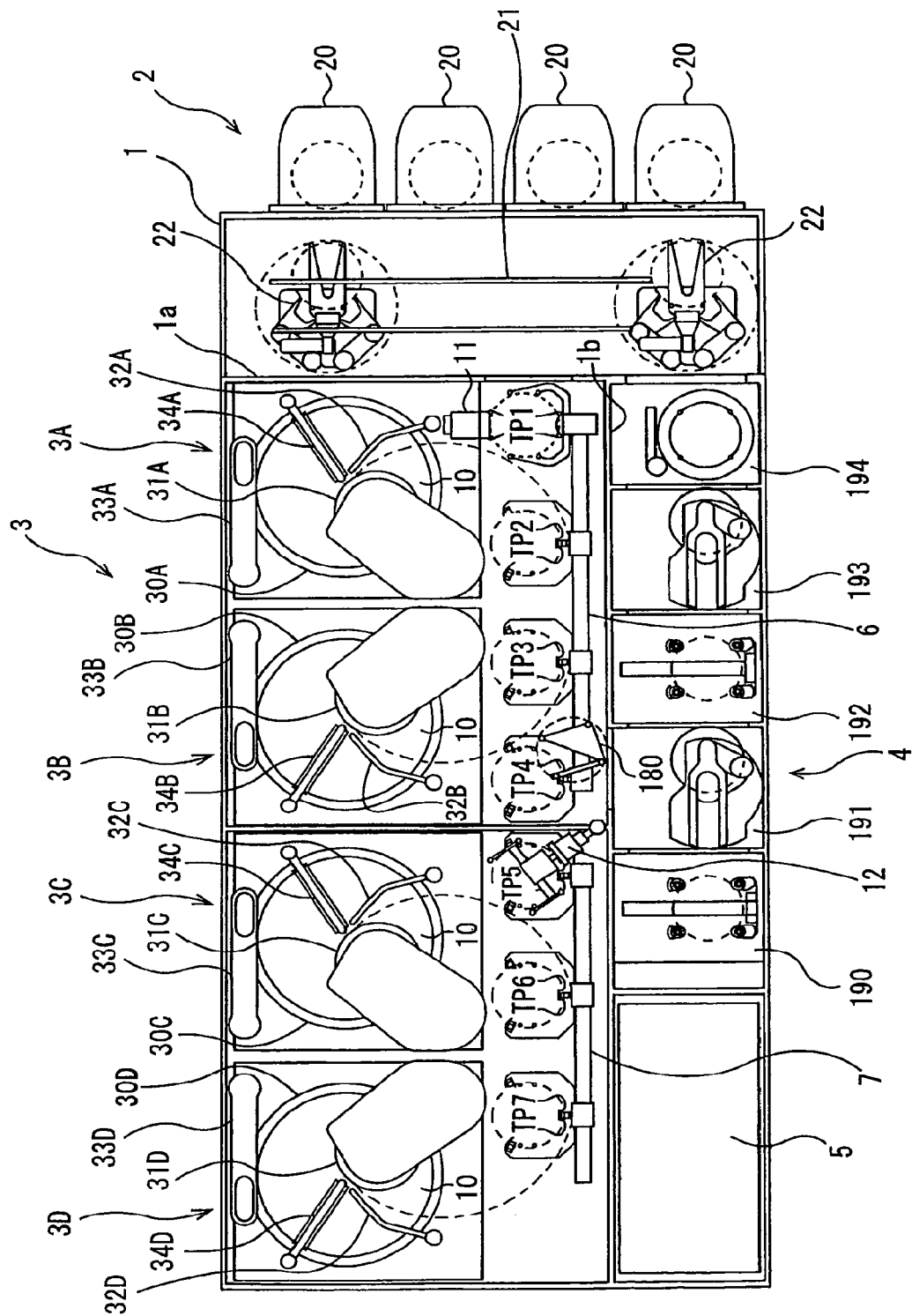
FIG. 1 is a plan view showing a whole arrangement of a substrate processing apparatus according to an embodiment of the present invention.

Embodiments of the present invention will be described below with reference to the drawings. Identical or corresponding elements will be denoted by identical reference numerals and repetitive descriptions thereof will be omitted.

FIG. 1 is a plan view showing a whole arrangement of a substrate processing apparatus according to an embodiment of the present invention. As shown in FIG. 1, the substrate processing apparatus has a housing 1 in a rectangular shape. An interior space of the housing 1 is divided into a loading-unloading section 2, a polishing section 3, and a cleaning section 4 by partitions 1a and 1b. The loading-unloading section 2, the polishing section 3, and the cleaning section 4 are assembled independently and each section is provided with an independent gas evacuation system. The substrate processing apparatus further includes a controller 5 for controlling substrate processing operations.

The loading-unloading section 2 has two or more (four in this embodiment) front loading units 20 on which wafer cassettes, each storing plural wafers (substrates), are placed. The front loading units 20 are arranged adjacent to the housing 1 along a width direction of the substrate processing apparatus (a direction perpendicular to a longitudinal direction of the substrate processing apparatus). Each of the front loading units 20 is able to receive thereon an open cassette, an SMIF (Standard Manufacturing Interface) pod, or a FOUP (Front Opening Unified Pod). The SMIF and FOUP are a hermetically sealed container which houses a wafer cassette therein and covers it with a partition to thereby provide interior environments isolated from an external space.

The loading-unloading section 2 has a moving mechanism 21 extending along an arrangement direction of the front loading units 20. Two transfer robots (loaders) 22 are installed on the moving mechanism 21 and are movable along the arrangement direction of the front loading units 20. The transfer robots 22 are configured to move on the moving mechanism 21 so as to access the wafer cassettes mounted on the front loading units 20. Each transfer robot 22 has vertically arranged two hands, which are separately used. For example, the upper hand can be used for returning a processed wafer to the wafer cassette, and the lower hand can be used for transferring a non-processed wafer. The lower hand of the transfer robot 22 is configured to rotate about its own axis, so that it can reverse the wafer.

The loading-unloading section 2 is required to be a cleanest area. Therefore, pressure in the interior of the loading-unloading section 2 is kept higher at all times than pressures in the exterior space of the substrate processing apparatus, the polishing section 3, and the cleaning section 4. On the other hand, the polishing section 3 is the dirtiest area, because slurry is used as a polishing liquid. Therefore, negative pressure is developed in the polishing section 3, and the pressure in polishing section 3 is kept lower than the internal pressure of the cleaning section 4. A filter fan unit (not shown in the drawings) having a clean air filter, such as HEPA filter or ULPA filter or a chemical filter, is provided in the loading-unloading section 2. This filter fan unit removes particles, toxic vapor, and toxic gas from air to form flow of clean air at all times.

The polishing section 3 is an area where a wafer is polished (planarized). This polishing section 3 includes a first polishing unit 3A, a second polishing unit 3B, a third polishing unit 3C, and a fourth polishing unit 3D. As shown in FIG. 1, the first polishing unit 3A, the second polishing unit 3B, the third polishing unit 3C, and the fourth polishing unit 3D are arranged along the longitudinal direction of the substrate processing apparatus.

As shown in FIG. 1, the first polishing unit 3A includes a polishing table 30A supporting a polishing pad 10 having a polishing surface, a top ring 31A for holding a wafer and pressing the wafer against the polishing pad 10 on the polishing table 30A so as to polish the wafer, a polishing liquid supply nozzle 32A for supplying a polishing liquid and a dressing liquid (e.g., pure water) onto the polishing pad 10, a dresser 33A for dressing the polishing surface of the polishing pad 10, and an atomizer 34A for ejecting a liquid (e.g., pure water) or a mixture of a liquid (e.g., pure water) and a gas (e.g., nitrogen gas) in an atomized state onto the polishing surface of the polishing pad 10.

Similarly, the second polishing unit 3B includes a polishing table 30B supporting a polishing pad 10, a top ring 31B, a polishing liquid supply nozzle 32B, a dresser 33B, and an atomizer 34B. The third polishing unit 3C includes a polishing table 30C supporting a polishing pad 10, a top ring 31C, a polishing liquid supply nozzle 32C, a dresser 33C, and an atomizer 34C. The fourth polishing unit 3D includes a polishing table 30D supporting a polishing pad 10, a top ring 31D, a polishing liquid supply nozzle 32D, a dresser 33D, and an atomizer 34D.

The first polishing unit 3A, the second polishing unit 3B, the third polishing unit 3C, and the fourth polishing unit 3D have the same configuration. Therefore, the first polishing unit 3A will be described below.

Figure 2:
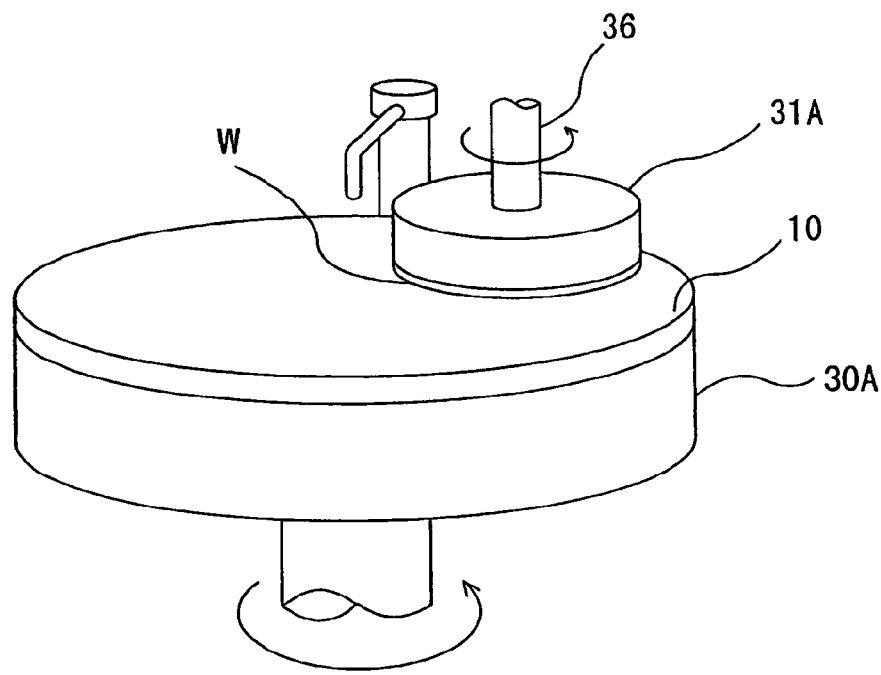
FIG. 2 is a perspective view schematically showing a first polishing unit.

FIG. 2 is a perspective view schematically showing the first polishing unit 3A. The top ring 31A is supported by a top ring shaft 36. The polishing pad 10 is attached to an upper surface of the polishing table 30A. An upper surface of the polishing pad 10 provides the polishing surface where a wafer W is polished. Instead of the polishing pad 10, a fixed abrasive may be used. The top ring 31A and the polishing table 30A are configured to rotate about their own axes, as indicated by arrows. The wafer W is held on a lower surface of the top ring 31A via vacuum suction. During polishing of the wafer W, the polishing liquid supply nozzle 32A supplies the polishing liquid onto the polishing surface of the polishing pad 10, and the top ring 31A presses the wafer W against the polishing surface to thereby polish the wafer W.

Figure 3:
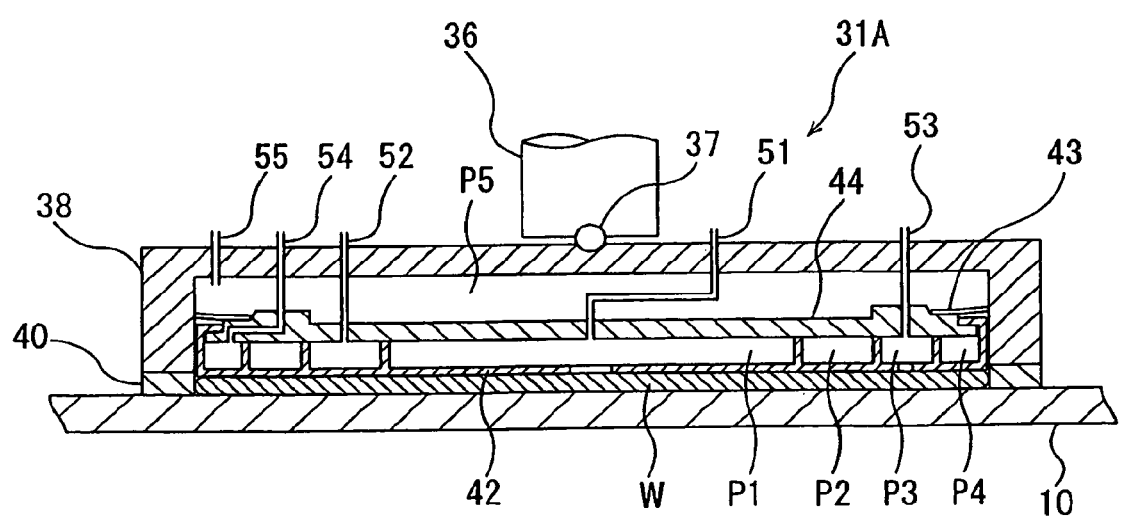
FIG. 3 is a schematic view showing a cross section of a top ring.

FIG. 3 is a schematic view showing a cross section of the top ring 31A. As shown in FIG. 3, the top ring 31A is coupled to a lower end of the top ring shaft 36 via a universal joint 37. This universal joint 37 is a ball joint configured to transmit rotation of the top ring shaft 36 to the top ring 31A while allowing the top ring 31A and the top ring shaft 36 to tile with respect to each other. The top ring 31A has a top ring body 38 in substantially a disk shape and a retainer ring 40 provided on a lower portion of the top ring body 38. The top ring body 38 is made of a material having high strength and rigidity, such as metal or ceramic. The retainer ring 40 is made of highly rigid resin, ceramic, or the like. The retainer ring 40 may be formed integrally with the top ring body 38.

The top ring body 38 and the retainer ring 40 form therein a space, which houses a circular elastic pad 42 arranged to be brought into contact with the wafer W, an annular pressure sheet 43 made from an elastic membrane, and a substantially disk-shaped chucking plate 44 holding the elastic pad 42. The elastic pad 42 has an upper peripheral edge, which is held by the chucking plate 44. Four pressure chambers (air bags) P1, P2, P3, and P4 are provided between the elastic pad 42 and the chucking plate 44. A pressurized fluid (e.g., a pressurized air) is supplied into the pressure chambers P1, P2, P3, and P4 or a vacuum is developed in the pressure chambers P1, P2, P3, and P4 via fluid passages 51, 52, 53, and 54, respectively. The center pressure chamber P1 has a circular shape, and the other pressure chambers P2, P3, and P4 have an annular shape. These pressure chambers P1, P2, P3, and P4 are in a concentric arrangement.

Internal pressures of the pressure chambers P1, P2, P3, and P4 can be changed independently by a pressure adjuster (which will be described later) to thereby independently adjust pressing forces applied to four zones: a central zone, an inner middle zone, an outer middle zone, and a peripheral zone. Further, by lowering the top ring 31A in its entirety, the retainer ring 40 can press the polishing pad 10 at a predetermined pressing force. A pressure chamber P5 is formed between the chucking plate 44 and the top ring body 38. A pressurized fluid is supplied into the pressure chamber P5 or a vacuum is developed in the pressure chamber P5 via a fluid passage 55. With this configuration, the chucking plate 44 and the elastic pad 42 in their entirety can be moved vertically.

The retainer ring 40 is arranged around the periphery of the wafer W so as to prevent the wafer W from coming off the top ring 31A during polishing of the wafer W. An opening (not shown in the drawing) is formed in a portion of the elastic pad 42 which forms the pressure chamber P3. When a vacuum is developed in the pressure chamber P3, the wafer W is hold by the top ring 31A via vacuum suction. On the other hand, the wafer W is released from the top ring 31A by supplying a nitrogen gas, dry air, pressurized air, or the like into the pressure chamber P3.

Figure 4:
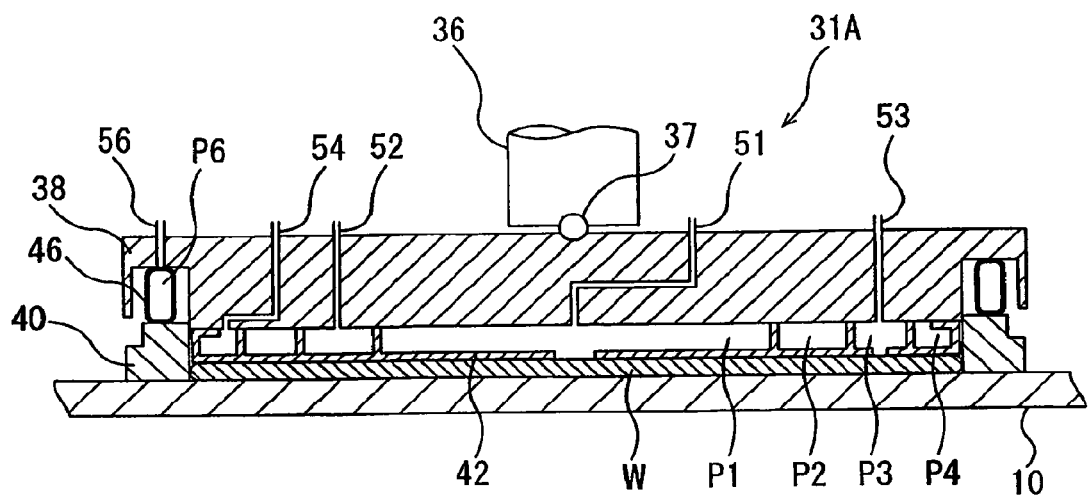
FIG. 4 is a cross-sectional view schematically showing another example of the top ring.

FIG. 4 is a cross-sectional view schematically showing another example of the top ring 31A. In this example, the chucking plate is not provided. The elastic pad 42 is attached to a lower surface of the top ring body 38. Further, the pressure chamber P5 is not provided between the chucking plate and the top ring body 38. Instead, an elastic bag 46 is provided between the retainer ring 40 and the top ring body 38, and a pressure chamber P6 is formed in the elastic bag 46. The retainer ring 40 is movable in the vertical direction relative to the top ring body 38. A fluid passage 56 in fluid communication with the pressure chamber P6 is provided, so that the pressurized fluid (e.g., the pressurized air) is supplied into the pressure chamber P6 through the fluid passage 56. Internal pressure of the pressure chamber P6 is adjustable via the pressure adjuster, which will be described later. Therefore, the pressing force of the retainer ring 40 against the polishing pad 10 can be adjusted independently of the pressing force applied to the wafer W. Other structures and operations are identical to those of the top ring shown in FIG. 3. The embodiment of the present invention can use either of top ring shown in FIG. 3 or FIG. 4.

Figure 5:
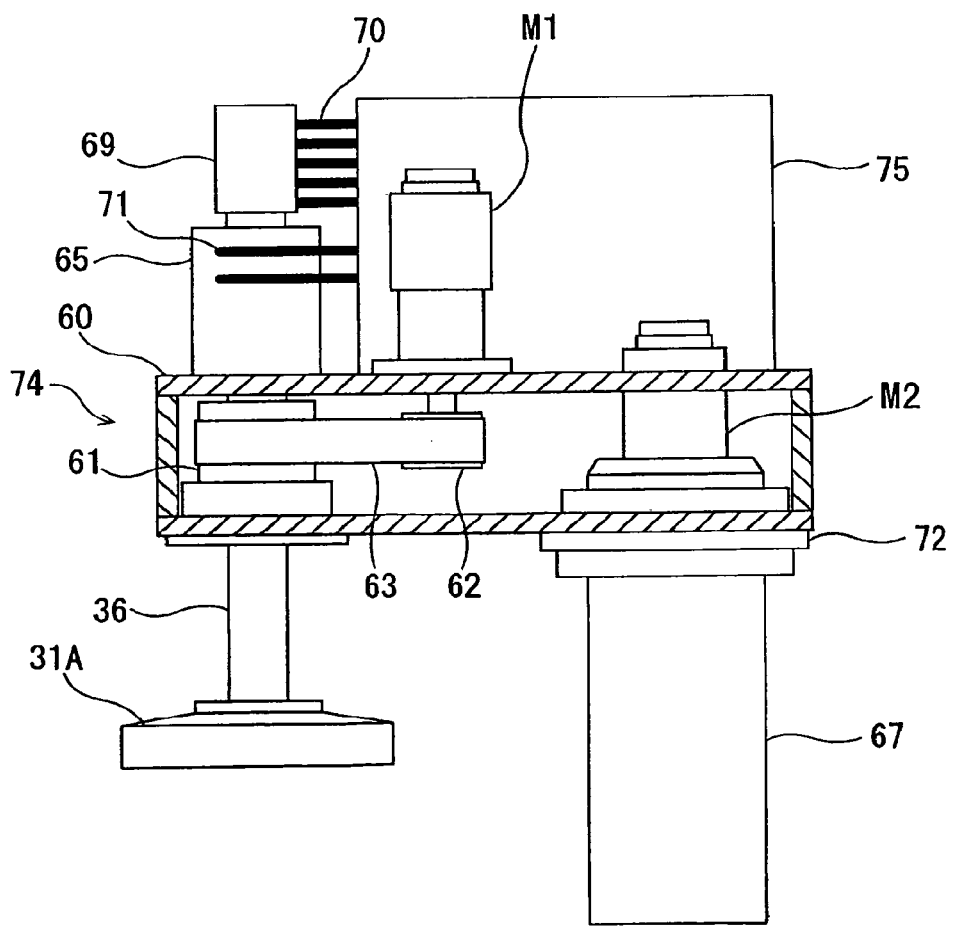
FIG. 5 is a cross-sectional view illustrating mechanisms for rotating and swinging the top ring.

FIG. 5 is a cross-sectional view illustrating mechanisms for rotating and swinging the top ring 31A. The top ring shaft (e.g., spline shaft) 36 is rotatably supported by a top ring head 60. The top ring shaft 36 is coupled to a rotational shaft of a motor M1 via pulleys 61 and 62 and a belt 63. The top ring shaft 36 and the top ring 31A are rotated about their own axes by the motor M1. This motor M1 is mounted on an upper portion of the top ring head 60. The top ring head 60 and the top ring shaft 36 are coupled to a pneumatic cylinder 65 as a vertical actuator. This pneumatic cylinder 65 is supplied with air (pressurized gas) to thereby move the top ring shaft 36 and the top ring 31A in unison in the vertical direction. Instead of the pneumatic cylinder 65, a mechanism having a ball screw and a servomotor may be used as the vertical actuator.

The top ring head 60 is rotatably supported by a support shaft 67 via a bearing 72. This support shaft 67 is a fixed shaft and is made non-rotatable. A motor M2 is mounted on the top ring head 60, and relative position between the top ring head 60 and the motor M2 is fixed. The motor M2 has a rotational shaft, which is coupled to the support shaft 67 via a non-illustrated rotation transmission mechanism (e.g., gears). The rotation of the motor M2 causes the top ring head 60 to pivot (swing) on the support shaft 67. The swinging motion of the top ring head 60 causes the top ring 31A, supported by a tip end thereof, to move between a polishing position above the polishing table 30A and a transfer position beside the polishing table 30A. In this embodiment, the motor M2 constitutes a swinging mechanism for swinging the top ring 31A.

The top ring shaft 36 has a through-hole (not shown in the drawing) therein extending in a longitudinal direction thereof. The above-described fluid passages 51, 52, 53, 54, 55, and 56 of the top ring 31A extend through this through-hole and are connected to a rotary joint 69 mounted on an upper end of the top ring shaft 36. Via the rotary joint 69, the fluid, such as the pressurized gas (e.g., clean air) or the nitrogen gas, is supplied to the top ring 31A and the gas is evacuated from the top ring 31A. Plural fluid pipes 70 are connected to the rotary joint 69. These fluid pipes 70 are in fluid communication with the above-described fluid passages 51, 52, 53, 54, 55, and 56 (see FIG. 3 and FIG. 4), and are coupled to a pressure adjuster 75. Fluid pipes 71 for supplying the pressurized air to the pneumatic cylinder 65 are also coupled to the pressure adjuster 75.

The pressure adjuster 75 has electropneumatic regulators for regulating the pressure of the fluid to be supplied to the top ring 31A, pipes coupled to the fluid pipes 70 and 71, air-operated valves provided in these pipes, electropneumatic regulators for regulating pressure of air serving as a working source for the air-operated valves, and ejectors for developing vacuum in the top ring 31A. These elements are integrated to form a single block (unit). The pressure adjuster 75 is secured to the upper portion of the top ring head 60. The pressures of the pressurized gas to be supplied to the pressure chambers P1, P2, P3, P4, and P5 (see FIG. 3) and the pressure of the pressurized air to be supplied to the pneumatic cylinder 65 are regulated by the electropneumatic regulators of the pressure adjuster 75. Similarly, the vacuum is developed in the air bags P1, P2, P3, and P4 of the top ring 31A and in the pressure chamber P5 between the chucking plate 44 and the top ring body 38 by the ejectors of the pressure adjuster 75.

Because the electropneumatic regulators and the valves, which are pressure-regulating devices, are arranged near the top ring 31A, the controllability of the pressures in the top ring 31A is improved. More specifically, because distances between the electropneumatic regulators and the pressure chambers P1, P2, P3, P4, and P5 are short, an improved response to a pressure-changing command from the controller 5 can be realized. Similarly, because the ejectors, which are vacuum sources, are located near the top ring 31A, an improved response to a command for developing the vacuum in the top ring 31A is realized. A back surface of the pressure adjuster 75 can be used as a seat for attachment of electrical devices. Therefore, it is possible to delete the need for a frame that has been conventionally required for attachments.

The top ring head 60, the top ring 31A, the pressure adjuster 75, the top ring shaft 36, the motor M1, the motor M2, and the pneumatic cylinder 65 are provided as one module (which will be hereinafter referred to as a top ring assembly 74). Specifically, the top ring shaft 36, the motor M1, the motor M2, the pressure adjuster 75, and the pneumatic cylinder 65 are mounted on the top ring head 60. The top ring head 60 is removably coupled to the support shaft 67. Therefore, by separating the top ring head 60 from the support shaft 67, the top ring assembly 74 can be removed from the substrate processing apparatus. This configuration can provide easy maintenance of the support shaft 67, the top ring head 60, and other components. For example, if the bearing 72 makes an unusual sound, the bearing 72 can be easily replaced. In addition, replacement of the motor M2 and the rotation transmission mechanism (e.g., reduction gears) can be conducted without removing adjacent components.

Figure 6:
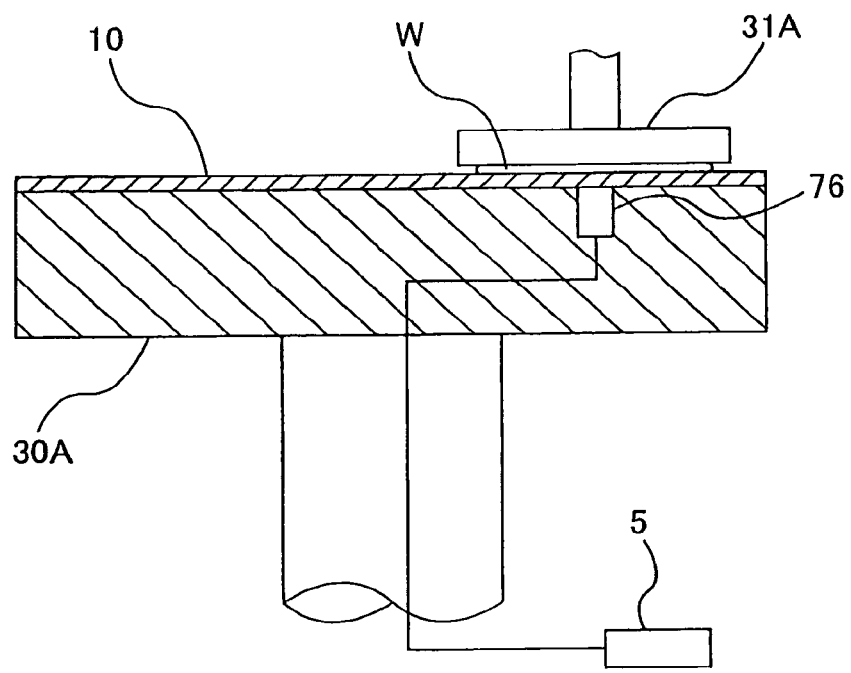
FIG. 6 is a cross-sectional view schematically showing an internal structure of a polishing table.

FIG. 6 is a cross-sectional view schematically showing an internal structure of the polishing table 30A. As shown in FIG. 6, a sensor 76 for detecting a state of a film of the wafer W is embedded in the polishing table 30A. In this example, an eddy current sensor is used as the sensor 76. An output signal of the sensor 76 is transmitted to the controller 5, which produces a monitoring signal indicating a thickness of the film. Although a value of the monitoring signal (and the sensor signal) does not indicate the film thickness itself, the value of the monitoring signal varies according to the film thickness. Therefore, the monitoring signal can be regarded as a signal indicating the film thickness of the wafer W.

The controller 5 determines the internal pressures of the respective pressure chambers P1, P2, P3, and P4 based on the monitoring signal, and commands the pressure adjuster 75 to produce the determined pressures in the respective pressure chambers P1, P2, P3, and P4. The controller 5 functions as a pressure controller for operating the internal pressures of the respective pressure chambers P1, P2, P3, and P4 based on the monitoring signal, and also functions as an end point detector for detecting a polishing end point.

As with the first polishing unit 3A, sensors 76 are provided in the polishing tables of the second polishing unit 3B, the third polishing unit 3C, and the fourth polishing unit 3D. The controller 5 produces monitoring signals from output signals of the sensors 76 of the polishing units 3A to 3D, and monitors progress of polishing of wafers in the polishing units 3A to 3D. When plural wafers are polished in the polishing units 3A to 3D, the controller 5 monitors the monitoring signals indicating film thicknesses of the wafers during polishing, and controls the pressing forces of the top ring 31A to 31D such that the polishing times in the polishing units 3A to 3D become substantially equal. By adjusting the pressing forces of the top ring 31A to 31D during polishing based on the monitoring signals, the polishing times in the polishing units 3A to 3D can be equalized.

The wafer W can be polished in any one of the first polishing unit 3A, the second polishing unit 3B, the third polishing unit 3C, and the fourth polishing unit 3D, or can be polished successively in the plural polishing units selected in advance from these polishing units 3A to 3D. For example, the wafer W can be polished in the first polishing unit 3A and the second polishing unit 3B in this order, or can be polished in the third polishing unit 3C and the fourth polishing unit 3D in this order. Further, the wafer W can be polished in the first polishing unit 3A, the second polishing unit 3B, the third polishing unit 3C, and the fourth polishing unit 3D in this order. In any case, by equalizing the all polishing times in the polishing units 3A to 3D, the throughput can be improved.

The eddy current sensor is preferably used in a case where the film of the wafer is a metal film. In a case where the film of the wafer is a light-transmissible film such as an oxide film, an optical sensor can be used as the sensor 76. Alternatively, a microwave sensor may be used as the sensor 76. The microwave sensor can be used in both cases of a metal film and a non-metal film. Examples of the optical sensor and the microwave sensor will be described below.

Figure 7:
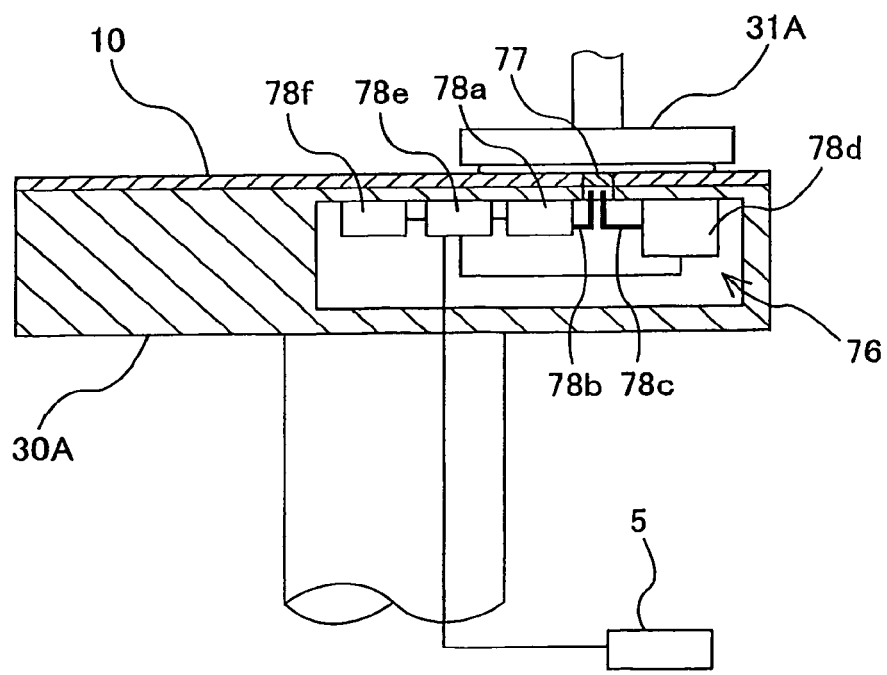
FIG. 7 is a schematic view showing the polishing table having an optical sensor.

FIG. 7 is a schematic view showing the polishing table having an optical sensor. As shown in FIG. 7, the optical sensor 76 for detecting a state of a film of the wafer W is embedded in the polishing table 30A. This sensor 76 is configured to emit light to the wafer W and detect the state of the film (e.g., a thickness of the film) of the wafer W based on intensity of the reflected light from the wafer W (i.e., based on reflection intensity or reflectance).

A light-transmissive member 77 for allowing light from the sensor 76 to pass therethrough is provided in the polishing pad 10. The light-transmissive member 77 is made from a material having a high transmittance, e.g., non-foamed polyurethane. Instead of providing such a material having a high transmittance, a through-hole may be provided in the polishing pad 10. In this case, a transparent liquid is supplied to the through-hole from below, while the through-hole is covered with the wafer W, to form the light-transmissive member 77. The light-transmissive member 77 is arranged at a position such that it passes through the center of the wafer W held by the top ring 31A.

As shown in FIG. 7, the sensor 76 has a light source 78a, a light-emitting optical fiber 78b as a light-emitting section for directing light from the light source 78a to the surface of the wafer W, a light-receiving optical fiber 78c as a light-receiving section for receiving reflected light from the surface of the wafer W, a spectroscope unit 78d including a spectroscope for decomposing the light, received by the light-receiving optical fiber 78c, according to wavelength and a plurality of light-receiving elements for storing the light decomposed by the spectroscope as electric data, an operation controller 78e for controlling timing of turning on and off the light source 78a or starting to read the light-receiving elements in the spectroscope unit 78d, and a power source 78f for supplying electric power to the operation controller 78e. The light source 78a and the spectroscope unit 78d are supplied with electric power via the operation controller 78e.

A light-emitting end of the light-emitting optical fiber 78b and a light-receiving end of the light-receiving optical fiber 78c are arranged to be substantially perpendicular to the surface of the wafer W. A photodiode array with 128 elements may be used as the light-receiving elements in the spectroscope unit 78d. The spectroscope unit 78d is coupled to the operation controller 78e. Information from the light-receiving elements in the spectroscope unit 78d is transmitted to the operation controller 78e, where spectrum data of the received light is produced based on the information. Specifically, the operation controller 78e reads the electric information stored in the light-receiving elements and generates the spectrum data of the received light. This spectrum data indicates the intensity of the reflected light decomposed according to the wavelength, and varies depending on a film thickness.

The operation controller 78e is coupled to the above-described controller 5. Thus, the spectrum data, generated by the operation controller 78e, is transmitted to the controller 5. The controller 5 calculates a characteristic value associated with the film thickness of the wafer W based on the spectrum data received from the operation controller 78e, and uses the characteristic value as a monitoring signal.

Figure 8:
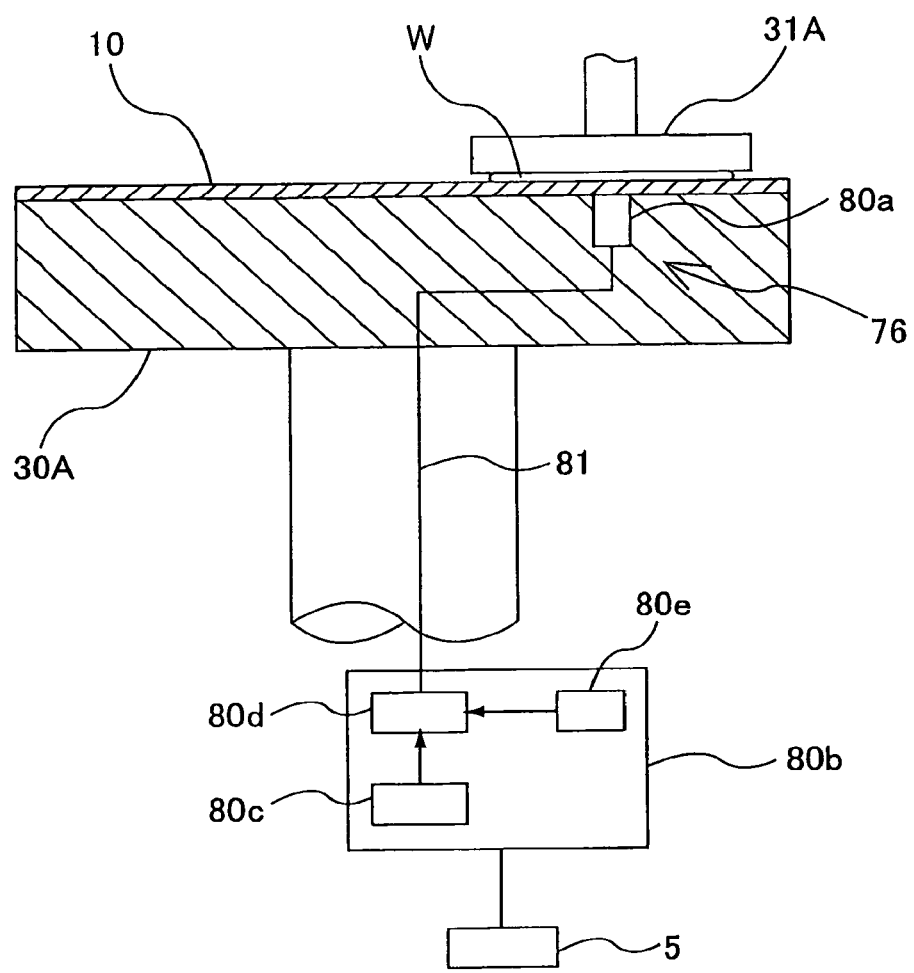
FIG. 8 is a schematic view showing the polishing table having a microwave sensor.

FIG. 8 is a schematic view showing the polishing table having a microwave sensor. As shown in FIG. 8, the sensor 76 includes an antenna 80a for applying a microwave to the surface of the wafer W, a sensor body 80b for supplying the microwave to the antenna 80a, and a waveguide 81 coupling the antenna 80a to the sensor body 80b. The antenna 80a is arranged so as to face the center of the wafer W held by the top ring 31A.

The sensor body 80b has a microwave source 80c for generating the microwave and supplying the microwave to the antenna 80a, a separator 80d for separating the microwave (incident wave) generated by the microwave source 80c and the microwave (reflected wave) reflected upon the surface of the wafer W, and a detector 80e for receiving the reflected wave separated by the separator 80d and detecting an amplitude and a phase of the reflected wave. A directional coupler is suitably used as the separator 80d.

The antenna 80a is coupled to the separator 80d via the waveguide 81. The microwave source 80c is coupled to the separator 80d. The microwave generated by the microwave source 80c is supplied to the antenna 80a via the separator 80d and the waveguide 81. The microwave is applied from the antenna 80a to the wafer W. The microwave permeates (penetrates) the polishing pad 10 to reach the wafer W. The reflected wave from the wafer W permeates the polishing pad 10 again and is received by the antenna 80a.

The reflected wave is sent from the antenna 80a through the waveguide 81 to the separator 80d, which separates the incident wave and the reflected wave. The reflected wave separated by the separator 80d is transmitted to the detector 80e. The detector 80e detects the amplitude and the phase of the reflected wave. The amplitude of the reflected wave is detected as a value of electric power (dbm or W) or voltage (V). The phase of the reflected wave is detected by a phase measuring device (not shown) integrated in the detector 80e. The amplitude and the phase of the reflected wave are transmitted to the controller 5, where a thickness of a metal film or non-metal film of the wafer W is analyzed based on the amplitude and the phase of the reflected wave. The analyzed value is monitored as a monitoring signal by the controller 5.

Figure 9:
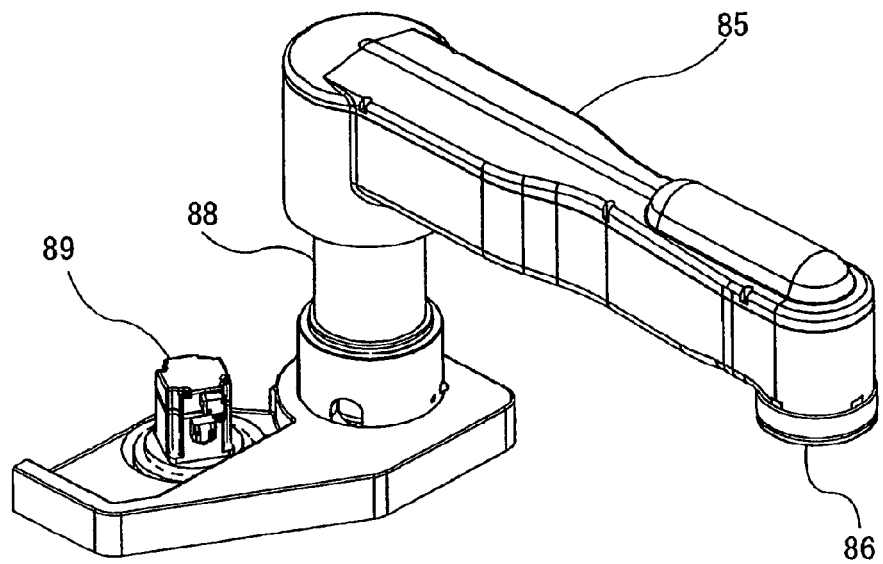
FIG. 9 is a perspective view showing a dresser.

FIG. 9 is a perspective view showing the dresser 33A that can be used in the embodiment of the present invention. As shown in FIG. 9, the dresser 33A has a dresser arm 85, a dressing member 86 rotatably mounted on a tip end of the dresser arm 85, a swing shaft 88 coupled to the other end of the dresser arm 85, and a motor 89 as a driving mechanism for swinging the dresser arm 85 on the swing shaft 88. The dressing member 86 has a circular dressing surface to which hard abrasive grains are fixed. Examples of the hard abrasive grains include diamond particles and ceramic particles. A non-illustrated motor is installed in the dresser arm 85, and the dressing member 86 is rotated by this motor. The swing shaft 88 is coupled to a non-illustrated elevating mechanism, which moves the dresser arm 85 downward to thereby cause the dressing member 86 to press the polishing surface of the polishing pad 10.

Figure 10:
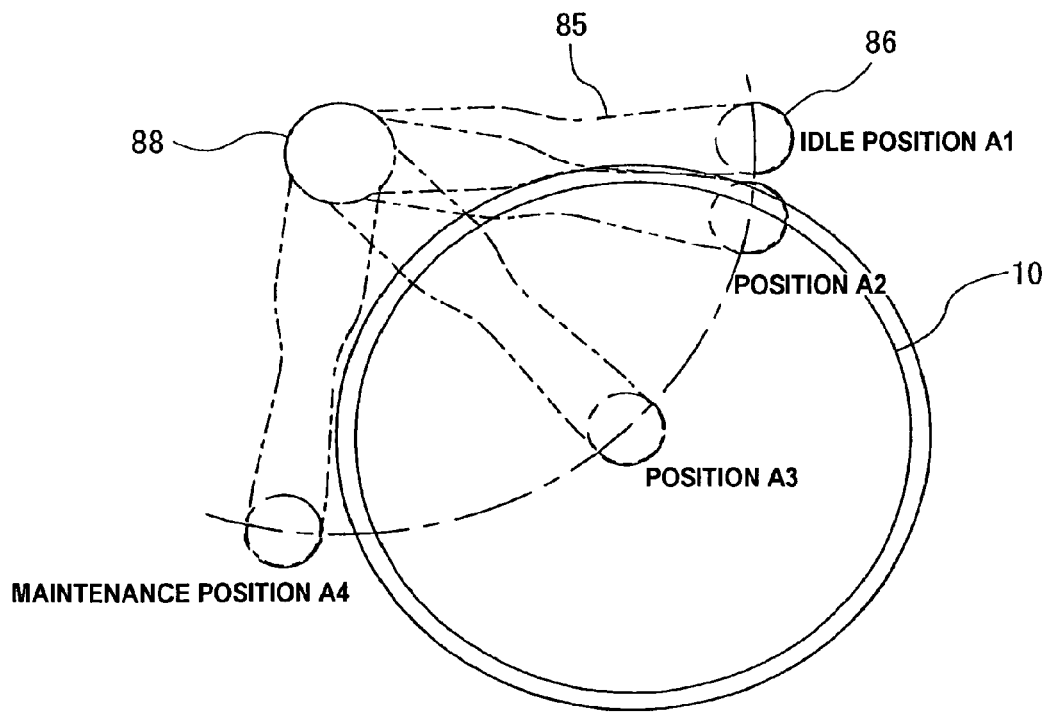
FIG. 10 is a plan view showing a path of a movement of the dresser when dressing a polishing surface of a polishing pad.

FIG. 10 is a plan view showing a path of the movement of the dresser 33A when dressing the polishing surface of the polishing pad 10. As shown in FIG. 10, the dresser arm 85 is longer than a radius of the polishing pad 10, and the swing shaft 88 is located radially outwardly of the polishing pad 10. When dressing the polishing surface of the polishing pad 10, the polishing pad 10 is rotated and the dressing member 86 is rotated by the motor. Then, the dresser arm 85 is lowered by the elevating mechanism to bring the dressing member 86 into sliding contact with the rotating polishing surface of the polishing pad 10. In this state, the dresser arm 85 is swung by the motor 89. During dressing of the polishing pad 10, pure water is supplied as a dressing liquid onto the polishing surface from the polishing liquid supply nozzle 32A. The swinging movement of the dresser arm 85 allows the dressing member 86 to move across the polishing surface of the polishing pad 10 from one end to another via a center of the polishing surface, as shown in FIG. 10. This swinging movement of the dresser arm 85 enables the dressing member 86 to dress the polishing surface of the polishing pad 10 in its entirety including the center thereof and can greatly increase a dressing effect on the polishing surface. Therefore, the polishing surface can be dressed uniformly in its entirety, and a planar polishing surface can be obtained.

After the dressing operation, the dresser arm 85 is moved to an idle position A1 beside the polishing table 30A, as shown in FIG. 10. When the maintenance of the dresser 33A is to be performed, the dresser arm 85 is moved to a maintenance position A4 at substantially an opposite side of the idle position A1. As shown in FIG. 10, during dressing, the dresser arm 85 may be swung between a position A2 at the edge of the polishing surface and a position A3 at the center of the polishing surface. This swinging motion can enable a rapid dressing operation and can securely terminate the dressing operation.

In the above-described example, the dresser arm 85 and the dressing member 86 are vertically moved in unison by the elevating mechanism coupled to the swing shaft 88. This elevating mechanism may be disposed in the dresser arm 85, and the dressing member 86 may be moved vertically by this elevating mechanism disposed in the dresser arm 85. Further, in another modified example, a first elevating mechanism for vertically moving the swing shaft 88 may be provided, and a second elevating mechanism for vertically moving the dressing member 86 may be provided in the dresser arm 85. In this modified example, the first elevating mechanism lowers the dresser arm 85 to a predetermined height and then the second elevating mechanism lowers the dressing member 86. According to this configuration, a pressing force against the polishing surface and a height of the dressing member 86 during the dressing operation can be accurately adjusted.

Figure 11A:
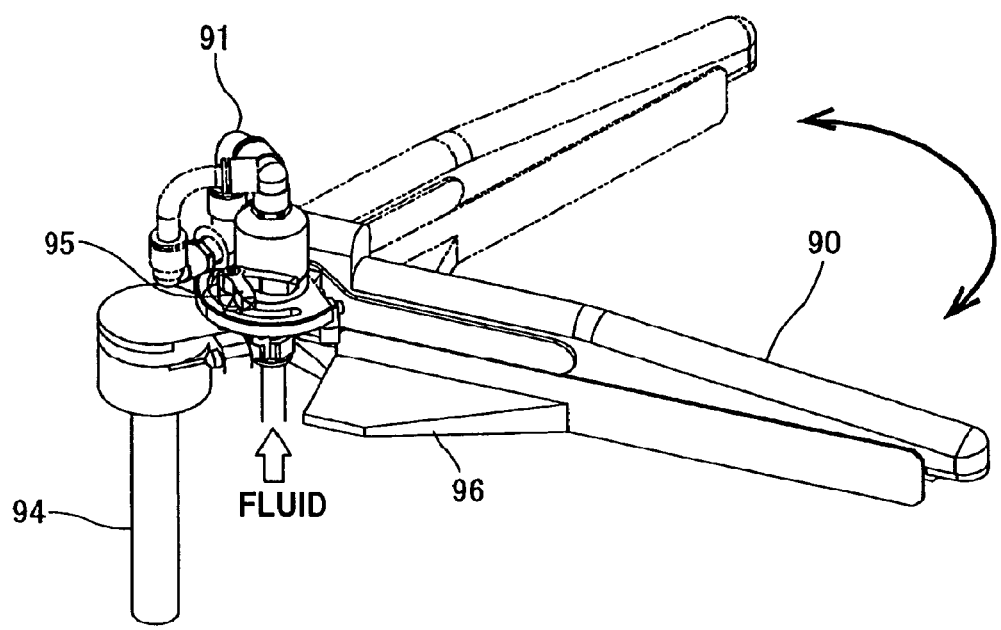
FIG. 11A is a perspective view showing an atomizer.
Figure 11B:
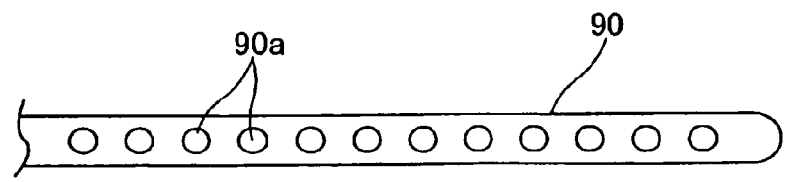
FIG. 11B is a schematic view showing a lower portion of an arm of the atomizer.

FIG. 11A is a perspective view showing the atomizer 34A. The atomizer 34A includes an arm 90 having one or more ejection holes on a lower portion thereof, a fluid passage 91 coupled to the arm 90, and a swing shaft 94 supporting the arm 90. FIG. 11B is a schematic view showing the lower portion of the arm 90. In this example shown in FIG. 11B, plural ejection holes 90a are formed at equal intervals on the lower portion of the arm 90. The fluid passage 91 may comprise a tube, or a pipe, or a combination of a tube and a pipe.

Figure 12A:
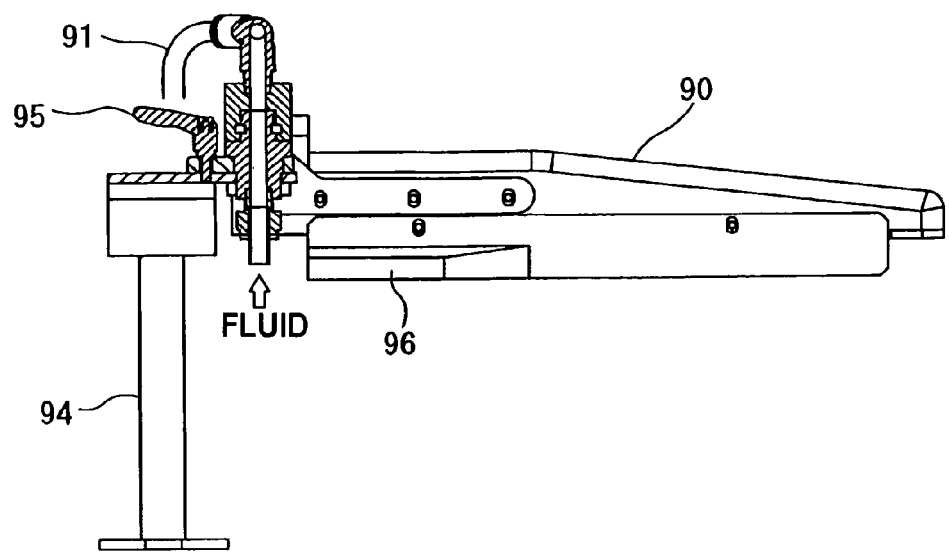
FIG. 12A is a side view showing an internal structure of the atomizer.
Figure 12B:
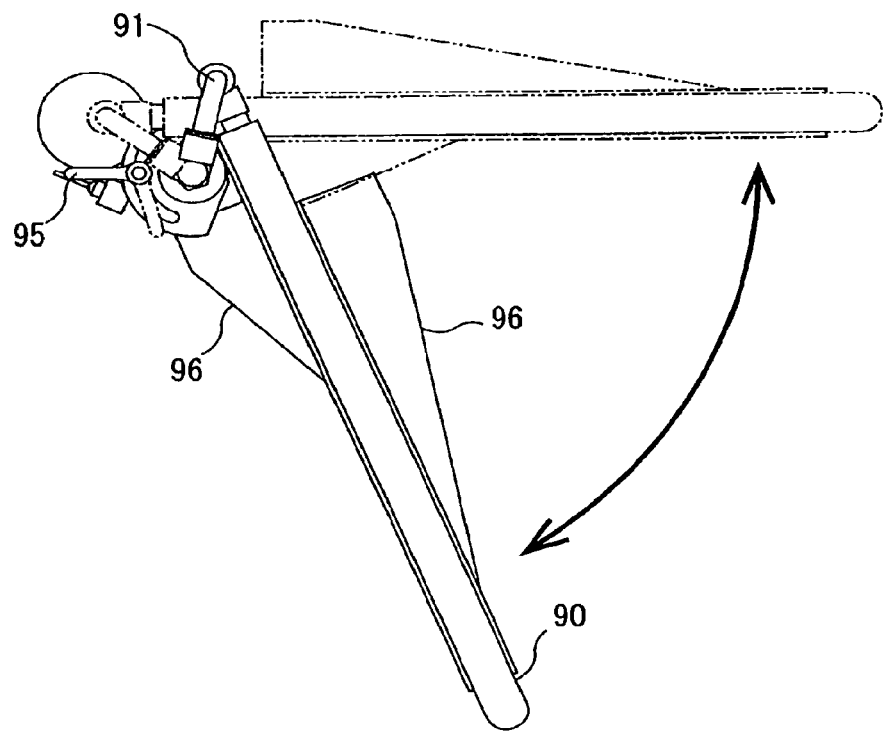
FIG. 12B is a plan view showing the atomizer.

FIG. 12A is a side view showing an internal structure of the atomizer 34A, and FIG. 12B is a plan view showing the atomizer 34A. The fluid passage 91 has an open end, which is coupled to a fluid supply pipe (not shown in the drawing), so that a fluid is supplied to the fluid passage 91 through the fluid supply pipe. Examples of the fluid to be used include a liquid (e.g., pure water) and a mixture of a liquid and a gas (e.g., a mixture of pure water and a nitrogen gas). The fluid passage 91 is in fluid communication with the ejection holes 90a of the arm 90, so that the fluid is atomized and ejected from the ejection holes 90a onto the polishing surface of the polishing pad 10.

The arm 90 is rotatable about the swing shaft 94 so as to swing between a cleaning position and an idle position as indicated by a dotted line in FIG. 11A and FIG. 12B. The rotatable angle of the arm 90 is about 90 degrees. Normally, the arm 90 is in the cleaning position and is arranged along the radial direction of the polishing surface of the polishing pad 10, as shown in FIG. 1. When the maintenance (e.g., replacement of the polishing pad 10) is to be performed, the arm 90 is manually moved to the idle position. Therefore, it is not necessary to remove the arm 90 during maintenance, and the improved maintenance can be realized. A rotating mechanism may be coupled to the swing shaft 94 so as to swing the arm 90.

As shown in FIG. 12B, two reinforcing members 96 and 96, which have different shapes, are provided on both sides of the arm 90. These reinforcing members 96 and 96 serve to prevent an axis of the arm 90 from vibrating greatly when the arm 90 swings between the cleaning position and the idle position. Therefore, an effective atomizing operation can be performed. The atomizer 34A further includes a lever 95 for fixing a swing position of the arm 90 (i.e., an angle range through which the arm 90 can swing). Specifically, by operating the lever 95, the swingable angle of the arm 90 can be adjusted according to conditions. For example, when the lever 95 is rotated, the arm 90 can swing freely and can be moved manually between the cleaning position and the idle position. On the other hand, when the lever 95 is tightened, the position of the arm 90 is fixed at either of the cleaning position or the idle position.

The arm 90 of the atomizer may be a folding arm. Specifically, the arm 90 may comprise at least two arm members coupled by a joint. In this example, an angle between the arm members when folded up is in a range of 1 degree to 45 degrees, preferably in a range of 5 degrees to 30 degrees. If the angle between the arm members is larger than 45 degrees, the arm 90 occupies a large space. On the other hand, if the angle between the arm members is less than 1 degree, the arm 90 should have a thin structure, which results in a low mechanical strength. In this example, the arm 90 may be configured not to rotate about the swing shaft 94. When the maintenance (e.g., replacement of the polishing pad 10) is to be performed, the arm 90 can be folded up so as not to hinder the maintenance operation. As another modified example, the arm 90 of the atomizer may be an extendable and contractible arm. In this case also, when the maintenance is to be performed, the arm 90 can be contracted so as not to hinder the maintenance operation.

The purpose of providing the atomizer 34A is to wash away polishing debris and abrasive grains remaining on the polishing surface of the polishing pad 10 with the high-pressure fluid. Cleaning of the polishing surface with the high-pressure fluid from the atomizer 34A and conditioning of the polishing surface by the mechanical contact of the dresser 33A can achieve a more preferable dressing, i.e., regeneration of the polishing surface. Typically, the regeneration of the polishing surface is performed by the atomizer after the dressing operation is performed by the contact-type dresser (e.g., diamond dresser).

Figure 13A:
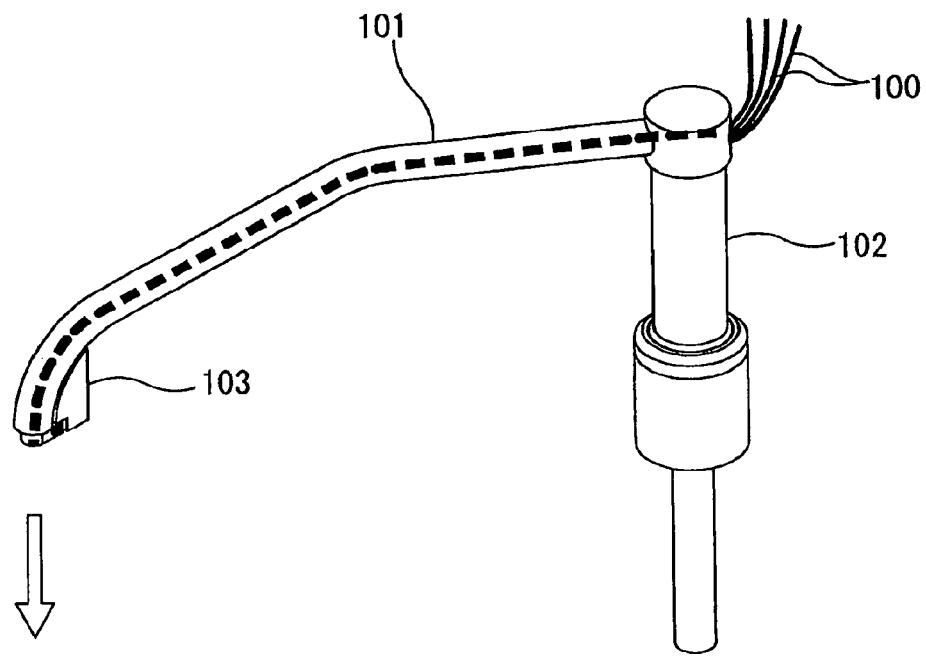
FIG. 13A is a perspective view showing a polishing liquid supply nozzle.
Figure 13B:
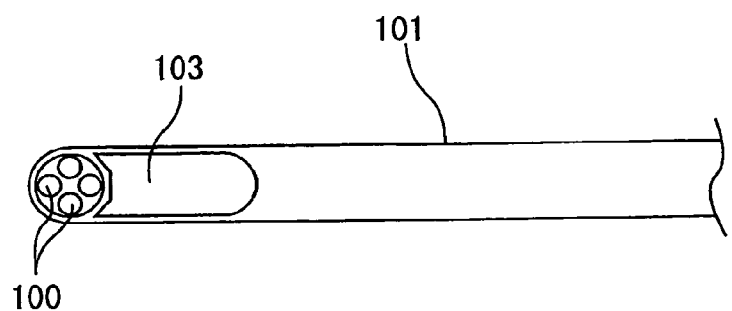
FIG. 13B is an enlarged schematic view showing a tip end of the polishing liquid supply nozzle as viewed from below.

FIG. 13A is a perspective view showing the polishing liquid supply nozzle 32A, and FIG. 13B is an enlarged schematic view showing a tip end of the polishing liquid supply nozzle 32A as viewed from below. As shown in FIG. 13A and FIG. 13B, the polishing liquid supply nozzle 32A has multiple tubes 100 through which pure water and the polishing liquid (e.g., slurry) are supplied onto the polishing surface of the polishing pad 10. The polishing liquid supply nozzle 32A further has a pipe arm 101 covering the multiple tubes 100, and a swing shaft 102 supporting the pipe arm 101. The multiple tubes 100 typically include a pure water supply tube for supplying pure water and plural slurry supply tubes for supplying different types of slurries. For example, the multiple tubes 100 may comprise two to four (e.g., three) slurry supply tubes and one or two pure water supply tubes.

The multiple tubes 100 extend through the pipe arm 101 to the tip end of the pipe arm 101. The pipe arm 101 covers substantially the entire tubes 100. A reinforcing member 103 is secured to the tip end of the pipe arm 101. Tip ends of the tubes 100 are located above the polishing pad 10, so that the polishing liquid is supplied from the tubes 100 onto the polishing surface of the polishing pad 10. Arrow in FIG. 13A indicates the polishing liquid supplied onto the polishing surface. The swing shaft 102 is coupled to a non-illustrated rotating mechanism (e.g., a motor) for rotating the swing shaft 102. By rotating the swing shaft 102, the polishing liquid can be supplied to a desired position on the polishing surface. When the maintenance (e.g., replacement of the polishing pad 10) is to be performed, the pipe arm 101 is swung on the swing arm 102 by the rotating mechanism to an idle position beside the polishing table 30A.

As described above, because the multiple tubes 100 are covered substantially in their entirety with the pipe arm 101, a surface area of the nozzle 32A in its entirety can be small, as compared with the case where the multiple tubes 100 are not covered with the pipe arm 101. Therefore, part of the slurry, scattered around during the polishing operation or the cleaning operation by the atomizer, is attached to the small surface area. As a result, an adverse effect on the polishing process due to falling of the slurry attached is prevented. Further, it becomes easy to clean the polishing liquid supply nozzle 32A.

FIG. 14 is a schematic view showing pure-water supply pipes provided in the polishing section 3. In this substrate processing apparatus, the first polishing unit 3A and the second polishing unit 3B form a first polishing section 3a as one unit, and the third polishing unit 3C and the fourth polishing unit 3D form a second polishing section 3b as one unit. The first polishing section 3a and the second polishing section 3b can be separated from each other. As described above, the polishing section 3 uses several types of fluid, such as pure water, air, and nitrogen gas. For example, as shown in FIG. 14, the pure water (DIW, deionized water) is supplied from a pure-water supply source (not shown in the drawing) to a pure-water supply pipe 110 of the substrate processing apparatus. This pure-water supply pipe 110 extends through the polishing units 3A, 3B, 3C, and 3D of the polishing section 3, and is connected to distribution controllers 113 provided in the polishing units 3A, 3B, 3C, and 3D, respectively.

The pure-water supply pipe 110 is divided between the first polishing section 3a and the second polishing section 3b. The divided ends of the pure-water supply pipe 110 are coupled by a joint (not shown in the drawing). Applications of the pure water to be used in each polishing unit include cleaning of the top ring (e.g., cleaning of a circumferential side surface of the top ring, cleaning of a substrate holding surface, cleaning of the retainer ring), cleaning of a transfer hand for the wafer (e.g., cleaning of transfer hands of a first linear transporter and a second linear transporter which will be described later), cleaning of a polished wafer, dressing of the polishing pad, cleaning of the dresser (e.g., cleaning of the dressing member), cleaning of the dresser arm, cleaning of the polishing liquid supply nozzle, and cleaning of the polishing pad by the atomizer.

The pure water flows through the pure-water supply pipe 110 into the distribution controllers 113, and is distributed to points of use by each distribution controller 113. The points of use are sites where the pure water is used (e.g., a nozzle for cleaning the top ring and a nozzle for cleaning the dresser). The pure water is delivered from the distribution controller 113 to terminal devices, such as the cleaning nozzles (e.g., the nozzle for cleaning the top ring and the nozzle for cleaning the dresser), provided in each polishing unit. For example, the pure water is supplied to the pure water supply tube 100 (see FIG. 13A) of the above-described polishing liquid supply nozzle at a flow rate regulated by the distribution controller 113 provided for each polishing unit. In this manner, because the distribution controller 113 is provided for each polishing unit, the number of pipes to be installed can be reduced, compared with a conventional structure in which the pure water is supplied from a single header to the polishing units through plural pipes. Further, the arrangements with the reduced number of pipes can also reduce joints to be used to couple pipes between the first polishing section 3a and the second polishing section 3b. Therefore, the structure can be simple and a risk of leakage of the pure water is reduced. As shown in FIG. 14, it is preferable to provide a pure-water supply pipe 112 dedicated for the atomizers, because the atomizers use a large amount of pure water.

Each of the distribution controllers 113 has a valve box 113a, a manometer (pressure measuring device) 113b disposed upstream of the valve box 113a, and a flow-rate regulator 113c disposed upstream of the manometer 113b. The valve box 113a is in fluid communication with the points of use, such as the nozzle (not shown) for cleaning the top ring and the pure water supply tube 100 (see FIG. 13A). Specifically, the valve box 113a has plural pipes communicating with the points of use, and valves provided in these pipes.

The manometer 113b is to measure pressure of the pure water to be delivered to the valve box 113a, and the flow-rate regulator 113c is to adjust a flow rate of the pure water such that a measurement of the manometer 113b is kept at a predetermined value. In this manner, since the flow rate of the pure water is controlled at each of the polishing units, use of the pure water in one polishing unit hardly affects use of the pure water in the other. Therefore, stable supply of the pure water can be realized. This embodiment can solve a conventional problem in which the flow rate of the pure water in one polishing unit becomes unstable as a result of use of the pure water in the other. In the example shown in FIG. 14, the flow-rate regulators 113c are provided for all of the polishing units. Alternatively, one flow-rate regulator 113c may be provided for two polishing units. For example, a pair of manometer 113b and flow-rate regulator 113c may be provided upstream of two valve boxes 113b for the polishing units 3A and 3B, and similarly, a pair of manometer 113b and flow-rate regulator 113c may be provided upstream of two valve boxes 113b for the polishing units 3C and 3D.

In the example shown in FIG. 14, the pure-water supply pipe 112 dedicated for the atomizers 34A, 34B, 34C, and 34D is provided separately from the pure-water supply pipe 110 that is provided for the points of use including the nozzle (not shown) for cleaning the top ring and the pure water supply tube 100. The pure-water supply pipe 112 is coupled to the atomizers 34A, 34B, 34C, and 34D, and flow-rate controllers 114 are provided upstream of the atomizers 34A, 34B, 34C, and 34D, respectively. Each flow-rate controller 114 is configured to regulate a flow rate of the pure water supplied through the pure-water supply pipe 112 and supply the pure water to the atomizer at the regulated flow rate.

As with the above-described distribution controller 113, each of the flow-rate controllers 114 includes a valve, a manometer, and a flow-rate regulator, which are arranged in the same manner as in the distribution controller 113. The controller 5 controls the operations of the flow-rate regulator of the flow-rate controller 114 based on the measurement of the manometer of the flow-rate controller 114 such that the pure water is supplied to each atomizer at a predetermined flow rate.

As shown in FIG. 14, the pure-water supply pipe 110 and the pure-water supply pipe 112 are coupled to the pure-water supply source independently of each other to thereby establish independent pure-water supply paths. This arrangement can prevent use of the pure water in the atomizers from affecting the flow rate of the pure water used in the other points of use.

While FIG. 14 illustrates the pure-water supply pipe 110 for supplying the pure water, the arrangements of the pipe and the distribution controllers as shown in FIG. 14 can be applied to supply pipes for other fluid such as air, nitrogen gas, and slurry. For example, multiple slurry supply pipes for different types of slurries may be provided and distribution controllers connected to the slurry supply pipes can be provided for the respective polishing units. Each distribution controller delivers slurry, selected according to the polishing process, to the above-described polishing liquid supply nozzle (see FIG. 13A). Since the distribution controller is provided for each polishing unit, the type of slurry to be supplied to the polishing liquid supply nozzle can differ between the polishing units. Further, the flow rate of the slurry to be supplied to the polishing liquid supply nozzle can be adjusted by the distribution controller.

Next, a transfer mechanism for transporting the wafer will be described. As shown in FIG. 1, a first linear transporter 6 is arranged adjacent to the first polishing unit 3A and the second polishing unit 3B. This first linear transporter 6 is configured to transfer a wafer between four transfer positions located along an arrangement direction of the polishing units 3A and 3B (hereinafter, these four transfer positions will be referred to as a first transfer position TP1, a second transfer position TP2, a third transfer position TP3, and a fourth transfer position TP4 in the order from the loading and unloading section 2).

Further, a second linear transporter 7 is arranged adjacent to the third polishing unit 3C and the fourth polishing unit 3D. This second linear transporter 7 is configured to transfer a wafer between three transfer positions located along an arrangement direction of the polishing units 3C and 3D (hereinafter, these three transfer positions will be referred to as a fifth transfer position TP5, a sixth transfer position TP6, and a seventh transfer position TP7 in the order from the loading and unloading section 2).

The wafer is transferred to the first polishing unit 3A and the second polishing unit 3B by the first linear transporter 6. As previously discussed, the top ring 31A of the first polishing unit 3A is moved between the polishing position and the second transfer position TP2 by the swinging motion of the top ring head 60. Therefore, the wafer is transferred to and from the top ring 31A at the second transfer position TP2. Similarly, the top ring 31B of the second polishing unit 3B is moved between the polishing position and the third transfer position TP3, and the wafer is transferred to and from the top ring 31B at the third transfer position TP3. The top ring 31C of the third polishing unit 3C is moved between the polishing position and the sixth transfer position TP6, and the wafer is transferred to and from the top ring 31C at the sixth transfer position TP6. The top ring 31D of the fourth polishing unit 3D is moved between the polishing position and the seventh transfer position TP7, and the wafer is transferred to and from the top ring 31D at the seventh transfer position TP7.

A lifter 11 is provided at the first transfer position TP1 for receiving the wafer from the transfer robot 22. The wafer is transferred from the transfer robot 22 to the first linear transporter 6 via the lifter 11. A shutter (not shown in the drawing) is provided on the partition 1a at a position between the lifter 11 and the transfer robot 22. When the wafer is to be transported, this shutter is opened to allow the transfer robot 22 to deliver the wafer to the lifter 11. A swing transporter 12 is provided between the first linear transporter 6, the second linear transporter 7, and the cleaning section 4. This swing transporter 12 has a hand that is movable between the fourth transfer position TP4 and the fifth transfer position TP5. Transferring of the wafer from the first linear transporter 6 to the second linear transporter 7 is performed by the swing transporter 12. The wafer is transferred to the third polishing unit 3C and/or the fourth polishing unit 3D by the second linear transporter 7. Further, the wafer, polished in the polishing section 3, is transferred to the cleaning section 4 by the swing transporter 12.

Next, structures of the first linear transporter 6, the second linear transporter 7, the lifter 11, and the swing transporter 12 will be described.

Figure 15:
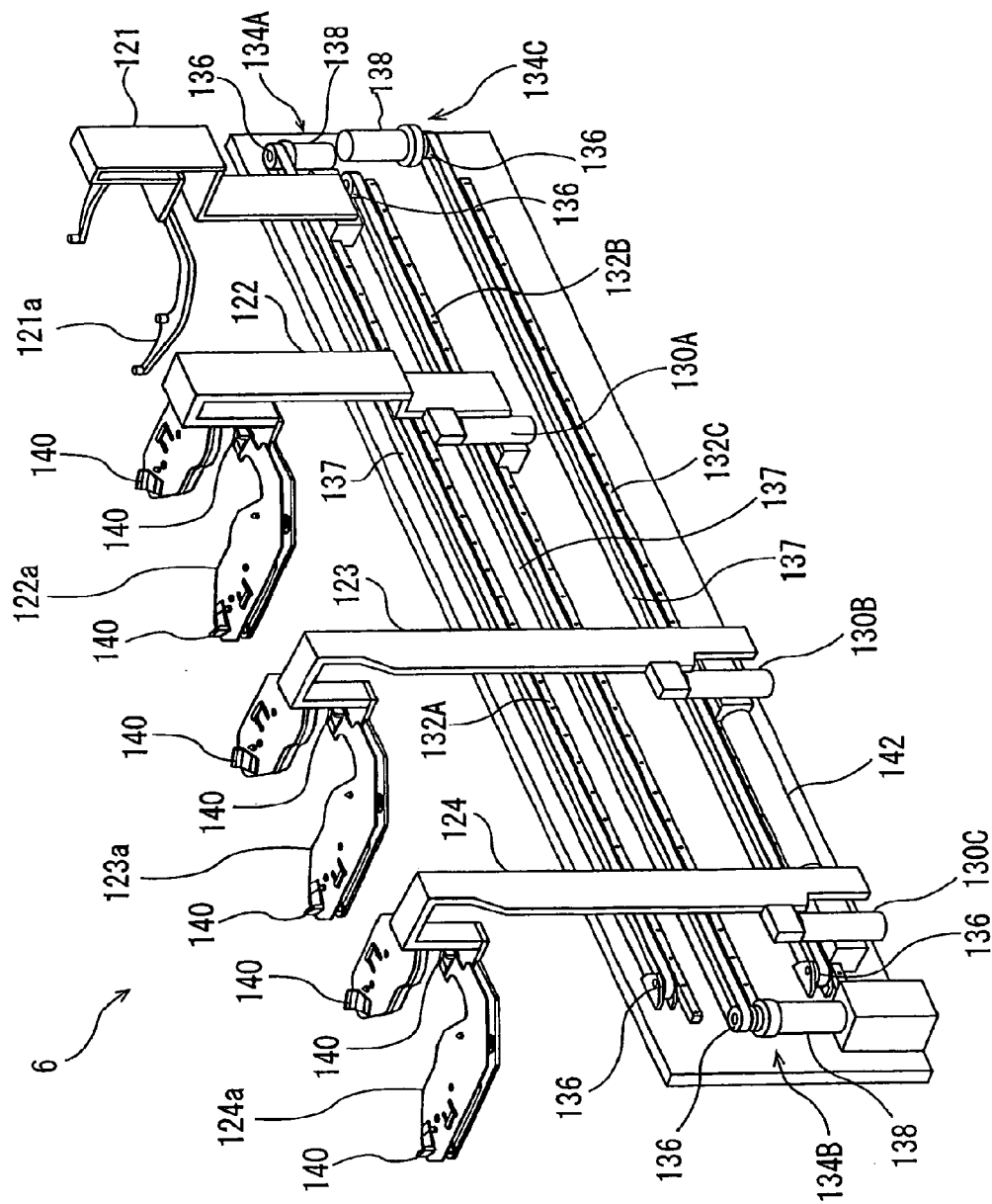
FIG. 15 is a perspective view schematically showing a first linear transporter.

FIG. 15 is a perspective view schematically showing the first linear transporter 6. The first linear transporter 6 includes first, second, third, and fourth transfer hands 121, 122, 123, and 124 having transfer stages (substrate-transfer stages) 121a, 122a, 123a, and 124a on which a wafer is to be placed, three elevating mechanisms 130A, 130B, and 130C for vertically moving the second, third, and fourth transfer hands 122, 123, and 124, three linear guides 132A, 132B, and 132C configured to horizontally movably support the first, second, third, and fourth transfer hands 121, 122, 123, and 124, and three horizontal drive mechanisms 134A, 134B, and 134C for horizontally moving the first, second, third, and fourth transfer hands 121, 122, 123, and 124. Specific examples of the elevating mechanisms 130A, 130B, and 130C include a pneumatic cylinder and a motor drive mechanism using a ball screw. Each of the horizontal drive mechanisms 134A, 134B, and 134C has a pair of pulleys 136, a belt 137 on these pulleys 136, and a servomotor 138 for rotating one of the pulleys 136.

Plural pins are provided on an upper surface of each of the transfer stages 121a, 122a, 123a, and 124a, and a wafer is placed onto these pins. The transfer stages 121a, 122a, 123a, and 124a have sensors (not shown in the drawing) for detecting a wafer by using a transmission sensor or the like. These sensors can detect whether a wafer is present on the transfer stages 121a, 122a, 123a, and 124a.

The first transfer hand 121 is supported by the first linear guide 132A, and is moved between the first transfer position TP1 and the fourth transfer position TP4 by the first horizontal drive mechanism 134A. This first transfer hand 121 is a pass hand for receiving a wafer from the lifter 11 and passing it to the second linear transporter 7. Therefore, the first transfer hand 121 is used in a case where a wafer is not polished in the first polishing unit 3A and the second polishing unit 3B, but is polished in the third polishing unit 3C and the fourth polishing unit 3D. An elevating mechanism is not provided for the first transfer hand 121. Therefore, the transfer stage (i.e., a substrate pass stage) 121a of the first transfer hand 121 is movable only in the horizontal direction.

The second transfer hand 122 is supported by the second linear guide 132B, and is moved between the first transfer position TP1 and the second transfer position TP2 by the second horizontal drive mechanism 134B. This second transfer hand 122 functions as an access hand for transferring a wafer from the lifter 11 to the first polishing unit 3A. Specifically, the second transfer hand 122 is moved to the first transfer position TP1, where it receives the wafer from the lifter 11. Then, the second transfer hand 122 is moved to the second transfer position TP2 again, where it transfers the wafer on its transfer stage 122a to the top ring 31A. The first elevating mechanism 130A is coupled to the second transfer hand 122, and they are moved in unison in the horizontal direction. When transferring the wafer on the transfer stage 122a to the top ring 31A, the second transfer hand 122 is elevated by the first elevating mechanism 130A. After the wafer is transferred to the top ring 31A, the second transfer hand 122 is lowered by the first elevating mechanism 130A.

Plural (three in the drawing) access guides 140, which are shaped so as to engage a circumferential lower end of the top ring 31A (i.e., a lower end of the retainer ring 40), are provided on the upper surface of the transfer stage 122a. Inner sides of the access guides 140 are tapered surfaces. When the transfer stage 122a is elevated to access the top ring 31A, the top ring 31A is guided by the access guides 140, whereby the top ring 31A engages the transfer stage 122a. Upon this engagement, centering between the top ring 31A and the transfer stage 122a (i.e., the wafer) is performed. Access guides 140 are also provided on the transfer stages 123a and 124a of the third and fourth transfer hands 123 and 124, as well as the transfer stage 122a.

The third transfer hand 123 and the fourth transfer hand 124 are supported by the third linear guide 132C. The third transfer hand 123 and the fourth transfer hand 124 are coupled to each other by a pneumatic cylinder 142, so that the third transfer hand 123, the fourth transfer hand 124, and the pneumatic cylinder 142 are moved in unison in the horizontal direction by the third horizontal drive mechanism 134C. The pneumatic cylinder 142 functions as an interval adjuster for adjusting an interval between the transfer stage 123a of the third transfer hand 123 and the transfer stage 124a of the fourth transfer hand 124. The reason of providing the pneumatic cylinder (interval adjuster) 142 is that an interval between the first transfer position TP1 and the second transfer position TP2 may differ from an interval between the second transfer position TP2 and the third transfer position TP3. The pneumatic cylinder 142 can perform the interval adjustment while the third transfer hand 123 and the fourth transfer hand 124 are moving.

The third transfer hand 123 is coupled to the second elevating mechanism 130B and the fourth transfer hand 124 is coupled to the third elevating mechanism 130C, so that the third transfer hand 123 and the fourth transfer hand 124 can be moved in the vertical directions independently of each other. The third transfer hand 123 is moved between the first transfer position TP1, the second transfer position TP2, and the third transfer position TP3, and simultaneously the fourth transfer hand 124 is moved between the second transfer position TP2, the third transfer position TP3, and the fourth transfer position TP4.

The third transfer hand 123 functions as an access hand for transferring a wafer from the lifter 11 to the second polishing unit 3B. Specifically, the third transfer hand 123 is moved to the first transfer position TP1, where it receives the wafer from the lifter 11. Then, the third transfer hand 123 is moved to the third transfer position TP3, where it transfers the wafer on its transfer stage 123a to the top ring 31B. The third transfer hand 123 further functions as an access hand for transferring a wafer polished in the first polishing unit 3A to the second polishing unit 3B. Specifically, the third transfer hand 123 is moved to the second transfer position TP2, where it receives the wafer from the top ring 31A. The third transfer hand 123 is further moved to the third transfer position TP3, where it transfers the wafer on its transfer stage 123a to the top ring 31B. When transferring the wafer between the transfer stage 123a and the top ring 31A or top ring 31B, the third transfer hand 123 is elevated by the second elevating mechanism 130B. After transferring of the wafer is completed, the third transfer hand 123 is lowered by the second elevating mechanism 130B.

The fourth transfer hand 124 functions as an access hand for transferring a wafer polished in the first polishing unit 3A or second polishing unit 3B to the swing transporter 12. Specifically, the fourth transfer hand 124 is moved to the second transfer position TP2 or third transfer position TP3, where it receives the polished wafer from the top ring 31A or top ring 31B. Then, the fourth transfer hand 124 is moved to the fourth transfer position TP4. When receiving the wafer from the top ring 31A or top ring 31B, the fourth transfer hand 124 is elevated by the third elevating mechanism 130C. After receiving the wafer, the fourth transfer hand 124 is lowered by the third elevating mechanism 130C.

Figure 16:
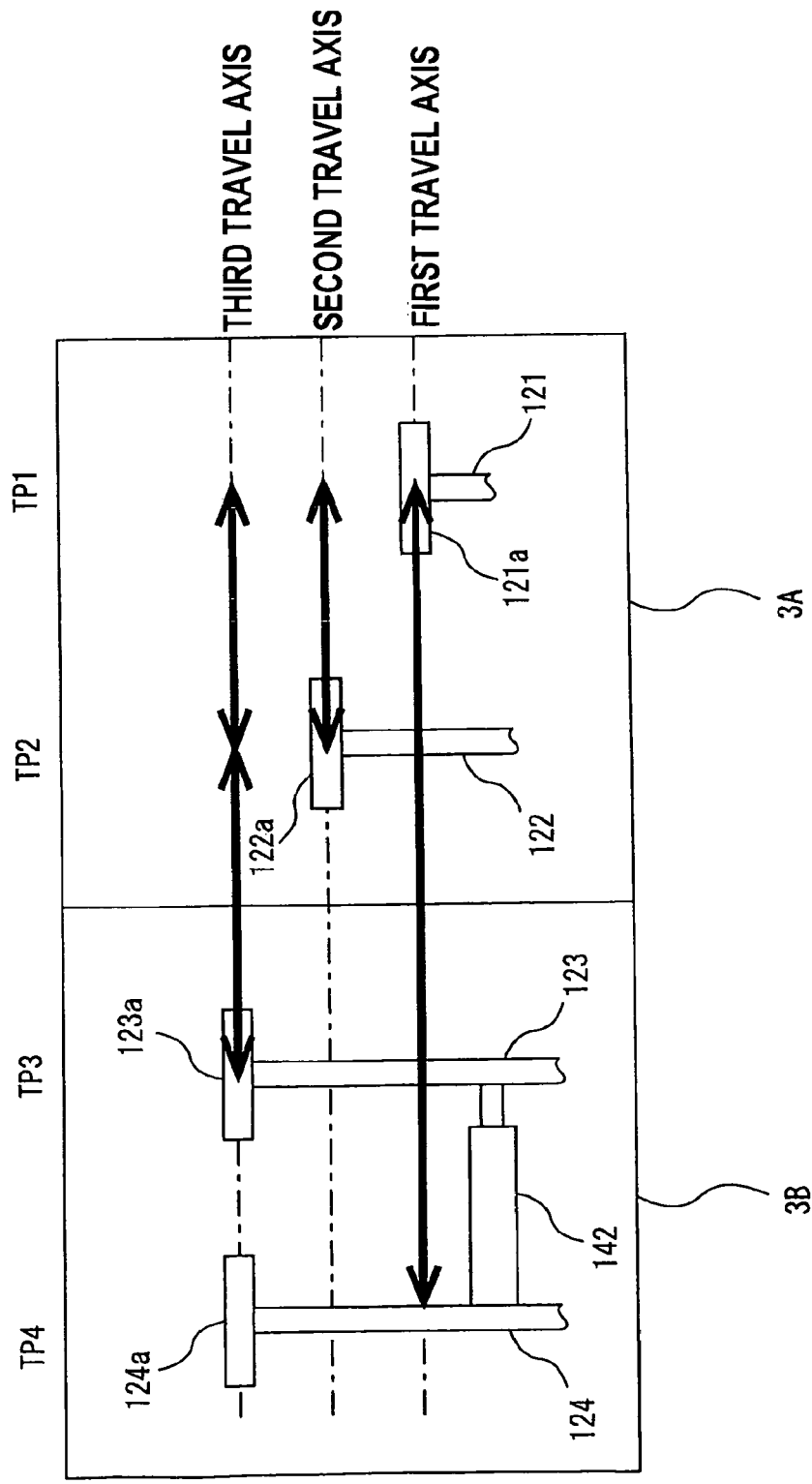
FIG. 16 is a schematic view illustrating vertical positions of a transfer stage of a first transfer hand, a transfer stage of a second transfer hand, a transfer stage of a third transfer hand, and a transfer stage of a fourth transfer hand.

FIG. 16 is a schematic view illustrating vertical positions of the transfer stage 121a of the first transfer hand 121, the transfer stage 122a of the second transfer hand 122, the transfer stage 123a of the third transfer hand 123, and the transfer stage 124a of the fourth transfer hand 124. As shown in FIG. 16, the four transfer stages 121a to 124a are moved along three travel axes at different heights. Specifically, the transfer stage 121a is moved along a first travel axis at a lowest position, the transfer stage 123a and the transfer stage 124a are moved along a third travel axis at a highest position, and the transfer stage 122a is moved along a second travel axis located between the first travel axis and the third travel axis. Therefore, the transfer stages 121a, 122a, 123a, and 124a can be moved horizontally without interfering with each other.

With this arrangement, the first linear transporter 6 can transfer a wafer, received from the lifter 11, to either of the first polishing unit 3A or the second polishing unit 3B. For example, while a wafer is transferred to the first polishing unit 3A and polished in the first polishing unit 3A, a next wafer can be transferred directly to the second polishing unit 3B where the next wafer can be polished. Therefore, the throughput can be increased. In addition, it is possible to transfer the wafer, polished in the first polishing unit 3A, to the second polishing unit 3B and further polish the wafer in the second polishing unit 3B. The second, third, and fourth transfer hands 122, 123, and 124 can move in the vertical directions while moving in the horizontal directions. For example, after receiving a wafer at the first transfer position TP1, the second transfer hand 122 can move upward while it moves to the second transfer position TP2. Therefore, the second transfer hand 122 can promptly pass the wafer to the top ring 31A right after the second transfer hand 122 reaches the second transfer position TP2. The third transfer hand 123 and the fourth transfer hand 124 can perform such operations as well. Therefore, a time of transferring a wafer can be reduced, and the throughput of the substrate processing apparatus can be improved. Moreover, because the transfer stage 121a of the first transfer hand 121 is located at the position lower than other transfer hands, the transfer stage 121a can transfer a wafer to the fourth transfer position TP4 even when the other transfer hand is accessing the top ring. In this manner, the arrangement of the three travel axes can increase flexibility in transferring of the wafer.

Figure 17:
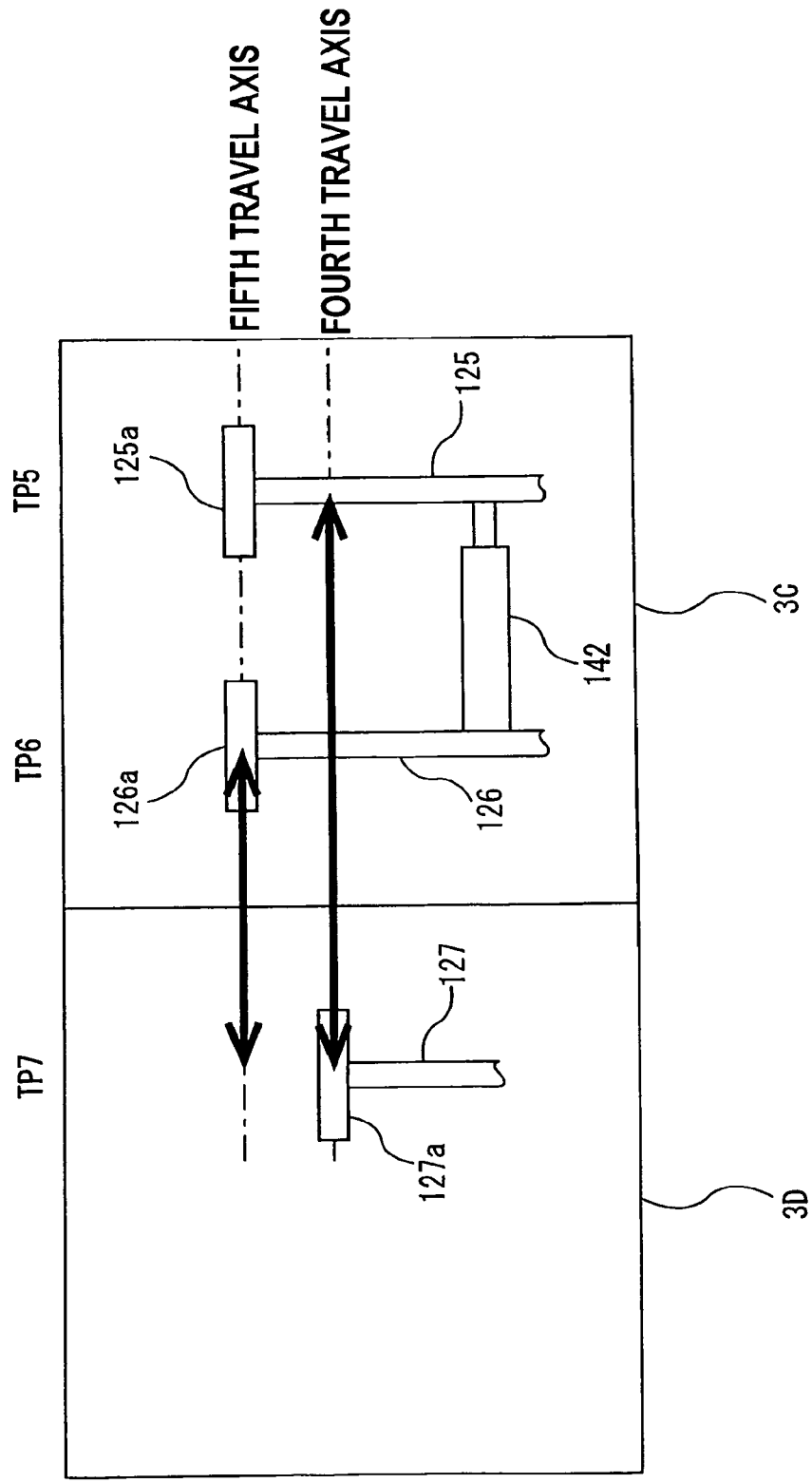
FIG. 17 is a schematic view illustrating vertical positions of transfer stages of a second linear transporter.

The second linear transporter 7 has basically the same structures as the first linear transporter 6, but differs from the first linear transporter 6 in that the second linear transporter 7 does not have an element corresponding to the first transfer hand 121. FIG. 17 is a schematic view illustrating vertical positions of transfer stages of the second linear transporter 7. Structures of the second linear transporter 7 that are identical to those of the first linear transporter 6 will not be described repetitively. The second linear transporter 7 has a fifth transfer hand 125, a sixth transfer hand 126, and a seventh transfer hand 127. These fifth transfer hand 125, the sixth transfer hand 126, and the seventh transfer hand 127 have transfer stages 125a, 126a, and 127a, respectively, on which a wafer is to be placed.

The fifth transfer hand 125 and the sixth transfer hand 126 are coupled to each other by a pneumatic cylinder 142 as an interval adjuster, so that the fifth transfer hand 125 and the sixth transfer hand 126 are moved in unison in the horizontal direction. The transfer stage 125a and the transfer stage 126a are moved along a fifth travel axis, and the transfer stage 127a is moved along a fourth travel axis lower than the fifth travel axis. Therefore, the transfer stages 125a, 126a, and 127a can be moved horizontally without interfering with each other. The fourth travel axis and the fifth travel axis are located at the same heights of the second travel axis and the third travel axis of the first linear transporter 6.

The fifth transfer hand 125 is moved between the fifth transfer position TP5 and the sixth transfer position TP6. This fifth transfer hand 125 functions as an access hand for transferring a wafer to and receiving a wafer from the top ring 31C. The sixth transfer hand 126 is moved between the sixth transfer position TP6 and the seventh transfer position TP7. This sixth transfer hand 126 functions as an access hand for receiving a wafer from the top ring 31C and transferring the wafer to the top ring 31D. The seventh transfer hand 127 is moved between the seventh transfer position TP7 and the fifth transfer position TP5. This seventh transfer hand 127 functions as an access hand for receiving a wafer from the top ring 31D and transferring the wafer to the fifth transfer position TP5. Although not described, operations of transferring of the wafer between the transfer hands 125, 126, and 127 and the top rings 31C and 31D are identical to the above-described operations of the first linear transporter 6.

In the case where the top ring as shown in FIG. 4 is used as the top rings 31A to 31D, it is preferable to provide retainer ring stations, which will be describe below, at the second transfer position TP2, the third transfer position TP3, the sixth transfer position TP6, and the seventh transfer position TP7, in order to facilitate or assist the wafer transferring operation between the top rings and the first and second linear transporters 6 and 7.

Figure 18:
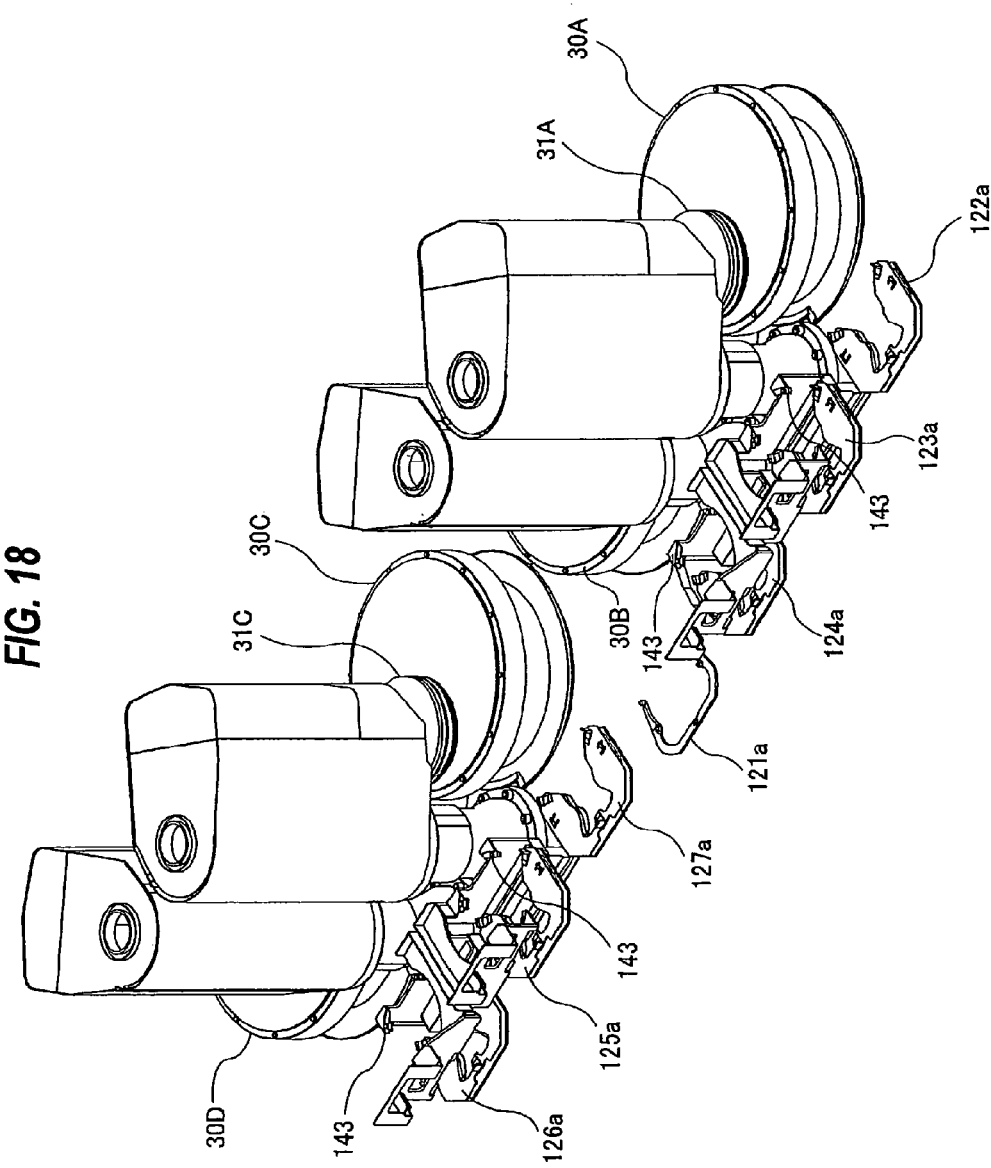
FIG. 18 is a perspective view illustrating arrangements of retainer ring stations provided at a second transfer position, a third transfer position, a sixth transfer position, and a seventh transfer position, the transfer stages, and the top rings.
Figure 19:
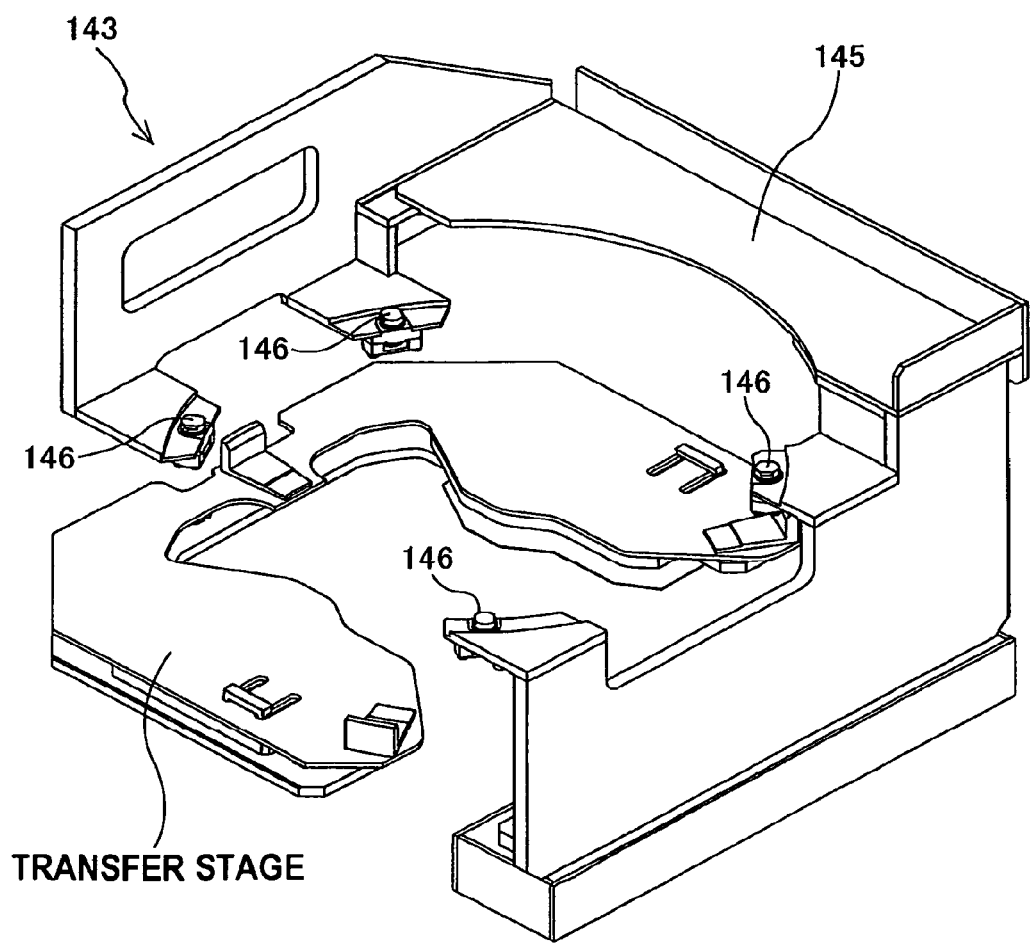
FIG. 19 is a perspective view showing the retainer ring station and the transfer stage.
Figure 20A:
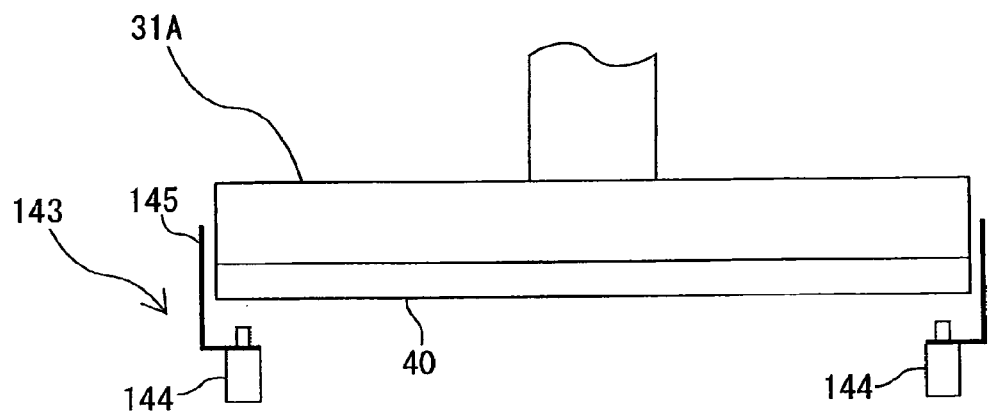
FIG. 20A is a side view showing a positional relationship between the retainer ring station and the top ring.
Figure 20B:
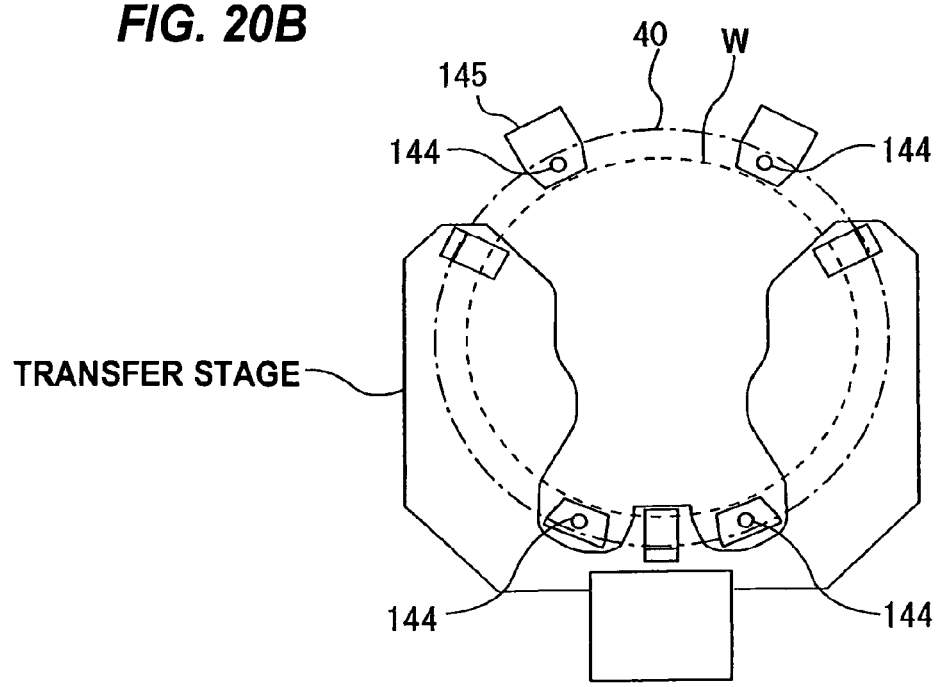
FIG. 20B is a plan view showing a positional relationship between the retainer ring station and the transfer stage.

FIG. 18 is a perspective view illustrating arrangements of the retainer ring stations provided at the second transfer position TP2, the third transfer position TP3, the sixth transfer position TP6, and the seventh transfer position TP7, the transfer stages, and the top rings. FIG. 19 is a perspective view showing the retainer ring station provided at the second transfer position TP2 and the transfer stage. FIG. 20A is a side view showing a positional relationship between the retainer ring station and the top ring, and FIG. 20B is a plan view showing a positional relationship between the retainer ring station and the transfer stage. The retainer ring station provided at the second transfer position TP2 will be described below.

The retainer ring station 143 includes plural push-up mechanisms 144 configured to push the retainer ring 40 of the top ring 31A upward, and a support base 145 supporting these push-up mechanisms 144. The push-up mechanisms 144 are located at a vertical position between the top ring 31A and the transfer stage (122a or 123a or 124a) of the first linear transporter 6. As shown in FIG. 20B, the push-up mechanisms 144 and the transfer stage are arranged so as not to contact each other.

Figure 21:
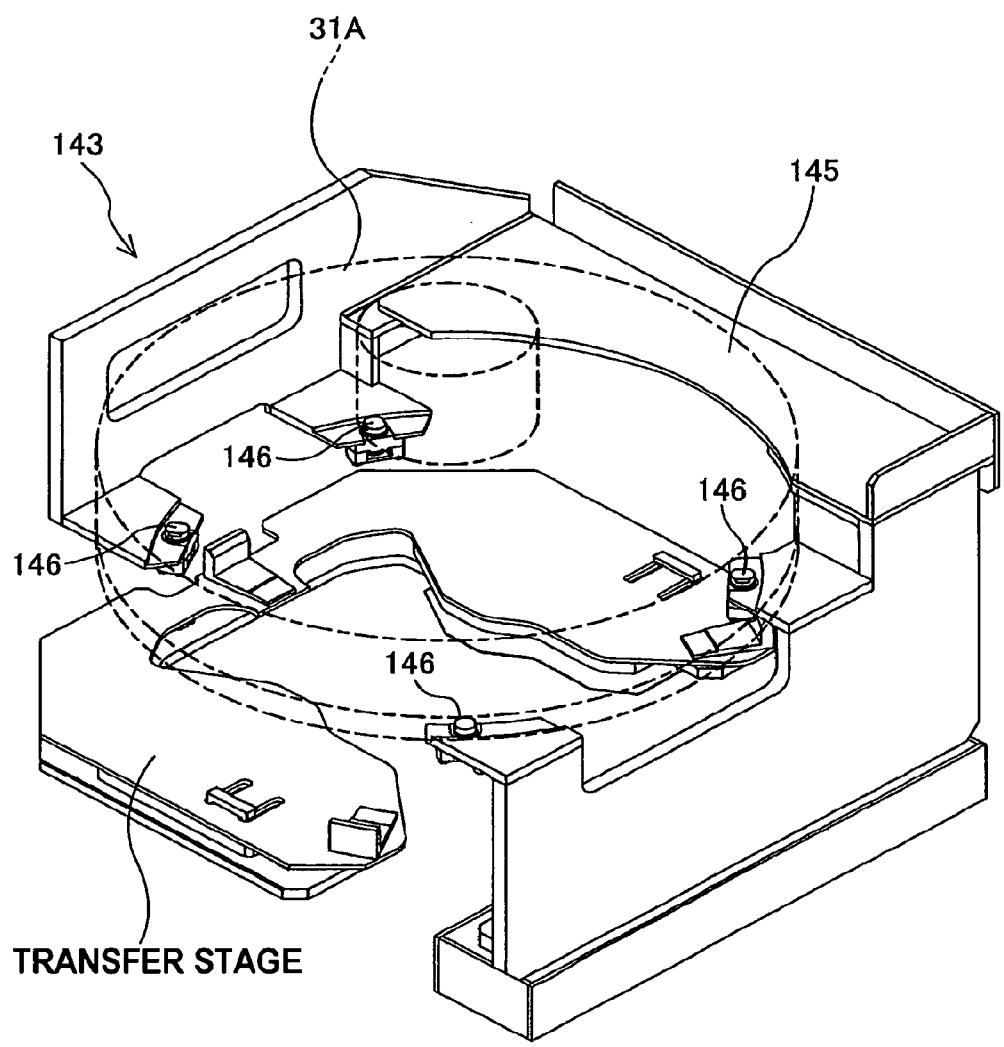
FIG. 21 is a perspective view showing the retainer ring station on which the top ring is placed.
Figure 22A:
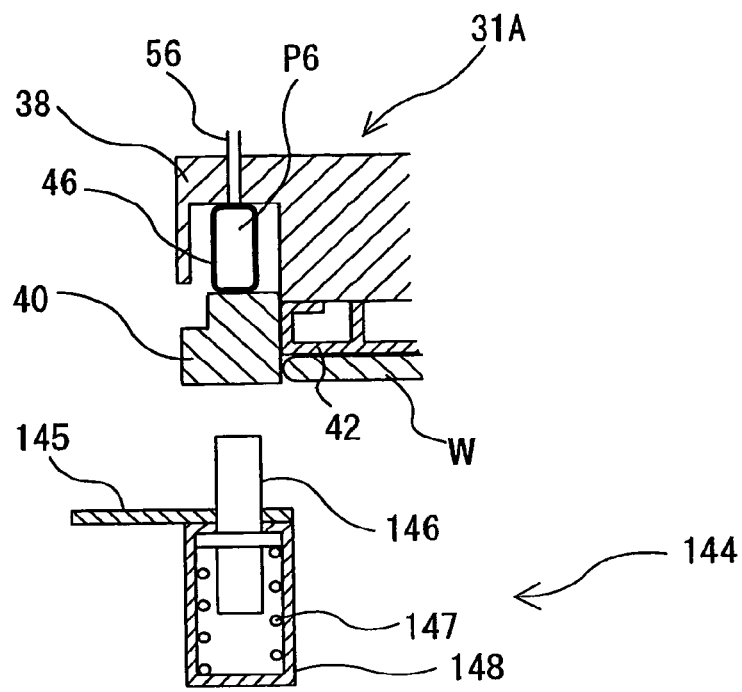
FIG. 22A is a cross-sectional view showing a push-up mechanism.
Figure 22B:
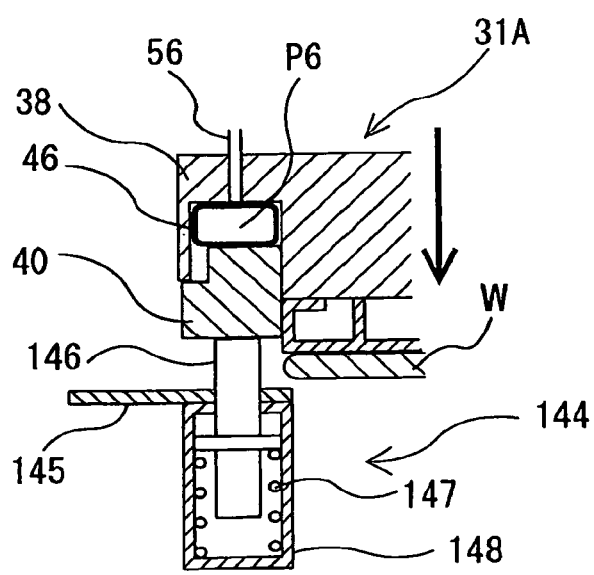
FIG. 22B is a cross-sectional view showing the push-up mechanism when contacting the retainer ring.

FIG. 21 is a perspective view showing the retainer ring station on which the top ring is placed. FIG. 22A is a cross-sectional view showing the push-up mechanism 144, and FIG. 22B is a cross-sectional view showing the push-up mechanism 144 when contacting the retainer ring. The push-up mechanism 144 includes a push-up pin 146 arranged to contact the retainer ring 40, a spring 147 as a biasing mechanism configured to push the push-up pin 146 upward, and a casing 148 configured to house the push-up pin 146 and the spring 147 therein. The push-up mechanism 144 is located such that the push-up pin 146 faces a lower surface of the retainer ring 40. When the top ring 31A is lowered, the lower surface of the retainer ring 40 is brought into contact with the push-up pins 146. The springs 147 have a pushing force that is large enough to push the retainer ring 40 upward. Therefore, as shown in FIG. 22B, the retainer ring 40 is pushed upward by the push-up pins 146 to a position above the wafer W.

Next, operations of transferring a wafer from the first linear transporter 6 to the top ring 31A will be described. First, the top ring 31A is moved from the polishing position to the second transfer position TP2. Then, the top ring 31A is lowered, and the retainer ring 40 is lifted by the push-up mechanisms 144 of the retainer ring station 143, as described above. While the top ring 31A is lowered, the transfer stage of the first linear transporter 6 is elevated to a position just below the top ring 31A without contacting the retainer ring 40. In this state, the wafer W is transferred from the transfer stage to the top ring 31A. Then, the top ring 31A moves upward, and at substantially the same time the transfer stage is lowered. The top ring 31A further moves to the polishing position, and then polishes the wafer W, while the transfer stage starts its next transferring operation. The similar operations are performed when the wafer is transferred from the top ring 31A to the first linear transporter 6.

In this manner, when the wafer is transferred, the top ring 31A and the transfer stage approach each other at substantially the same time, and move away from each other at substantially the same time. Therefore, the throughput can be improved. Retainer ring stations 143 provided at the third transfer position TP3, the sixth transfer position TP6, and the seventh transfer position TP7 have the same structures as the above-described retainer ring station 143, and the wafer transferring operations are performed in the same manner.

During polishing of the wafer, the retainer ring 40 is placed in sliding contact with the polishing surface of the polishing pad. As a result, the lower surface of the retainer ring 40 is worn away gradually. If the wear of the retainer ring 40 proceeds, the retainer ring 40 cannot hold the wafer during polishing and the wafer can be spun off from the rotating top ring 31A. To avoid this, it is necessary to replace the retainer ring 40 regularly. Conventionally, the replacement time of the retainer ring 40 is determined based on the number of wafers processed. However, this way of determining the replacement time is problematic because the retainer ring 40 is replaced even if it can be still used or the wafer may be spun off from the top ring 31A as a result of excess wear of the retainer ring 40. In the following example, to avoid such problems, a wear measuring device for measuring an amount of wear (abrasion loss) of the retainer ring 40 is provided in the retainer ring station 143.

Figure 23:
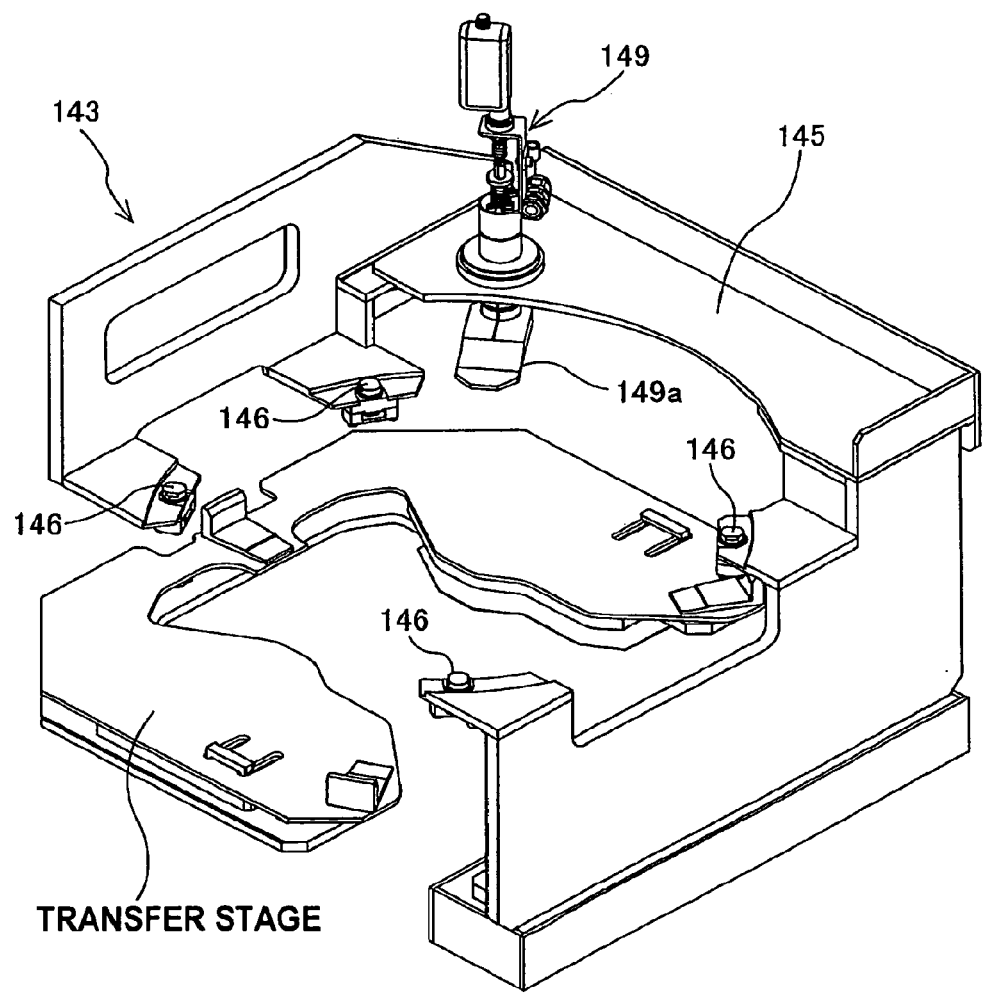
FIG. 23 is a perspective view showing the retainer ring station with a wear measuring device for measuring an amount of wear of the retainer ring.
Figure 24:
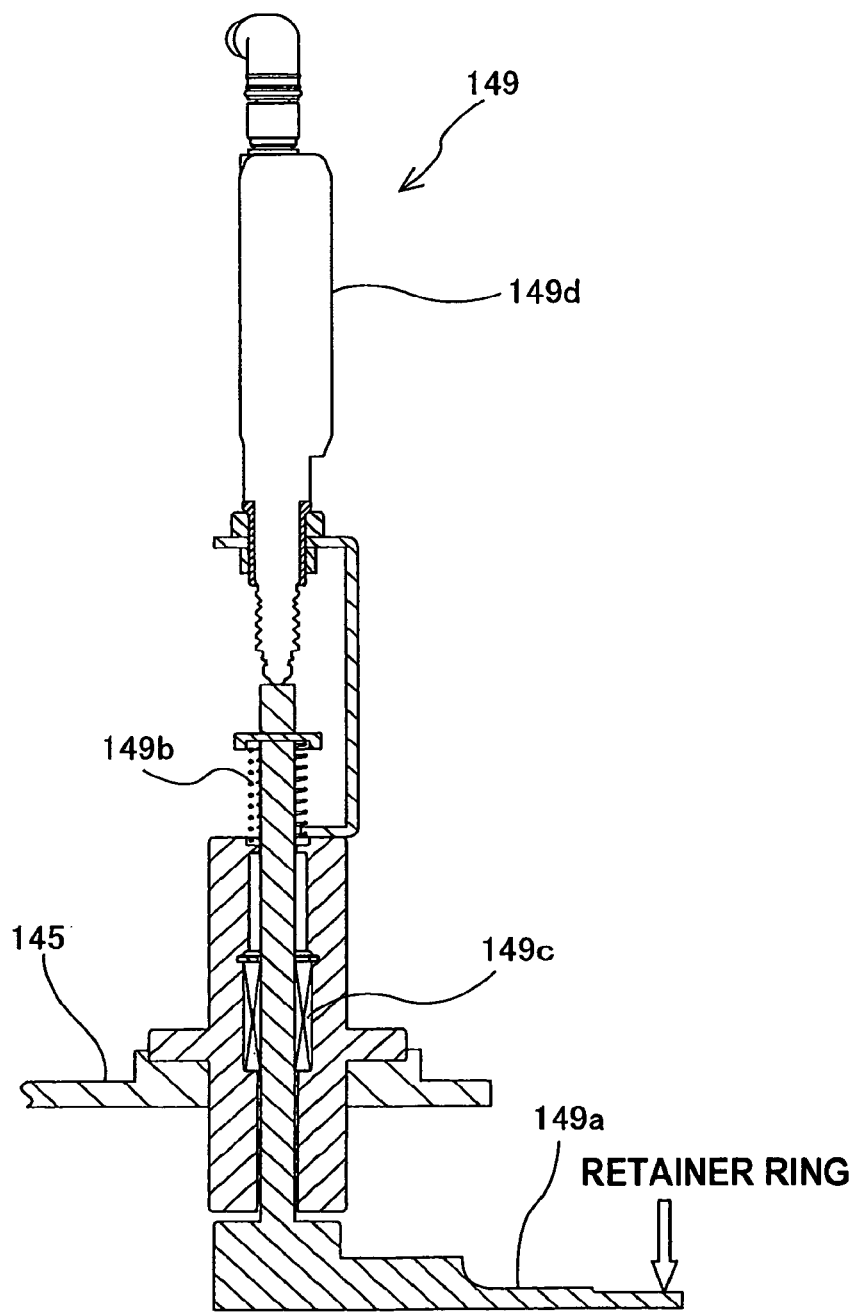
FIG. 24 is an enlarged cross-sectional view showing the wear measuring device shown in FIG. 23.
Figure 25:
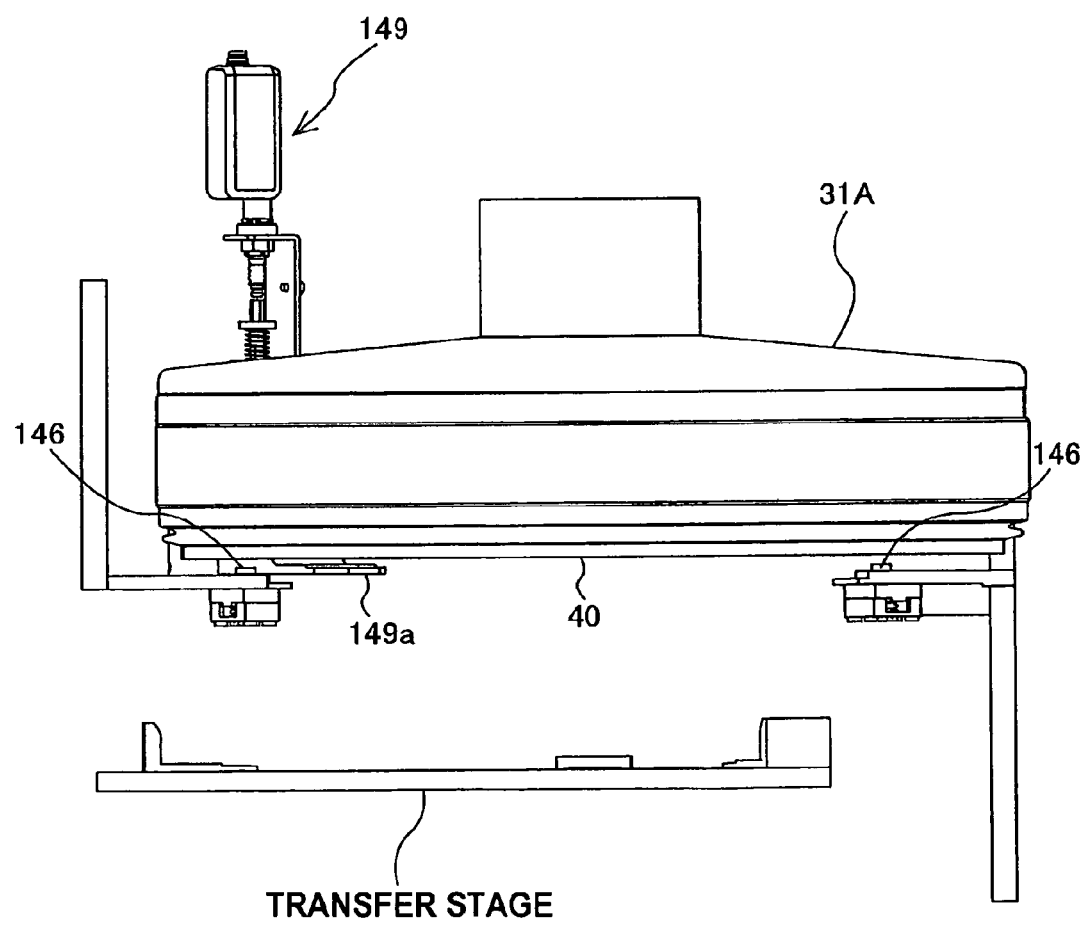
FIG. 25 is a side view showing the retainer ring station and the top ring.

FIG. 23 is a perspective view showing the retainer ring station 143 with a wear measuring device for measuring an amount of wear of the retainer ring 40. FIG. 24 is an enlarged cross-sectional view showing the wear measuring device shown in FIG. 23. FIG. 25 is a side view showing the retainer ring station 143 and the top ring 31A. The wear measuring device 149 is mounted on the support base 145 which supports the push-up mechanisms 144. A relative position between the wear measuring device 149 and the push-up mechanisms 144 is fixed. The wear measuring device 149 includes, as shown in FIG. 24, a contact member 149a arranged to be brought into contact with the lower surface of the retainer ring 40, a spring 149b configured to push the contact member 149a upward, a linear guide 149c configured to vertically movably support the contact member 149a, and a contact-type displacement sensor (displacement measuring device) 149d configured to measure a displacement of the contact member 149a. A ball spline can be used as the linear guide 149c. Instead of the contact-type displacement sensor, non-contact-type displacement sensor (e.g., an optical displacement sensor) may be used.

The contact member 149a has an L shape as viewed from a lateral direction and has a lower end located at substantially the same height as the push-up pins 146. When the top ring 31A is placed onto the retainer ring station 143, the lower end of the contact member 149a contacts the lower surface of the retainer ring 40 at substantially the same time the push-up pins 146 contacts the lower surface of the retainer ring 40. The displacement sensor 149d is arranged above the contact member 149a. The contact member 149a is biased upward by the spring 149b and an upper end of the contact member 149a is in contact with the displacement sensor 149d at all times. Therefore, a vertical displacement of the contact member 149a is measured by the displacement sensor 149d. The displacement sensor 149d is coupled to the controller 5, so that a measurement of the displacement sensor 149d is sent to the controller 5.

When the top ring 31A is lowered and placed onto the retainer ring station 143, the push-up pins 146 and the contact member 149a contact the lower surface of the retainer ring 40 of the top ring 31A. The top ring 31A is further lowered until it stops at a predetermined height, and simultaneously the retainer ring 40 is pushed upward by the push-up pins 146. At this time, the contact member 149*a* is pushed downward by the retainer ring 40. The displacement of the contact member 149*a* is measured by the displacement sensor 149*d*, and the measurement is transmitted to the controller 5. While the displacement sensor 149*d* is measuring the displacement of the contact member 149*a*, the wafer is transferred between the top ring 31A and the transfer stage.

The displacement of the contact member 149*a*, i.e., the measurement of the displacement sensor 149*d*, varies according to the amount of wear of the retainer ring 40. More specifically, as the amount of wear of the retainer ring 40 increases, the measurement of the displacement sensor 149*d* decreases. A predetermined threshold, indicating the replacement time of the retainer ring 40, is set in the controller 5. The controller 5 determines the replacement time of the retainer ring 40 by detecting that the measurement of the displacement sensor 149*d* reaches the preset threshold. It is preferable to provide the wear measuring device 149 not only in the retainer ring station 143 provided at the second transfer position TP2, but also in the retainer ring stations provided at the third transfer position TP3, the sixth transfer position TP6, and the seventh transfer position TP7.

According to this example, because the replacement time of the retainer ring 40 is determined based on the amount of wear of the retainer ring 40, replacement frequency of the retainer ring 40 can be reduced and the cost can be lowered. In addition, the wafer can be prevented from coming off the top ring during polishing. Further, since the measuring operation of the amount of wear of the retainer ring 40 is performed during transferring of the wafer between the top ring 31A and the transfer stage, the measuring operation does not lower the throughout of the substrate processing apparatus. Specifically, pushing the retainer ring 40 upward by the push-up pins 146 and measuring the amount of wear of the retainer ring 40 by the wear measuring device 149 are necessarily performed at the same time. Accordingly, it is not necessary to provide a time for measuring the amount of wear of the retainer ring 40. As a result, the throughput of the apparatus as a whole can be improved.

Figure 26:
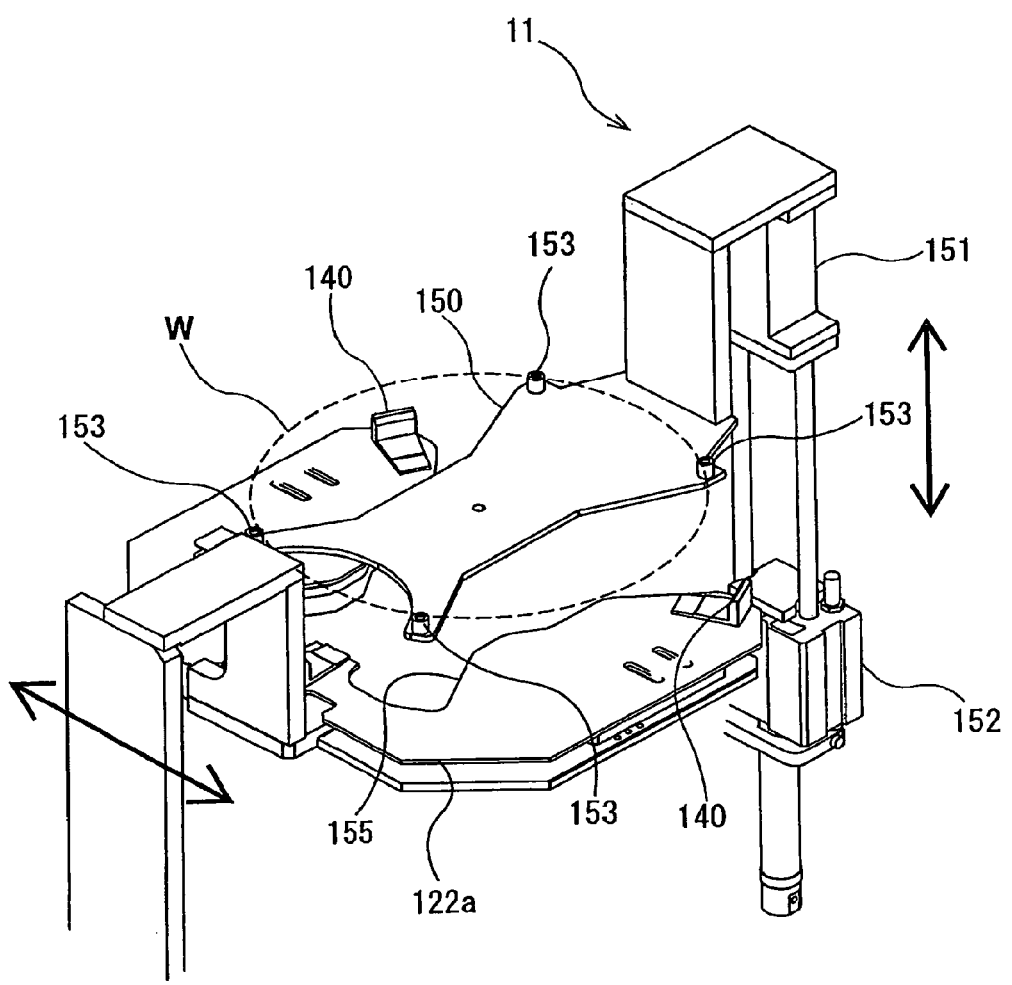
FIG. 26 is a perspective view showing a lifter.

FIG. 26 is a perspective view showing the lifter 11. The lifter 11 is arranged in a position such that the arm of the transfer robot 22 (see FIG. 1) can access it. The lifter 11 includes a placement stage 150 on which the wafer is to be placed, a support shaft 151 supporting the placement stage 150, and an elevating mechanism 152 configured to move the placement stage 150 in the vertical direction. Specific examples of the elevating mechanism 152 include a pneumatic cylinder and a motor drive mechanism using a ball screw. The placement stage 150 is located at the first transfer position TP1. Four pins 153 are provided on an upper surface of the placement stage 150, so that the wafer W is placed onto these pins 153. The lower arm of the transfer robot 22 rotates about its own axis through 180 degrees to thereby reverse the wafer, and then places the reversed wafer onto the placement stage 150 of the lifter 11. FIG. 26 shows the reversed wafer W. In this embodiment, the arm of the transfer robot 22 functions as a reversing device. Therefore, it is not necessary to provide the reversing device which was necessarily installed in a conventional apparatus. As a result, a step of reversing the wafer W after the lifter receives the wafer W can be omitted. Therefore, the throughput in the overall processes can be increased.

The transfer stage 122*a* (or 121*a* or 123*a*) of the first linear transporter 6 at the first transfer position TP1 and the placement stage 150 of the lifter 11 are arranged along the same vertical axis. As shown in FIG. 26, when viewed from the vertical direction, the transfer stage 122*a* and the placement stage 150 are shaped so as not to overlap. More specifically, the transfer stage 122*a* of the first linear transporter 6 has a notch 155 shaped so as to allow the placement stage 150 to pass therethrough. This notch 155 is slightly larger than the placement stage 150.

The lifter 11 receives the wafer W, reversed by the arm of the transfer robot 22, with the placement stage 150 located in the elevated position, and then the placement stage 150 is driven by the elevating mechanism 152 to move downward. When the placement stage 150 passes through the transfer stage 122*a* of the first linear transporter 6, only the wafer W is placed onto the transfer stage 122*a*. The placement stage 150 is further lowered until it reaches a predetermined stop position. In this manner, the wafer W is transferred from the lifter 11 to the first linear transporter 6. In this embodiment, the arm of the transfer robot 22 functions as a reversing device. Therefore, it is not necessary to provide the reversing device which was necessarily installed in a conventional apparatus. As a result, the number of operations for transferring the wafer from the transfer robot 22 to the first linear transporter 6 can be reduced, and errors in the wafer transferring operations and the transferring time can be reduced.

The support shaft 151 of the lifter 11 has a reversed L shape, and has a vertical portion located outwardly of the placement stage 150. Specifically, when viewed from the vertical direction, the placement stage 150 and the vertical portion of the support shaft 151 are arranged so as not to overlap. Further, the support shaft 151 is located off the travel path of the transfer stage of the first linear transporter 6. Therefore, the transfer stage of the first linear transporter 6 can move to the first transfer position TP1 regardless of the vertical position of the placement stage 150 of the lifter 11. Hence, the throughput can be increased.

Figure 27:
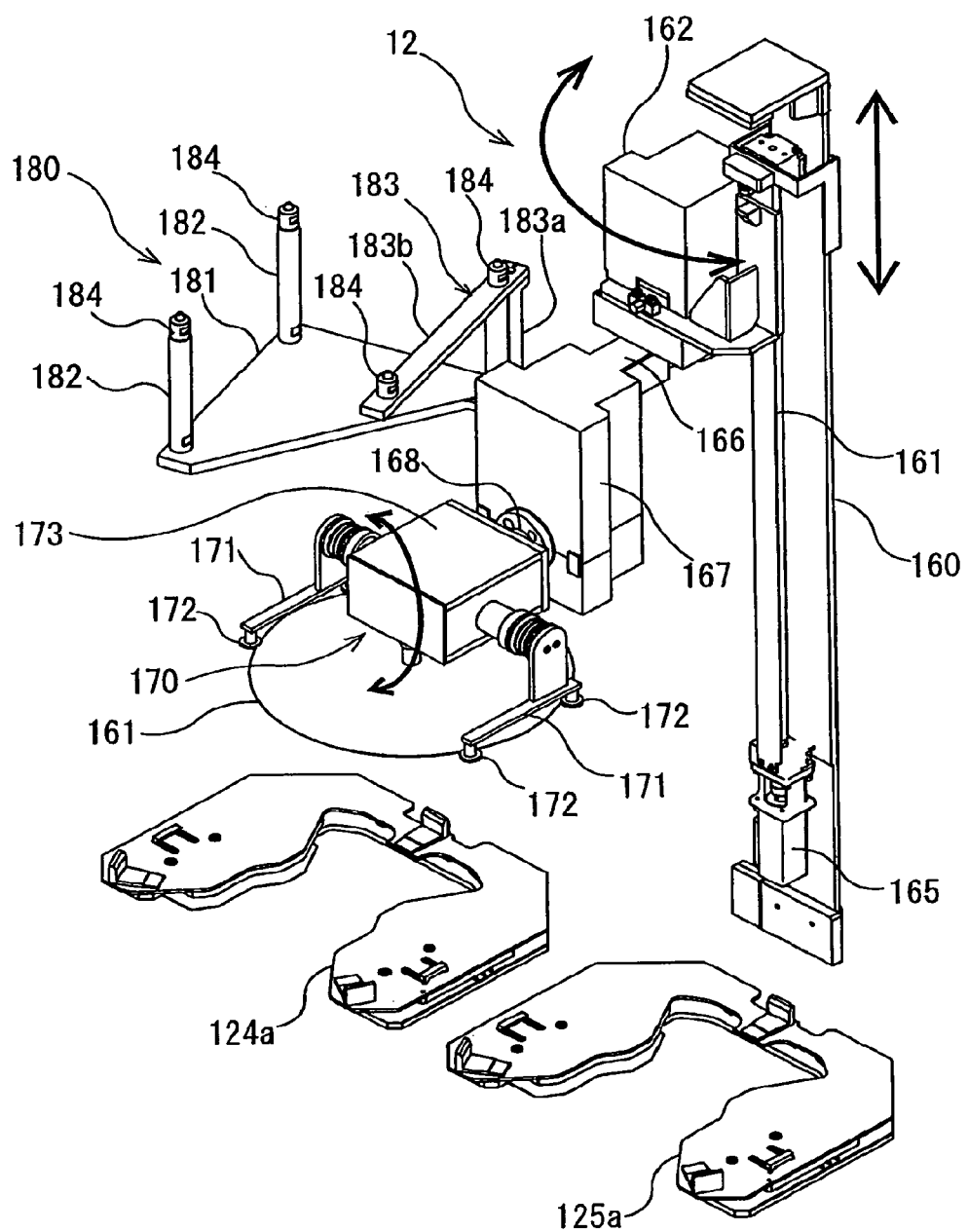
FIG. 27 is a perspective view showing a swing transporter.

FIG. 27 is a perspective view showing the swing transporter 12. The swing transporter 12 is mounted on a frame 160 of the substrate processing apparatus. The swing transporter 12 includes a linear guide 161 extending in the vertical direction, a swinging mechanism 162 mounted on the linear guide 161, and an elevating mechanism 165 as a drive source for moving the swinging mechanism 162 in the vertical direction. A robo cylinder (electric actuator) having a servomotor and a ball screw may be used as the elevating mechanism 165. A reversing mechanism 167 is coupled to the swinging mechanism 162 via a swing arm 166. Further, a holding mechanism 170 for holding the wafer W is coupled to the reversing mechanism 167. A temporary base 180 for the wafer W is arranged beside the swing transporter 12. This temporary base 180 is mounted on a non-illustrated frame. As shown in FIG. 1, the temporary base 180 is arranged adjacent to the first linear transporter 6 and located between the first linear transporter 6 and the cleaning section 4.

The swing arm 166 is coupled to a motor (not shown in the drawing) of the swinging mechanism 162, so that when the motor is set in motion, the swing arm 166 pivots (swings) on a rotational shaft of this motor. This swinging motion of the swing arm 166 causes the reversing mechanism 167 and the holding mechanism 170 to perform a swinging motion integrally, whereby the holding mechanism 170 is moved between the fourth transfer position TP4, the fifth transfer position TP5, and the temporary base 180.

The holding mechanism 170 has a pair of holding arms 171 configured to hold the wafer W. Chucks 172 for holding a periphery of the wafer W are provided on both ends of each holding arm 171. These chucks 172 are shaped so as to project downward from the both ends of the holding arm 171. The holding mechanism 170 further has an opening-closing mechanism 173 configured to move the pair of holding arms 171 closer to and away from the wafer W.

When the wafer W is to be held, the holding arms 171 are opened and the holding mechanism 170 is lowered by the elevating mechanism 165 until the chucks 172 of the holding arms 171 lie in the same plane as the wafer W. Then, the holding arms 171 are moved closer to each other by the opening-closing mechanism 173 to thereby hold the periphery of the wafer W with the chucks 172 of the holding arms 171. In this state, the holding arms 171 are elevated by the elevating mechanism 165.

The reversing mechanism 167 includes a rotational shaft 168 coupled to the holding mechanism 170, and a motor (not shown in the drawing) for rotating the rotational shaft 168. The rotational shaft 168 is driven by the motor to cause the holding mechanism 170 to rotate in its entirety through 180 degrees, thereby reversing the wafer W held by the holding mechanism 170. In this manner, the holding mechanism 170 in its entirety is reversed by the reversing mechanism 167. Therefore, a conventionally required transferring operation between a holding mechanism and a reversing mechanism can be omitted. When the wafer W is transferred from the fourth transfer position TP4 to the fifth transfer position TP5, the wafer W is not reversed by the reversing mechanism 167, and is transferred with its surface (i.e., the surface to be polished) facing downward. On the other hand, when the wafer W is transferred from the fourth transfer position TP4 or the fifth transfer position TP5 to the temporary base 180, the wafer W is reversed by the reversing mechanism 167 such that a polished surface faces upward.

The temporary base 180 has a base plate 181, plural (two in FIG. 27) vertical rods 182 secured to an upper surface of the base plate 181, and a single horizontal rod 183 secured to the upper surface of the base plate 181. The horizontal rod 183 has a reverse L-shape. This horizontal rod 183 has a vertical portion 183*a* connected to the upper surface of the base plate 181 and a horizontal portion 183*b* extending horizontally from an upper end of the vertical portion 183*a* toward the holding mechanism 170. Plural (two in FIG. 27) pins 184 for supporting the wafer W are provided on an upper surface of the horizontal portion 183*b*. Similarly, pins 184 for supporting the wafer W are provided on upper ends of the vertical rods 182, respectively. Tip ends of these pins 184 lie in the same horizontal plane. The horizontal rod 183 and the vertical rods 182 are arranged such that a center of the swinging movement of the wafer W (i.e., the rotational shaft of the motor of the swinging mechanism 162) is located nearer to the horizontal rod 183 than the vertical rods 182.

The holding mechanism 170, holding the wafer W reversed by the reversing mechanism 167, moves into a gap between the horizontal portion 183*b* of the horizontal rod 183 and the base plate 181. When all of the pins 184 are located below the wafer W, the swinging movement of the holding mechanism 170 by the swinging mechanism 162 is stopped. In this state, the holding arms 171 are opened, whereby the wafer W is placed onto the temporary base 180. The wafer W, placed on the temporary base 180, is then transferred to the cleaning section 4 by a transfer robot of the cleaning section 4 which will be described below.

Figure 28A:
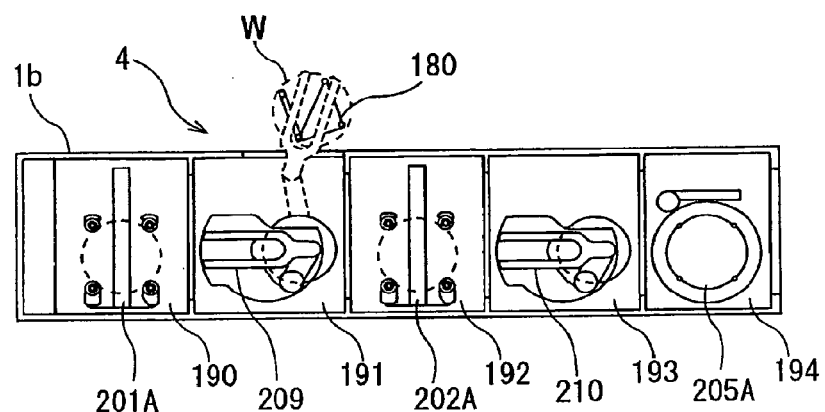
FIG. 28A is a plan view showing a cleaning section.
Figure 28B:
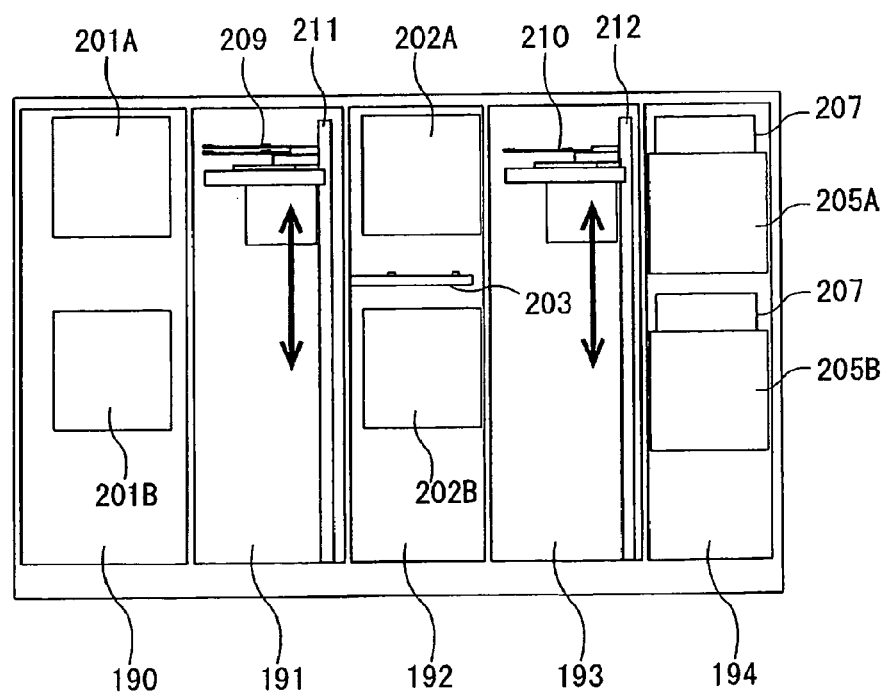
FIG. 28B is a side view showing the cleaning section.

FIG. 28A is a plan view showing the cleaning section 4, and FIG. 28B is a side view showing the cleaning section 4. As shown in FIG. 28A and FIG. 28B, the cleaning section 4 includes a first cleaning chamber 190, a first transfer chamber 191, a second cleaning chamber 192, a second transfer chamber 193, and a drying chamber 194. In the first cleaning chamber 190, an upper primary cleaning module 201A and a lower primary cleaning module 201B are disposed. These primary cleaning modules 201A and 201B are aligned along the vertical direction. Specifically, the upper primary cleaning module 201A is arranged above the lower primary cleaning module 201B. Similarly, an upper secondary cleaning module 202A and a lower secondary cleaning module 202B are disposed in the second cleaning chamber 192, and are aligned along the vertical direction. The upper secondary cleaning module 202A is arranged above the lower secondary cleaning module 202B. The first and secondary cleaning modules 201A, 201B, 202A, and 202B are a cleaning machine for cleaning the wafer using a cleaning liquid. The arrangement of these cleaning modules 201A, 201B, 202A, and 202B along the vertical direction presents an advantage of reducing a footprint.

A temporary base 203 for the wafer is provided between the upper secondary cleaning module 202A and the lower secondary cleaning module 202B. In the drying chamber 194, an upper drying module 205A and a lower drying module 205B are disposed along the vertical direction. The upper drying module 205A and the lower drying module 205B are isolated from each other. Filter fan units 207 and 207 are provided on upper portions of the upper drying module 205A and the lower drying module 205B so as to supply a clean air to these drying modules 205A and 205B, respectively. The upper primary cleaning module 201A, the lower primary cleaning module 201B, the upper secondary cleaning module 202A, the lower secondary cleaning module 202B, the temporary base 203, the upper drying module 205A, and the lower drying module 205B are mounted on non-illustrated frames via bolts or the like.

A vertically-movable first transfer robot 209 is provided in the first transfer chamber 191, and a vertically-movable second transfer robot 210 is provided in the second transfer chamber 193. The first transfer robot 209 and the second transfer robot 210 are movably supported by vertically-extending support shafts 211 and 212. The first transfer robot 209 and the second transfer robot 210 have drive mechanisms (e.g., motors) therein, respectively, so that the transfer robots 209 and 210 can move along the support shafts 211 and 212 in the vertical directions. The first transfer robot 209 has vertically arranged two hands: an upper hand and a lower hand, as with the transfer robot 22. The first transfer robot 209 is located such that the lower hand thereof can access the above-described temporary base 180, as indicated by a dotted line in FIG. 28A. When the lower hand of the first transfer robot 209 accesses the temporary base 180, a shutter (not shown in the drawing) on the partition 1*b* is opened.

The first transfer robot 209 is configured to transfer the wafer W between the temporary base 180, the upper primary cleaning module 201A, the lower primary cleaning module 201B, the temporary base 203, the upper secondary cleaning module 202A, and the lower secondary cleaning module 202B. When transferring a wafer to be cleaned (i.e., a wafer with slurry attached), the first transfer robot 209 uses its lower hand. On the other hand, when transferring a cleaned wafer, the first transfer robot 209 uses its upper hand. The second transfer robot 210 is configured to transfer the wafer W between the upper secondary cleaning module 202A, the lower secondary cleaning module 202B, the temporary base 203, the upper drying module 205A, and the lower drying module 205B. The second transfer robot 210 transfers only a cleaned wafer, and thus has a single hand. The transfer robot 22 shown in FIG. 1 uses its upper hand to remove the wafer from the upper drying module 205A or the lower drying module 205B, and returns the wafer to the wafer cassette. When the upper hand of the transfer robot 22 accesses the upper drying module 205A or the lower drying module 205B, a shutter (not shown in the drawing) on the partition 1a is opened.

Figure 29:
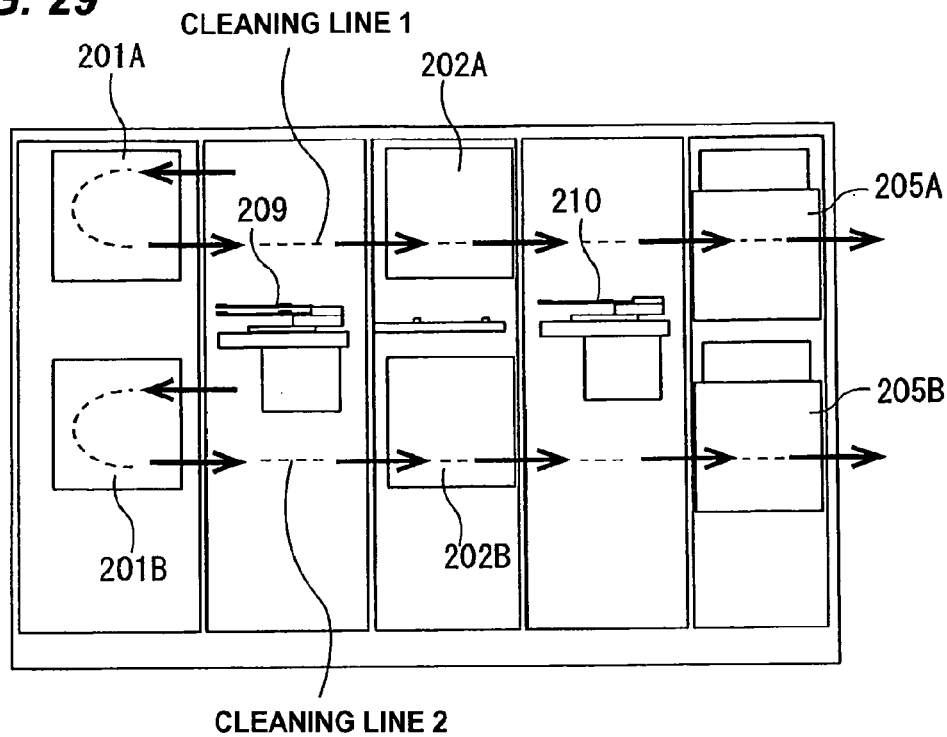
FIG. 29 is a schematic view showing an example of a cleaning line.

The cleaning section 4 has the two primary cleaning modules and the two secondary cleaning modules, as described above. With this configuration, the cleaning section 4 can provide plural cleaning lines for cleaning plural wafers in parallel. The term "cleaning line" is a route of a wafer in the cleaning section 4 when cleaned by the plural cleaning modules. For example, in FIG. 29, a wafer can be transferred via the first transfer robot 209, the upper primary cleaning module 201A, the first transfer robot 209, the upper secondary cleaning module 202A, the second transfer robot 210, and the upper drying module 205A in this order (see a cleaning line 1). In parallel with this wafer route, another wafer can be transferred via the first transfer robot 209, the lower primary cleaning module 201B, the first transfer robot 209, the lower secondary cleaning module 202B, the second transfer robot 210, and the lower drying module 205B in this order (see a cleaning line 2). In this manner, plural (typically two) wafers can be cleaned and dried substantially simultaneously by the two parallel cleaning lines.

It is also possible to clean and dry plural wafers at predetermined time intervals in the two parallel cleaning lines. The advantages of cleaning the wafers at predetermined time intervals are as follows. The first transfer robot 209 and the second transfer robot 210 are commonly used in the plural cleaning lines. Accordingly, if cleaning processes or drying processes are terminated at the same time, these transfer robots cannot transfer the wafers promptly. As a result, the throughput is lowered. Such problems can be avoided by providing the predetermined time intervals when cleaning and drying plural wafers. With this operation, the processed wafers can be promptly transferred by the transfer robots 209 and 210.

A polished wafer carries slurry attached thereto, and it is not preferable to leave the polished wafer with the slurry attached for a long time. This is because copper as interconnect metal could be corroded by the slurry. According to the cleaning section 4 with two primary cleaning modules, even when a preceding wafer is being cleaned in either of the upper primary cleaning module 201A or the lower primary cleaning module 201B, a following wafer can be transferred into another primary cleaning module and can thus be cleaned. In this manner, the cleaning section 4 not only can achieve a high throughput, but it can also prevent corrosion of the copper by rapidly cleaning the polished wafer.

Figure 30:
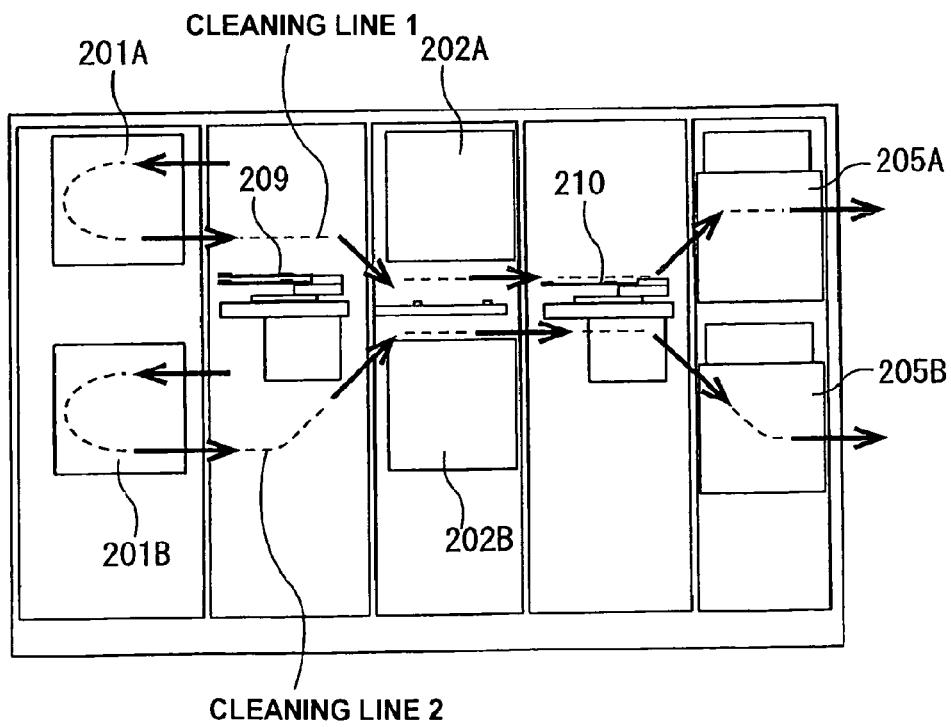
FIG. 30 is a schematic view showing an example of the cleaning line.
Figure 31:
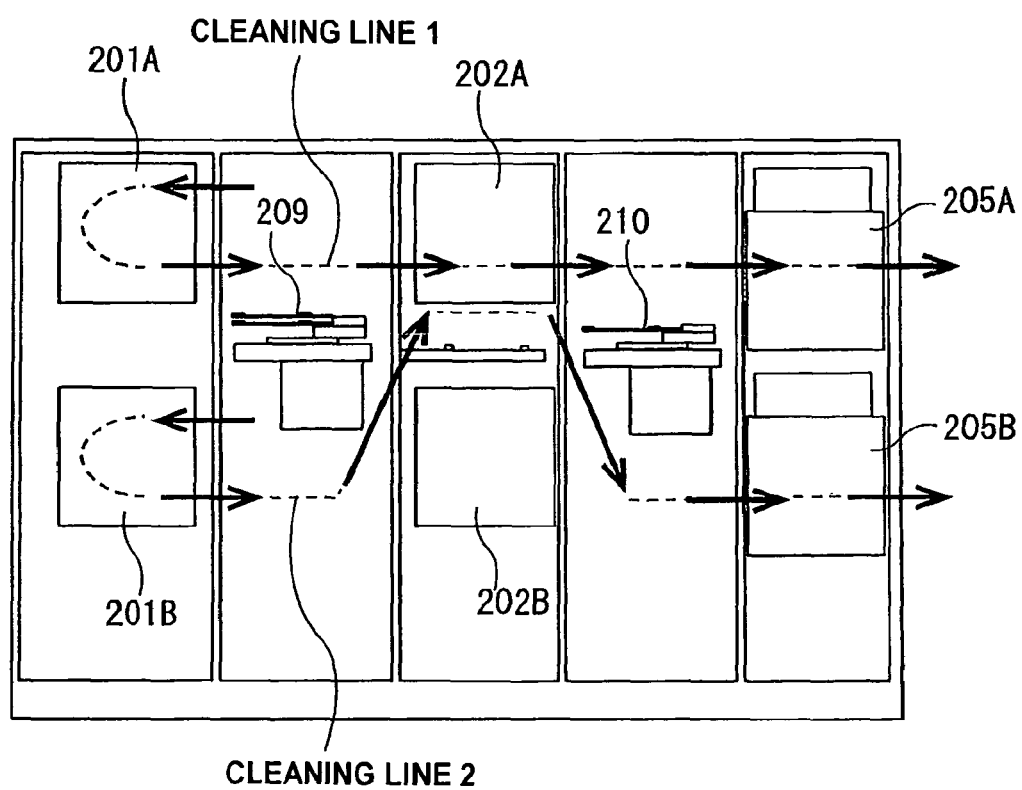
FIG. 31 is a schematic view showing an example of the cleaning line.

When only primary cleaning is necessitated, a wafer may be transferred via the first transfer robot 209, the upper primary cleaning module 201A, the first transfer robot 209, the temporary base 203, the second transfer robot 210, and the upper drying module 205A in this order as shown in FIG. 30, so that secondary cleaning in the second cleaning chamber 192 can be omitted. Further, as shown in FIG. 31, in a case of a failure in the lower primary cleaning module 201B, for example, the wafer can be transferred to the upper secondary cleaning module 202A. In this manner, the first transfer robot 209 and the second transfer robot 210 can sort incoming wafers into predetermined cleaning lines as needed. Selection of the cleaning lines is determined by the controller 5.

Each of the cleaning modules 201A, 201B, 202A, and 202B has a detector (not shown in the drawing) for detecting a failure thereof. When a failure occurs in any of the cleaning modules 201A, 201B, 202A, and 202B, the detector detects the failure, and sends a signal to the controller 5. The controller 5 selects a cleaning line that bypasses the broken cleaning module, and switches a current cleaning line to a newly-selected cleaning line. While two primary cleaning modules and two secondary cleaning modules are provided in this embodiment, the present invention is not limited to this arrangement. For example, three or more primary cleaning modules and/or three or more secondary cleaning modules may be provided.

A temporary base may be provided in the first cleaning chamber 190. For example, as with the temporary base 203, it is possible to install a temporary base between the upper primary cleaning module 201A and the lower primary cleaning module 201B. When one or some of the cleaning modules break down, two wafers can be transferred to the temporary base 180 (see FIG. 28A) and the temporary base in the first cleaning chamber 190.

A concentration of the cleaning liquid to be used in the primary cleaning modules 201A and 201B may differ from a concentration of the cleaning liquid to be used in the secondary cleaning modules 202A and 202B. For example, the concentration of the cleaning liquid to be used in the primary cleaning modules 201A and 201B may be higher than the concentration of the cleaning liquid to be used in the secondary cleaning modules 202A and 202B. Generally, a cleaning effect is considered to be substantially proportional to the concentration of the cleaning liquid and a cleaning time. Therefore, by using the cleaning liquid with a high concentration in the primary cleaning operation, a primary cleaning time and a secondary cleaning time can be equalized, even when a wafer is badly stained.

In this embodiment, the primary cleaning modules 201A and 201B and the secondary cleaning modules 202A and 202B are a roll-sponge-type cleaning machine. The primary cleaning modules 201A and 201B and the secondary cleaning modules 202A and 202B have the same structure. Thus, only the primary cleaning module 201A will be described below.

Figure 32:
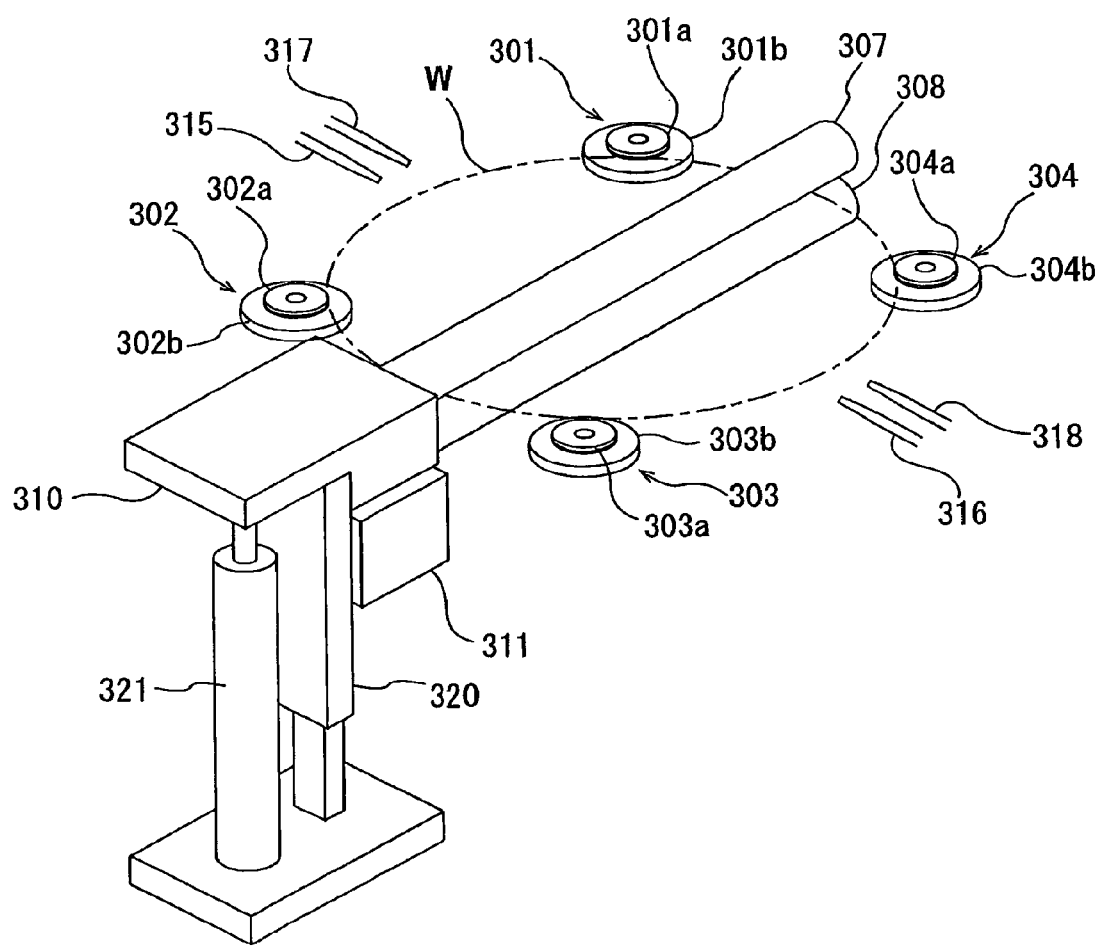
FIG. 32 is a perspective view showing a primary cleaning module.

FIG. 32 is a perspective view showing the primary cleaning module 201A. As shown in FIG. 32, the primary cleaning module 201A has four rollers 301, 302, 303, and 304 configured hold and rotate the wafer W, roll sponges (cleaning tools) 307 and 308 arranged to be brought into contact with upper and lower surfaces of the wafer W, rotating mechanisms 310 and 311 configured to rotate the roll sponges 307 and 308, cleaning-liquid supply nozzles 315 and 316 configured to supply a cleaning liquid (e.g., pure water) onto the upper and lower surfaces of the wafer W, and etching-liquid supply nozzles 317 and 318 configured to supply an etching liquid (e.g., a chemical liquid) onto the upper and lower surfaces of the wafer W. The rollers 301, 302, 303, and 304 are moved closer to and away from each other by non-illustrated actuators (e.g., pneumatic cylinders).

The rotating mechanism 310 for rotating the upper roll sponge 307 is mounted on a guide rail 320 configured to guide a vertical movement of the rotating mechanism 310. Further, the rotating mechanism 310 is supported by an elevating mechanism 321, so that the rotating mechanism 310 and the upper roll sponge 307 can be moved in the vertical direction by the elevating mechanism 321. Although not shown in the drawing, the rotating mechanism 311 for rotating the lower roll sponge 308 is also supported by a guide rail, so that the rotating mechanism 311 and the lower roll sponge 308 can be moved in the vertical direction by an elevating mechanism. A pneumatic cylinder or a motor drive mechanism using a ball screw may be used as the elevating mechanisms.

When the wafer W is carried in and out the primary cleaning module 201A, the roll sponges 307 and 308 are located away from each other. When cleaning the wafer W, the roll sponges 307 and 308 are moved closer to each other to contact the upper and lower surfaces of the wafer W. Forces of the roll sponges 307 and 308 pressing the upper and lower surfaces of the wafer W are controlled by the elevating mechanism 321 and the non-illustrated elevating mechanism. The upper roll sponge 307 and the rotating mechanism 310 are supported by the elevating mechanism 321 from below. Therefore, the pressing force of the upper roll sponge 307 against the upper surface of the wafer W can be adjusted from 0 [N].

The roller 301 has a two-stage structure comprising a holding portion 301a and a shoulder (supporting portion) 301b. The shoulder 301b has a diameter larger than a diameter of the holding portion 301a. The holding portion 301a is formed on the shoulder 301b. The rollers 302, 303, and 304 have the same structure as the roller 301. The wafer W is carried into the primary cleaning module 201A by the lower arm of the first transfer robot 209, and is placed onto the shoulders 301b, 302b, 303b, and 304b. Then, the rollers 301, 302, 303, and 304 are moved toward the wafer W to bring the holding portions 301a, 302a, 303a, and 304a into contact with the wafer W, whereby the wafer W is held by the holding portions 301a, 302a, 303a, and 304a. At least one of the four rollers 301, 302, 303, and 304 is rotated by a rotating mechanism (not shown in the drawing), whereby the wafer W is rotated with its periphery held by the rollers 301, 302, 303, and 304. The shoulders 301b, 302b, 303b, and 304b comprise tapered surfaces with downward gradient. With this configuration, the wafer W is kept out of contact with the shoulders 301b, 302b, 303b, and 304b when the wafer W is held by the holding portions 301a, 302a, 303a, and 304a.

Cleaning operation is performed as follows. First, the wafer W is held by the rollers 301, 302, 303, and 304, and rotated. Subsequently, the cleaning liquid is supplied from the cleaning-liquid supply nozzles 315 and 316 onto the upper surface and the lower surface of the wafer W. Then, the roll sponges 307 and 308 are rotated about their own axes and brought into sliding contact with the upper and lower surfaces of the wafer W to thereby scrub the upper and lower surfaces of the wafer W. After the scrubbing process, the roll sponge 307 is moved upward and the roll sponge 308 is moved downward. Then, the etching liquid is supplied from the chemical-liquid supply nozzles 317 and 318 onto the upper surface and the lower surface of the wafer W to perform etching (chemical cleaning) of the upper and lower surfaces of the wafer W.

The upper primary cleaning module 201A, the lower primary cleaning module 201B, the upper secondary cleaning module 202A, and the lower secondary cleaning module 202B may be of the same type or may be of different types. For example, the primary cleaning modules 201A and 201B may be the above-described cleaning machine having a pair of roll sponges for scrubbing the upper and lower surfaces of the wafer, and the secondary cleaning modules 202A and 202B may be cleaning machine of a pencil-sponge type or two-fluid-jet type. The two-fluid-jet-type cleaning machine is configured to produce a mixture of an $N_2$ gas and pure water (DIW), containing a small amount of $CO_2$ gas (carbon dioxide gas) dissolved therein, and eject the mixture of the $N_2$ gas and the pure water onto the surface of the wafer. This type of cleaning machine can remove fine particles on the wafer by fine droplets and impact energy. In particular, wafer cleaning with no damage can be realized by appropriately adjusting a flow rate of the $N_2$ gas and a flow rate of the pure water. Further, use of the pure water containing the carbon dioxide gas therein can prevent corrosion of the wafer that could be caused by static electricity.

Figure 33:
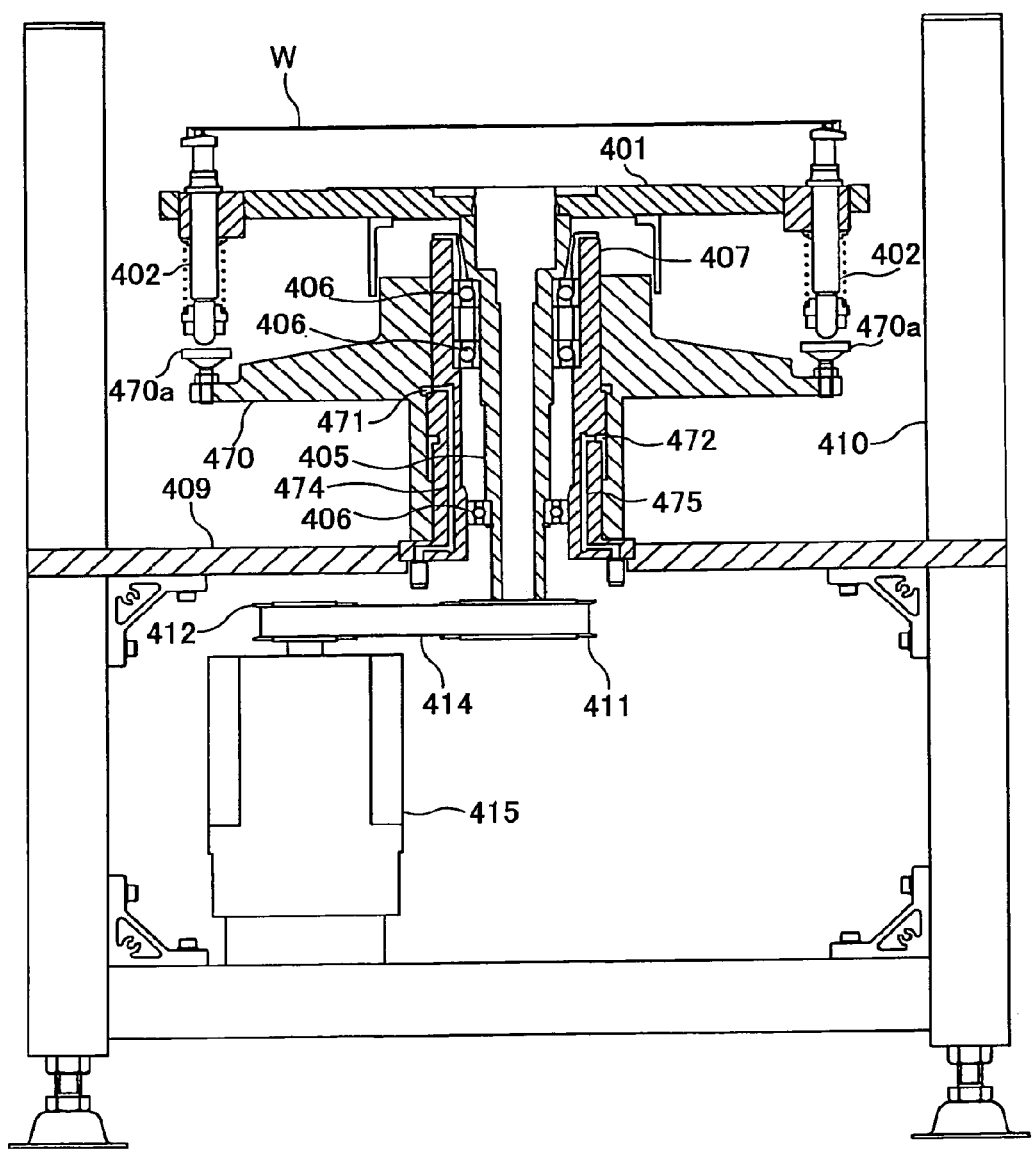
FIG. 33 is a vertical cross-sectional view showing a substrate holding mechanism.
Figure 34:
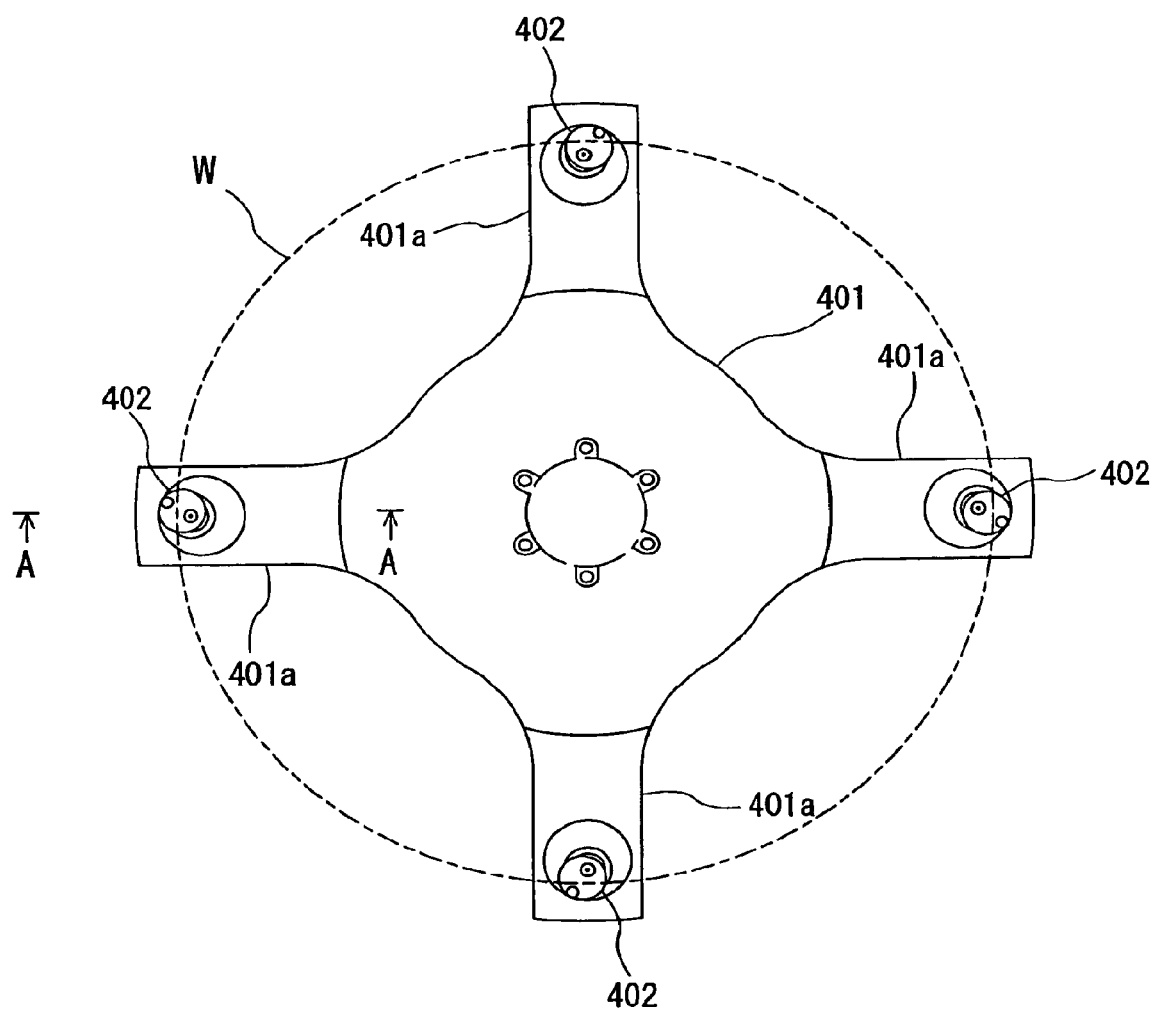
FIG. 34 is a plan view showing the substrate holding mechanism.

Each of the drying modules 205A and 205B has a substrate holding mechanism for holding and rotating a wafer, and is configured to dry the wafer while rotating the wafer by the substrate holding mechanism. Next, the substrate holding mechanism will be described. FIG. 33 is a vertical cross-sectional view showing the substrate holding mechanism, and FIG. 34 is a plan view showing the substrate holding mechanism. As shown in FIG. 33 and FIG. 34, the substrate holding mechanism includes a base 401 having four arms 401a, and four cylindrical substrate-support members 402 which are vertically movably supported by tip ends of the arms 401a. The base 401 is secured to an upper end of a rotational shaft 405, which is rotatably supported by bearings 406. These bearings 406 are secured to an inner surface of a cylindrical member 407 which is in parallel with the rotational shaft 405. A lower end of the cylindrical member 407 is mounted on a mount base 409 and is fixed in position. The mount base 409 is secured to a frame 410. The rotational shaft 405 is coupled to a motor 415 via pulleys 411 and 412 and a belt 414, so that the base 401 is rotated about its own axis by the motor 415.

Figure 35:
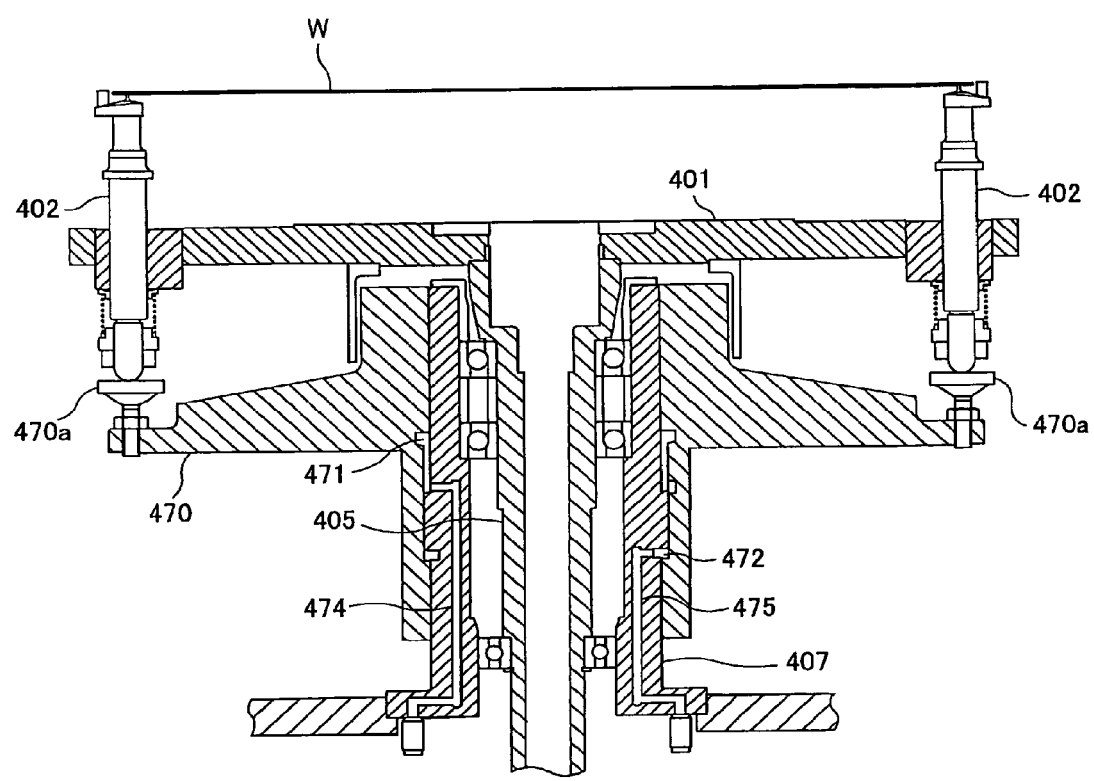
FIG. 35 is a vertical cross-sectional view showing the substrate holding mechanism when a lifting mechanism is elevated.

A lifting mechanism 470 for elevating the substrate-support members 402 is provided around the cylindrical member 407. This lifting mechanism 470 is configured to be able to slide in the vertical direction relative to the cylindrical member 407. The lifting mechanism 470 includes contact plates 470a arranged to be brought into contact with lower ends of the substrate-support members 402. A first gas chamber 471 and a second gas chamber 472 are formed between an outer circumferential surface of the cylindrical member 407 and an inner circumferential surface of the lifting mechanism 470. The first gas chamber 471 and the second gas chamber 472 are in fluid communication with a first gas passage 474 and a second gas passage 475, respectively. The first gas passage 474 and the second gas passage 475 have their ends which are coupled to a pressurized-gas supply source (not shown in the drawing). When pressure in the first gas chamber 471 is increased higher than pressure in the second gas chamber 472, the lifting mechanism 470 is elevated, as shown in FIG. 35. On the other hand, when pressure in the second gas chamber 472 is increased higher than pressure in the first gas chamber 471, the lifting mechanism 470 is lowered, as shown in FIG. 33.

Figure 36A:
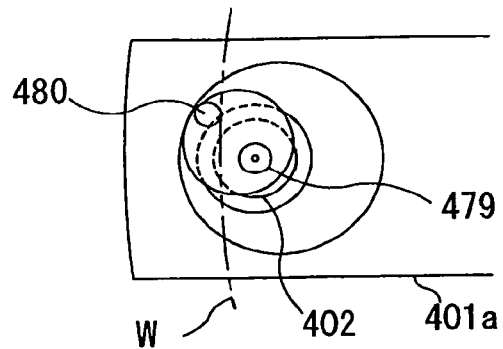
FIG. 36A is a plan view showing part of a substrate-support member and an arm shown in FIG. 34.
Figure 36B:
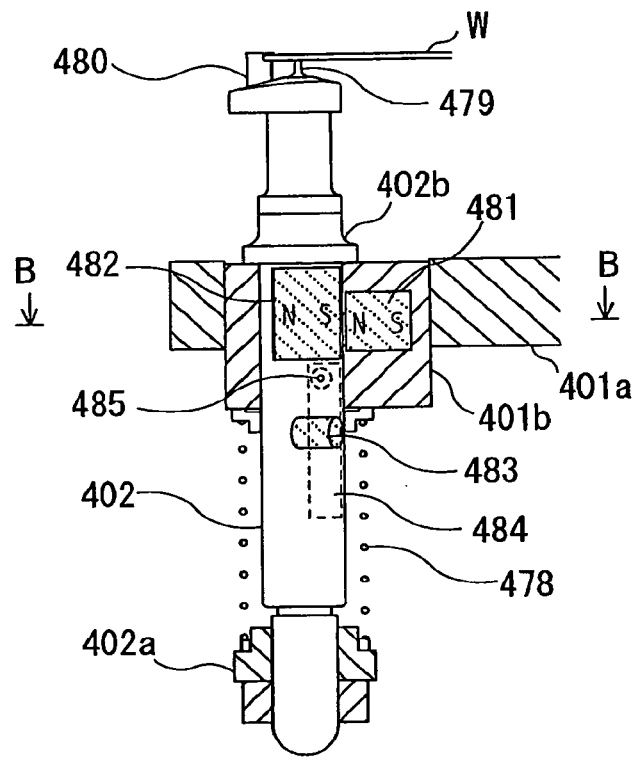
FIG. 36B is a cross-sectional view taken along line A-A shown in FIG. 34.
Figure 36C:
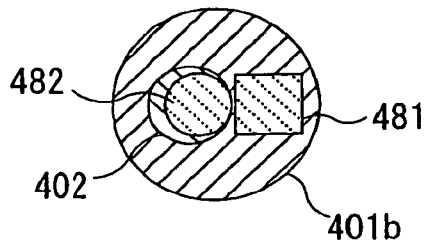
FIG. 36C is a cross-sectional view taken along line B-B shown in FIG. 36B.

FIG. 36A is a plan view showing part of the substrate-support member 402 and the arm 401a shown in FIG. 34, FIG. 36B is a cross-sectional view taken along line A-A shown in FIG. 34, and FIG. 36C is a cross-sectional view taken along line B-B shown in FIG. 36B. The arm 401a of the base 401 has a holder 401b configured to slidably hold the substrate-support member 402. This holder 401b may be formed integrally with the arm 401a. A vertically-extending through-hole is formed in the holder 401b, and the substrate-support member 402 is inserted in this through-hole. The through-hole has a diameter slightly larger than a diameter of the substrate-support member 402. Therefore, the substrate-support member 402 is movable in the vertical direction relative to the base 401, and the substrate-support member 402 is rotatable about its own axis.

A spring support 402a is attached to a lower portion of the substrate-support member 402. A spring 478 is disposed around the substrate-support member 402, and the spring 478 is supported by the spring support 402a. An upper end of the spring 478 presses the holder 401b (which is part of the base 401). Therefore, the spring 478 exerts a downward force on the substrate-support member 402. A stopper 402b is formed on a circumferential surface of the substrate-support member 402. This stopper 402b has a diameter larger than the diameter of the through-hole. Therefore, a downward movement of the substrate-support member 402 is limited by the stopper 402b, as shown in FIG. 36B.

A support pin 479 on which the wafer W is to be placed and a cylindrical clamp 480 as a substrate holding portion to be brought into contact with the periphery of the wafer W are provided on an upper end of the substrate-support member 402. The support pin 479 is arranged on the axis of the substrate-support member 402. On the other hand, the clamp 480 is arranged away from the axis of the substrate-support member 402. Therefore, as the substrate-support member 402 rotates, the clamp 480 makes revolutions around the axis of the substrate-support member 402. In order to prevent electrostatic charge, wafer-contacting portions are preferably made from a conductive material (preferably iron, aluminum, SUS) or carbon resin (e.g., PEEK or PVC).

A first magnet 481 is attached to the holder 401b of the base 401 so as to face a side surface of the substrate-support member 402. On the other hand, a second magnet 482 and a third magnet 483 are provided in the substrate-support member 402. The second magnet 482 and the third magnet 483 are arranged away from each other in the vertical direction. Neodymium magnet is preferably used as the first, second, and third magnets 481, 482, and 483.

Figure 37:
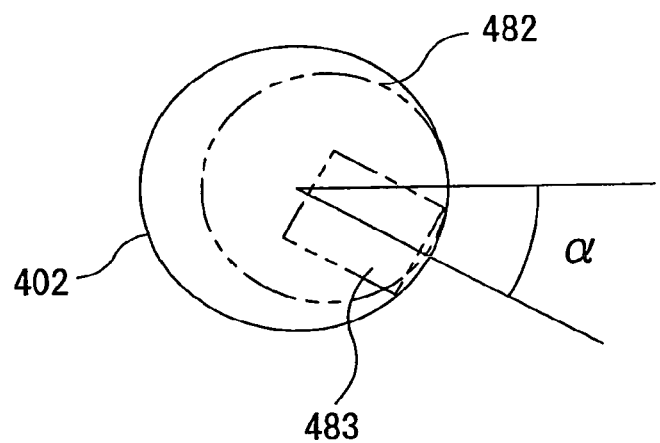
FIG. 37 is a schematic view showing an arrangement of a second magnet and a third magnet.

FIG. 37 is a schematic view showing an arrangement of the second magnet 482 and the third magnet 483, as viewed from the axial direction of the substrate-support member 402. As shown in FIG. 37, the second magnet 482 and the third magnet 483 are arranged in different positions with respect to the circumferential direction of the substrate-support member 402. Specifically, a line connecting the second magnet 482 and the center of the substrate-support member 402 and a line connecting the third magnet 483 and the center of the substrate-support member 402 cross at a predetermined angle of .alpha.

When the substrate-support member 402 is in the lowered position as shown in FIG. 36B, the first magnet 481 and the second magnet 482 face each other. At this time, an attractive force acts between the first magnet 481 and the second magnet 482. This attractive force generates a force of rotating the substrate-support member 402 about its own axis in a direction such that the clamp 480 presses the periphery of the wafer W. Accordingly, the lowered position shown in FIG. 36B is a clamp position in which the wafer W is held (clamped).

It is not necessary that the first magnet 481 and the second magnet 482 always face each other when holding the wafer W, as long as they are close enough to produce a sufficient holding force. For example, even when the first magnet 481 and the second magnet 482 tilt with respect to each other, the magnet force is produced between these magnets, as long as they are close to each other. Therefore, it is not necessary that the first magnet 481 and the second magnet 482 always face each other when holding the wafer W, as long as the magnet force is large enough to rotate the substrate-support member 402 to hold the wafer W.

Figure 38A:
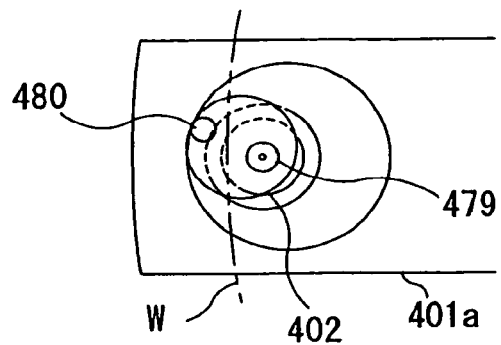
FIG. 38A is a plan view showing part of the substrate-support member and the arm when the substrate-support member is elevated by the lifting mechanism.
Figure 38B:
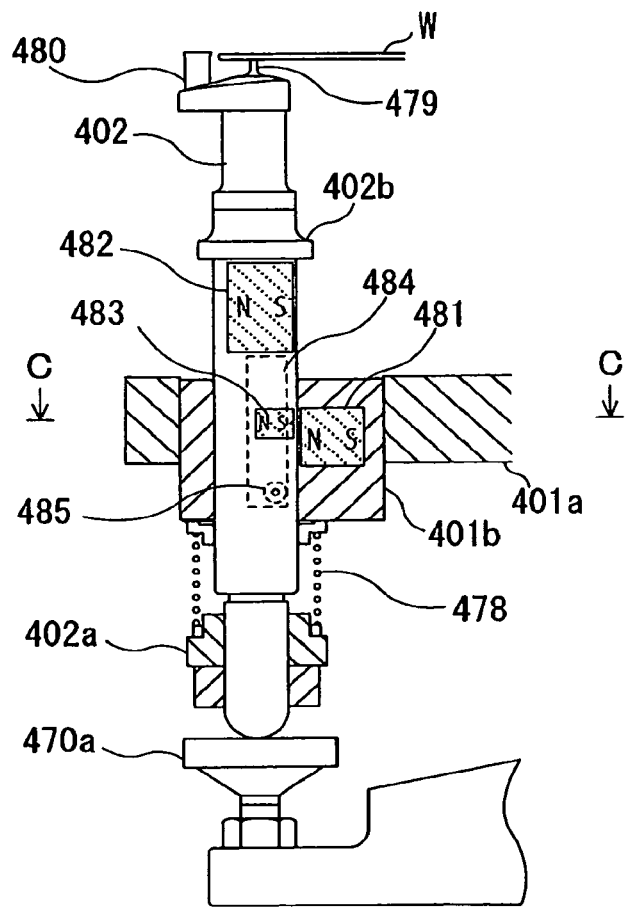
FIG. 38B is a cross-sectional view taken along line A-A shown in FIG. 34 when the substrate-support member is elevated by the lifting mechanism.
Figure 38C:
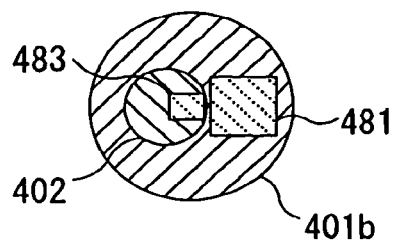
FIG. 38C is a cross-sectional view taken along line C-C shown in FIG. 38B.

FIG. 38A is a plan view showing part of the substrate-support member 402 and the arm 401a when the substrate-support member 402 is elevated by the lifting mechanism 470, and FIG. 38B is a cross-sectional view taken along line A-A shown in FIG. 34 when the substrate-support member 402 is elevated by the lifting mechanism 470, and FIG. 38C is a cross-sectional view taken along line C-C shown in FIG. 38B.

When the substrate-support member 402 is elevated by the lifting mechanism 470 to the elevated position as shown in FIG. 38B, the first magnet 481 and the third magnet 483 face each other, and the second magnet 482 is away from the first magnet 481. At this time, an attractive force acts between the first magnet 481 and the third magnet 483. This attractive force generates a force of rotating the substrate-support member 402 about its own axis in a direction such that the clamp 480 moves away from the wafer W. Accordingly, the elevated position shown in FIG. 38B is an unclamp position in which the wafer W is released (unclamped). In this case also, it is not necessary that the first magnet 481 and the third magnet 483 always face each other when releasing the wafer W, as long as they are close enough to produce a sufficient force (magnet force) of rotating the substrate-support member 402 in a direction such that the clamp 480 is moved away from the wafer W.

Because the second magnet 482 and the third magnet 483 are arranged in different positions with respect to the circumferential direction of the substrate-support member 402, the rotating force acts on the substrate-support member 402 as the substrate-support member 402 moves up and down. This rotating force provides the clamp 480 with a force of holding the wafer W and a force of releasing the wafer W. Therefore, just by moving the substrate-support member 402 vertically, the clamp 480 can hold and release the wafer W. In this manner, the first magnet 481, the second magnet 482, and the third magnet 483 functions as a holding mechanism (rotating mechanism) for rotating the substrate-support member 402 about its own axis to cause the clamp 480 to hold the wafer W. This holding mechanism (rotating mechanism) is operated by the vertical movements of the substrate-support member 402.

The contact plates 470a of the lifting mechanism 470 are located below the substrate-support members 402. When the contact plates 470a move upward, upper surfaces of the contact plates 470a are brought into contact with the lower ends of the substrate-support members 402, and the substrate-support members 402 are elevated by the contact plates 470a against the pressing forces of the springs 478. The upper surface of each contact plate 470a is a flat surface, and on the other hand, the lower end of each substrate-support member 402 is in the shape of hemisphere. In this embodiment, the lifting mechanism 470 and the springs 478 constitute a drive mechanism for moving the substrate-support members 402 in the vertical direction. It is to be noted that the drive mechanism is not limited to this embodiment. For example, a servomotor may be used as the drive mechanism.

Figure 39A:
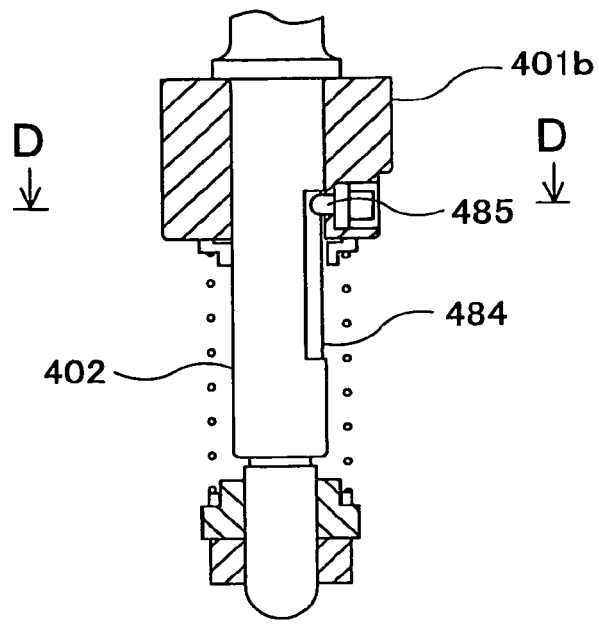
FIG. 39A is a side view showing the substrate-support member in a clamp position as viewed from a different angle.
Figure 39B:
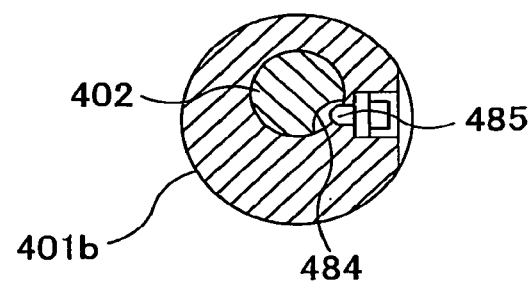
FIG. 39B is a cross-sectional view taken along line D-D shown in FIG. 39A.
Figure 40A:
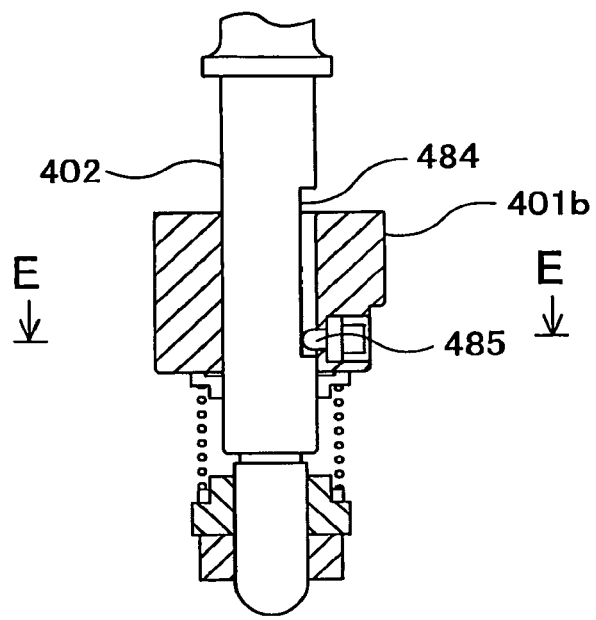
FIG. 40A is a side view showing the substrate-support member in an unclamp position as viewed from a different angle.
Figure 40B:
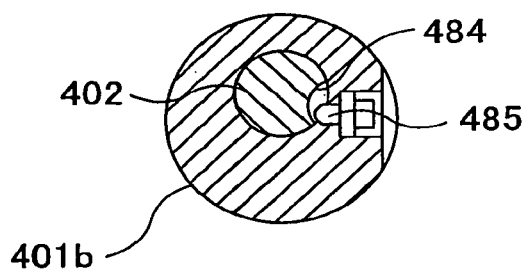
FIG. 40B is a cross-sectional view taken along line E-E shown in FIG. 40A.

FIG. 39A is a side view showing the substrate-support member 402 in the clamp position as viewed from a different angle, and FIG. 39B is a cross-sectional view taken along line D-D shown in FIG. 39A. FIG. 40A is a side view showing the substrate-support member 402 in the unclamp position as viewed from a different angle, and FIG. 40B is a cross-sectional view taken along line E-E shown in FIG. 40A.

A groove 484 is formed on the side surface of each substrate-support member 402. This groove 484 extends along the axis of the substrate-support member 402, and has an arc-shaped horizontal cross section. A protrusion 485 projecting toward the groove 484 is formed on the arm 401a (the holder 401b in this embodiment) of the base 401. A tip end of this protrusion 485 lies in the groove 484, and the protrusion 485 roughly engages the groove 484.

The groove 484 and the protrusion 485 are provided for limiting a rotation angle of the substrate-support member 402. More specifically, as shown in FIG. 39B and FIG. 40B, when the substrate-support member 402 rotates between the clamp position and the unclamp position, the protrusion 485 does not contact the groove 484. Therefore, the substrate-support member 402 can freely rotate by the magnetic force acting between the above-described magnets. On the other hand, when the substrate-support member 402 rotates beyond the clamp position and the unclamp position, the protrusion 485 contacts the groove 484 to thereby prevent the substrate-support member 402 from rotating excessively. In this manner, the protrusion 485 and the groove 484 function as a stopper. Therefore, when the substrate-support member 402 moves upward and downward, either of the second magnet 482 or the third magnet 483 is necessarily located adjacent to the first magnet 481.

Next, operations of the above-substrate holding mechanism will be described.

When the substrate holding mechanism is in the unclamp position as shown in FIG. 38B, the wafer W is placed onto the support pins 479 by the transfer robot. Then, the lifting mechanism 470 is lowered. The substrate-support members 402 are lowered by the springs 478 to the clamp position as shown in FIG. 36B. While the substrate-support members 402 are lowered, the second magnets 482 face the first magnets 481, whereby the substrate-support members 402 rotate. The rotation of the substrate-support members 402 brings side surfaces of the clamps 480 into contact with the periphery of the wafer W, whereby the wafer W is held by the clamps 480. A tip end of the support pin 479 has a very small contact area with the wafer W, and similarly the side surface of the clamp 480 has a very small contact area with the wafer W. Therefore, contamination of the wafer W due to contact with other components can be prevented. In order to prevent electrostatic charge, a conductive material (preferably iron, aluminum, SUS) or carbon resin (e.g., PEEK or PVC) is preferably used as the wafer contact portions.

When the motor 415 is set in motion, the wafer W rotates together with the substrate-support members 402. When the rotation is stopped, positioning (or alignment) between the four substrate-support members 402 and the four contact plates 470a of the lifting mechanism 470 is performed. Specifically, the rotation of the base 401 is stopped at a position such that the substrate-support members 402 are located above the contact plates 470a. When the substrate-support members 402 are elevated by the lifting mechanism 470, the substrate-support members 402 are rotated about their own axes to cause the clamps 480 to move away from the wafer W. As a result, the wafer W is released and just placed on the support pins 479. In this state, the wafer W is removed from the substrate holding mechanism by the transfer robot.

Figure 41A:
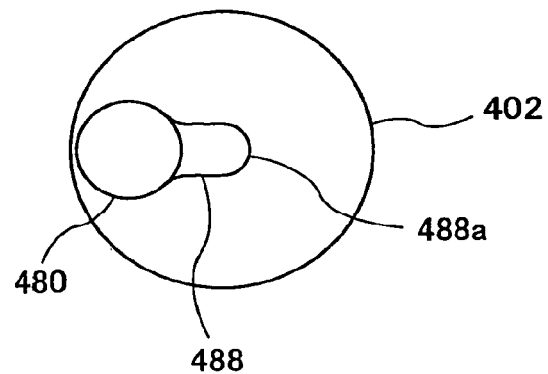
FIG. 41A is an enlarged plan view showing a modified example of the substrate-support member and a clamp.
Figure 41B:
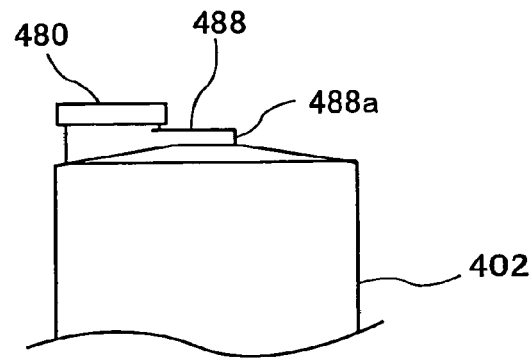
FIG. 41B is a side view showing the substrate-support member and the clamp shown in FIG. 41A.

FIG. 41A is an enlarged plan view showing a modified example of the substrate-support member 402 and the clamp (substrate holding portion) 480, and FIG. 41B is a side view showing the substrate-support member 402 and the clamp 480 shown in FIG. 41A. FIG. 41A and FIG. 41B show only part of the substrate-support member 402.

Cylindrical clamp 480 and a positioning portion 488 are provided on the upper end of substrate-support member 402. The clamp 480 is a substrate holding portion to be brought into contact with the periphery of the wafer W. The positioning portion 488 extends from the clamp 480 to the axis of the substrate-support member 402. One end of the positioning portion 488 is connected integrally to the side surface of the clamp 480, and the other end is located on the axis of the substrate-support member 402. This center-side end of the positioning portion 488 has a side surface 488a curved along a circle which is concentric with the substrate-support member 402. Specifically, a horizontal cross section of the center-side end of the positioning portion 488 is formed by part of the circle that is concentric with the substrate-support member 402. The upper end of the substrate-support member 402 comprises a tapered surface with a downward gradient.

Figure 42A:
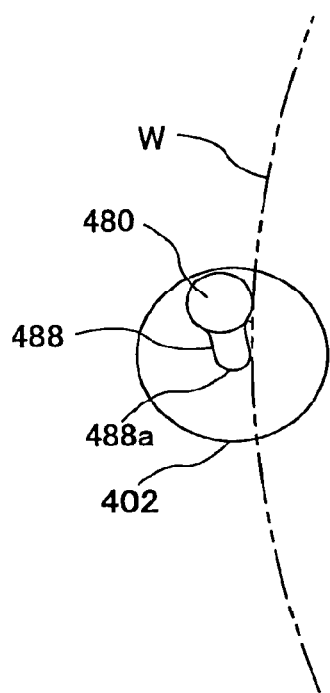
FIG. 42A is a plan view showing a state in which a wafer is clamped.
Figure 42B:
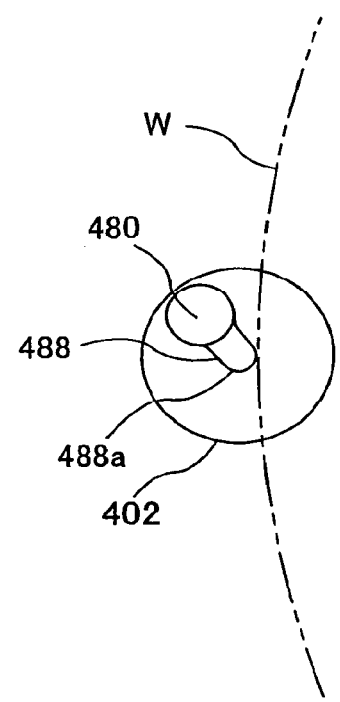
FIG. 42B is a plan view showing a state in which the wafer is unclamped.

FIG. 42A is a plan view showing a state in which the wafer is clamped, and FIG. 42B is a plan view showing a state in which the wafer is unclamped. The wafer W is placed onto the upper ends (i.e., the tapered surfaces) of the substrate-support members 402 and then the substrate-support members 402 are rotated to bring the clamps 480 into contact with the periphery of the wafer W, whereby the wafer W is held by the clamps 480, as shown in FIG. 42A. When the substrate-support members 402 are rotated in the opposite direction, the clamps 480 are moved away from the wafer W as shown in FIG. 42B, whereby the wafer W is released. During the rotation of the substrate-support members 402, the periphery of the wafer W is placed in sliding contact with the side surfaces 488a of the positioning portions 488. The side surfaces 488a of the positioning portions 488 can prevent displacement of the wafer W during the rotation of the substrate-support members 402. As a result, the subsequent wafer transferring operations can be performed stably.

Figure 43A:
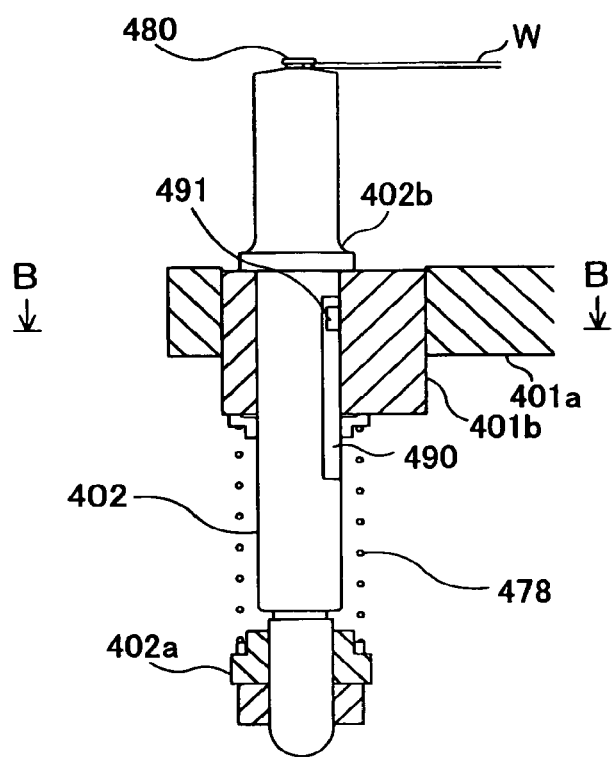
FIG. 43A is a cross-sectional view showing a modified example of part of the substrate holding mechanism.
Figure 43B:
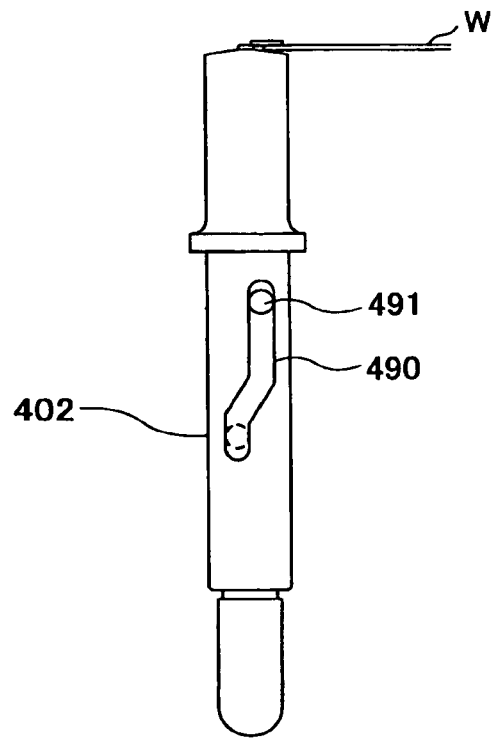
FIG. 43B is a side view showing a substrate-support member shown in FIG. 43A.

FIG. 43A is a cross-sectional view showing a modified example of part of the substrate holding mechanism, and FIG. 43B is a side view showing a substrate-support member. Configurations and operations of this modified example, except for the following configurations which will be described below, are identical to those of the above-described substrate holding mechanism, and will not be described repetitively.

A helical groove 490 is formed on a side surface of substrate-support member 402. This helical groove 490 has a portion slightly inclined with respect to the axis of the substrate-support member 402. The helical groove 490 has an upper portion and a lower portion extending parallel to the axis of the substrate-support member 402. A pin 491, which roughly engages the helical groove 490, is provided on the holder 401b. With this configuration, as the substrate-support member 402 moves upward and downward, the substrate-support member 402 rotates about its own axis through a predetermined angle due to the engagement of the helical groove 490 and the pin 491. The rotation of the substrate-support member 402 causes the clamp 480 to contact or move away from the periphery of the wafer W. Therefore, in this example, the helical groove 490 and the pin 491 functions as a holding mechanism (rotating mechanism) for rotating the substrate-support member 402 about its own axis to cause the clamp 480 to hold the wafer W. This holding mechanism (rotating mechanism) is operated by the vertical movements of the substrate-support member 402.

Figure 44:
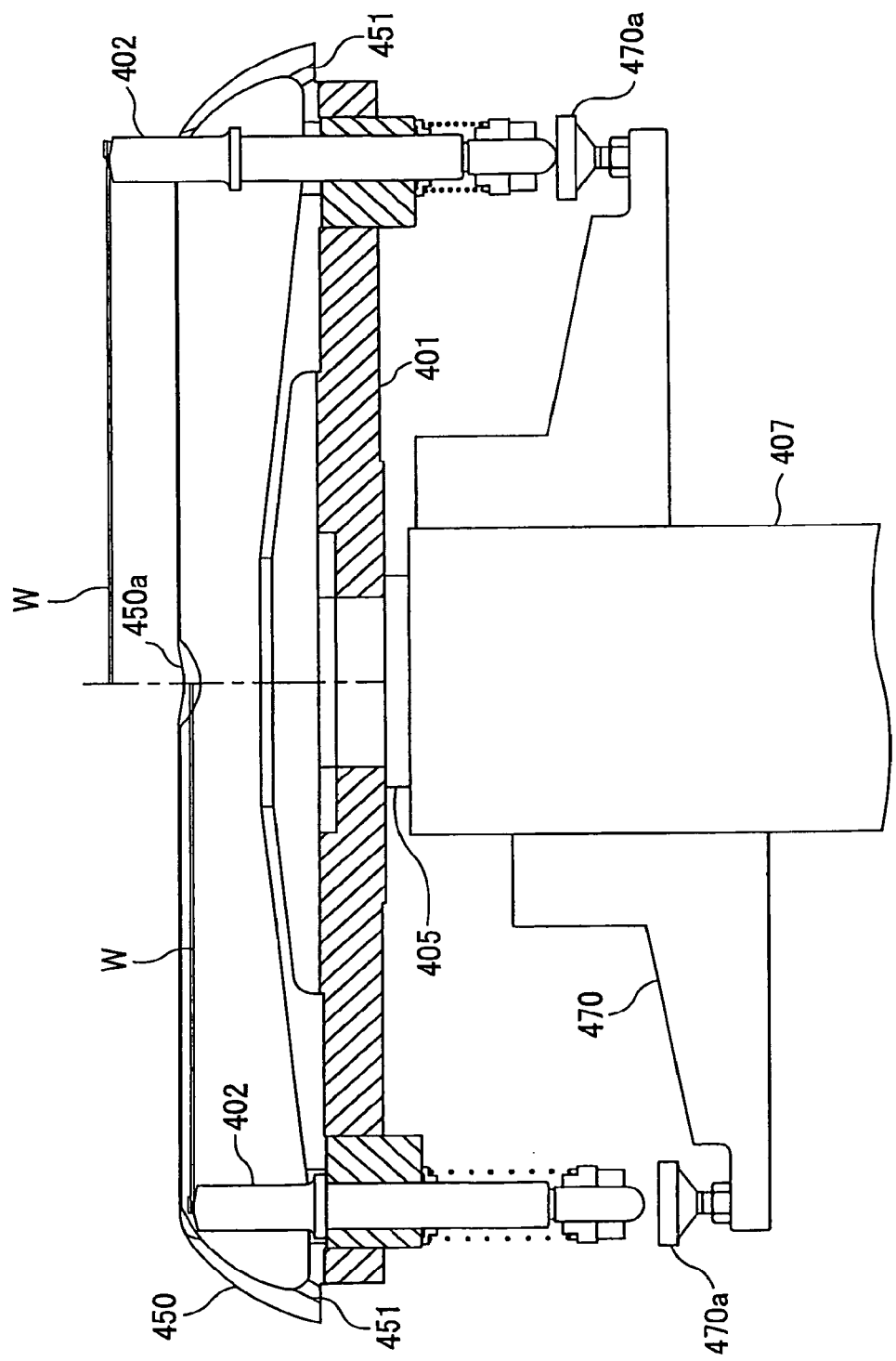
FIG. 44 is a vertical cross-sectional view showing an example in which a spin cover is attached to the substrate holding mechanism.

FIG. 44 is a vertical cross-sectional view showing an example in which a spin cover 450 is attached to the substrate holding mechanism. A left half of FIG. 44 shows a state in which the wafer is clamped, and a right half shows a state in which the wafer is unclamped. In FIG. 44, the rotational shaft 405, the cylindrical member 407, the lifting mechanism 470, and other elements are illustrated schematically, but the detailed structures thereof are as shown in FIG. 33. In FIG. 44, a vertical cross section of the spin cover 450 is illustrated.

As shown in FIG. 44, the spin cover 450 is secured to an upper surface of the base 401 and is arranged so as to surround the wafer W. The spin cover 450 has the vertical cross section that is inclined radially inwardly. An upper end of the spin cover 450 lies in close proximity to the wafer W, and an inside diameter of the upper end of the spin cover 450 is slightly larger than the diameter of the wafer W. The upper end of the spin cover 450 has notches 450a each shaped along the circumferential surface of the substrate-support member 402. The notches 450a are located in positions corresponding to the substrate-support members 402. Drain holes 451, which extend obliquely, are formed in a bottom of the spin cover 450.

The substrate holding mechanism with the spin cover 450 attached thereto is suitable for use in a substrate cleaning apparatus and a substrate drying apparatus using a liquid. For example, the above-described substrate holding mechanism can be used in a substrate cleaning apparatus for cleaning a wafer by supplying a cleaning liquid onto an upper surface of the wafer. The cleaning liquid (e.g., pure water), supplied to the upper surface of the wafer, is spun off from the periphery of the wafer by the centrifugal force, and is captured by an inner circumferential surface of the spin cover 450 that is in rotation at the same speed as the wafer. Because the inner circumferential surface of the spin cover 450 is inclined, the cleaning liquid is forced to flow downward by the centrifugal force, and then expelled downward through the drain holes 451 of the spin cover 450. In this manner, because the spin cover 450 and the wafer rotate in unison, the liquid hardly bounces back onto the wafer. Therefore, production of watermarks on the wafer can be prevented. In the wafer cleaning operation using the substrate holding mechanism shown in FIG. 44, the clamps 480 on the substrate-support members 402 press the wafer W to hold the wafer W, the cleaning liquid is supplied onto the wafer W to clean the wafer W while rotating the wafer W, and the substrate-support members 402 are elevated to cause the clamp 480 to move away from the wafer W. A series of these operations can be performed by the vertical movement of the substrate-support members 402 without exerting a mechanical adverse influence on the wafer W during cleaning of the wafer.

The above-described substrate holding mechanism can be used in various types of processing apparatus, in addition to the substrate cleaning apparatus. For example, the substrate holding mechanism shown in FIG. 44 can be used in a drying apparatus of Rotagoni type. The Rotagoni drying method is a method of drying a surface of a wafer by supplying an IPA vapor (a mixture of isopropyl alcohol and an $N_2$ gas) and pure water from two parallel nozzles to the surface of the rotating wafer while moving the two nozzles along a radial direction of the wafer. This Rotagoni drying method has recently been drawing attention as a drying method capable of preventing the production of the water marks on the surface of the wafer. In the wafer drying operation using the substrate holding mechanism shown in FIG. 44, the clamps 480 on the substrate-support members 402 press the wafer W to hold the wafer W, the IPA vapor is supplied onto the wafer W to dry the wafer W while rotating the wafer W, and the substrate-support members 402 are elevated to cause the clamp 480 to move away from the wafer W. A series of these operations can be performed by the vertical movement of the substrate-support members 402 without exerting a mechanical adverse influence on the wafer W during drying of the wafer. Further, an effect of the droplets scattered by the centrifugal force can be reduced during drying.

The above-described substrate holding mechanism is configured such that all of the four substrate-support members 402 are rotated to produce the substrate holding force. Alternatively, two of the four substrate-support members 402 may be only movable in the vertical direction and may not be rotatable about their own axes. In this case, the non-rotatable two substrate-support members can be used in positioning of the wafer. The number of substrate-support members may be three, or five or more. In a case of providing three substrate-support members, the above-described rotating mechanism (magnets or helical groove) may be provided only on one of the three substrate-support members.

Further, while the first magnet 481 is attached to the base 401 and the second magnet 482 and the third magnet 483 are attached to the substrate-support member 402 in the above embodiment, the present invention is not limited to this arrangement. For example, the first magnet 481 may be attached to the substrate-support member 402, and the second magnet 482 and the third magnet 483 may be attached to the base 401.

Figure 45:
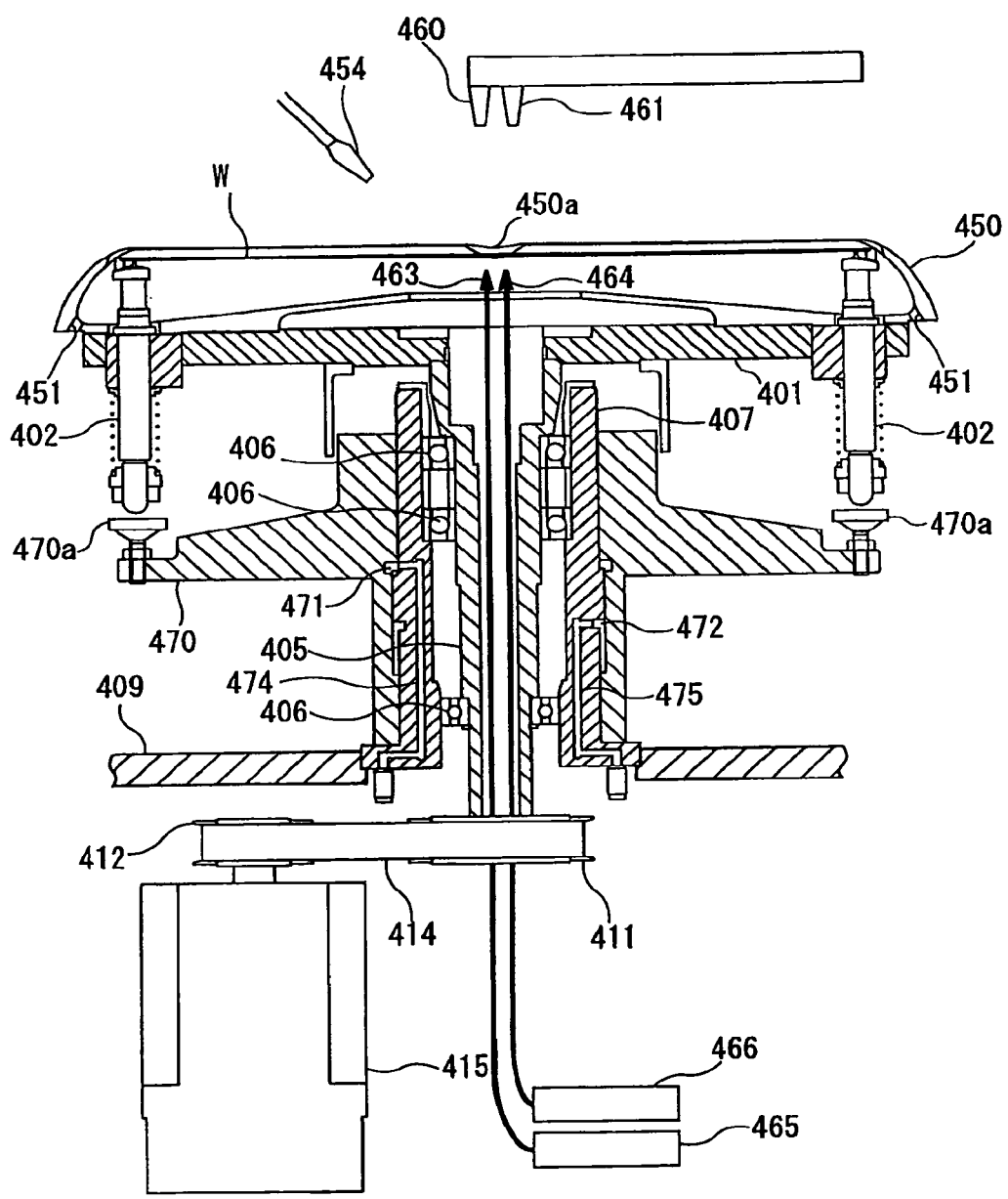
FIG. 45 is a vertical cross-sectional view showing an upper drying module.
Figure 46:
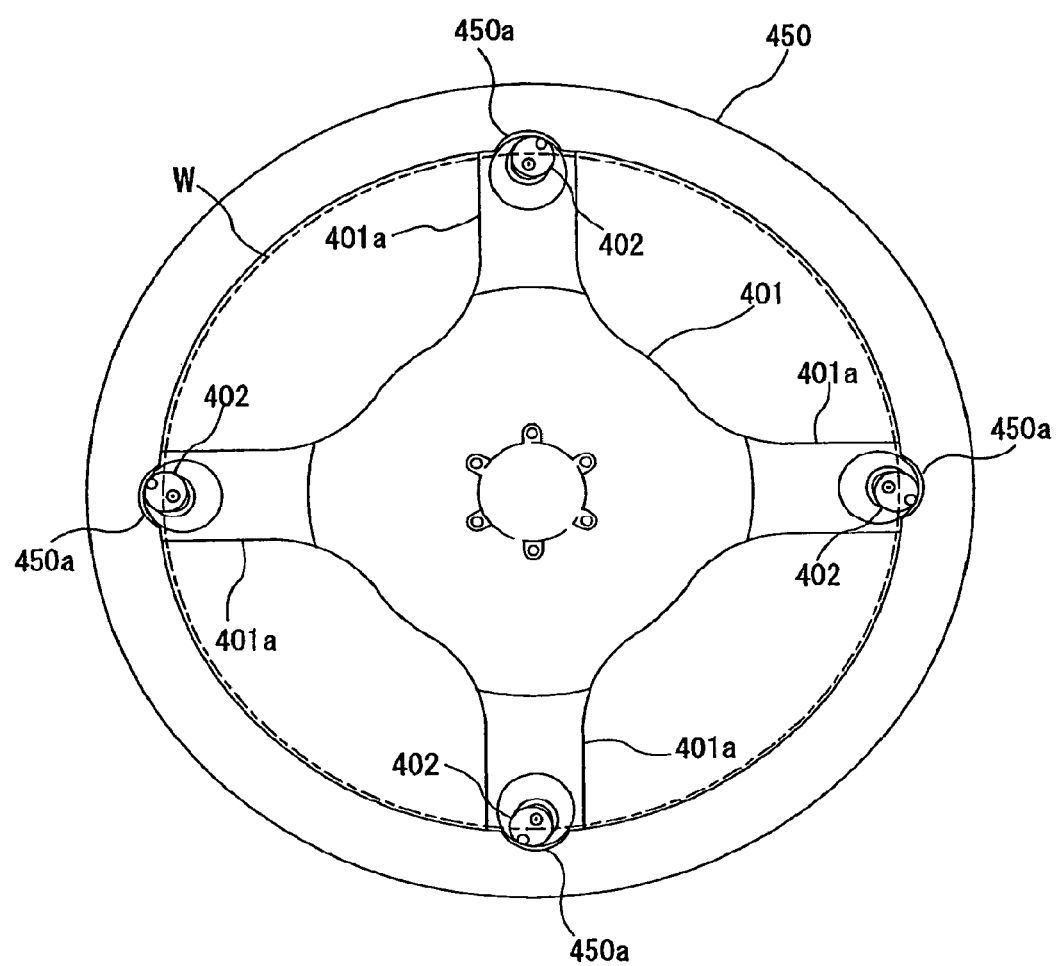
FIG. 46 is a plan view showing the upper drying module.

Next, the details of the upper drying module 205A and the lower drying module 205B each including the above-described substrate holding mechanism will be described. The upper drying module 205A and the lower drying module 205B are a drying machine that performs the Rotagoni drying operation. Since the upper drying module 205A and the lower drying module 205B have the same structure, the upper drying module 205A will be described below. FIG. 45 is a vertical cross-sectional view showing the upper drying module 205A, and FIG. 46 is a plan view showing the upper drying module 205A.

A front nozzle 454 for supplying pure water as a cleaning liquid onto the surface (front surface) of the wafer W is arranged above the wafer W. The front nozzle 454 is oriented toward the center of the substrate W. The front nozzle 454 is coupled to a pure water supply source (i.e., a cleaning liquid supply source), not shown in the drawings, and supplies the pure water to the center of the front surface of the wafer W. Other than pure water, a chemical liquid may be used as the cleaning liquid. Two parallel nozzles 460 and 461 for performing Rotagoni drying are disposed above the wafer W. The nozzle 460 is for supplying an IPA vapor (a mixture of isopropyl alcohol and an $N_2$ gas) onto the front surface of the wafer W. The nozzle 461 is for supplying pure water onto the front surface of the wafer W in order to prevent the front surface of the wafer W from being dried. The nozzles 460 and 461 are movable in the radial direction of the wafer W.

The rotational shaft 405 houses therein a back nozzle 463 coupled to a cleaning-liquid supply source 465 and a gas nozzle 464 coupled to a drying-gas supply source 466. The cleaning-liquid supply source 465 stores pure water as a cleaning liquid therein and supplies the pure water through the back nozzle 463 to a rear surface of the wafer W. The drying-gas supply source 466 stores an $N_2$ gas or dry air as a drying gas therein, and supplies the drying gas through the gas nozzle 464 to the rear surface of the wafer W.

Figure 47:
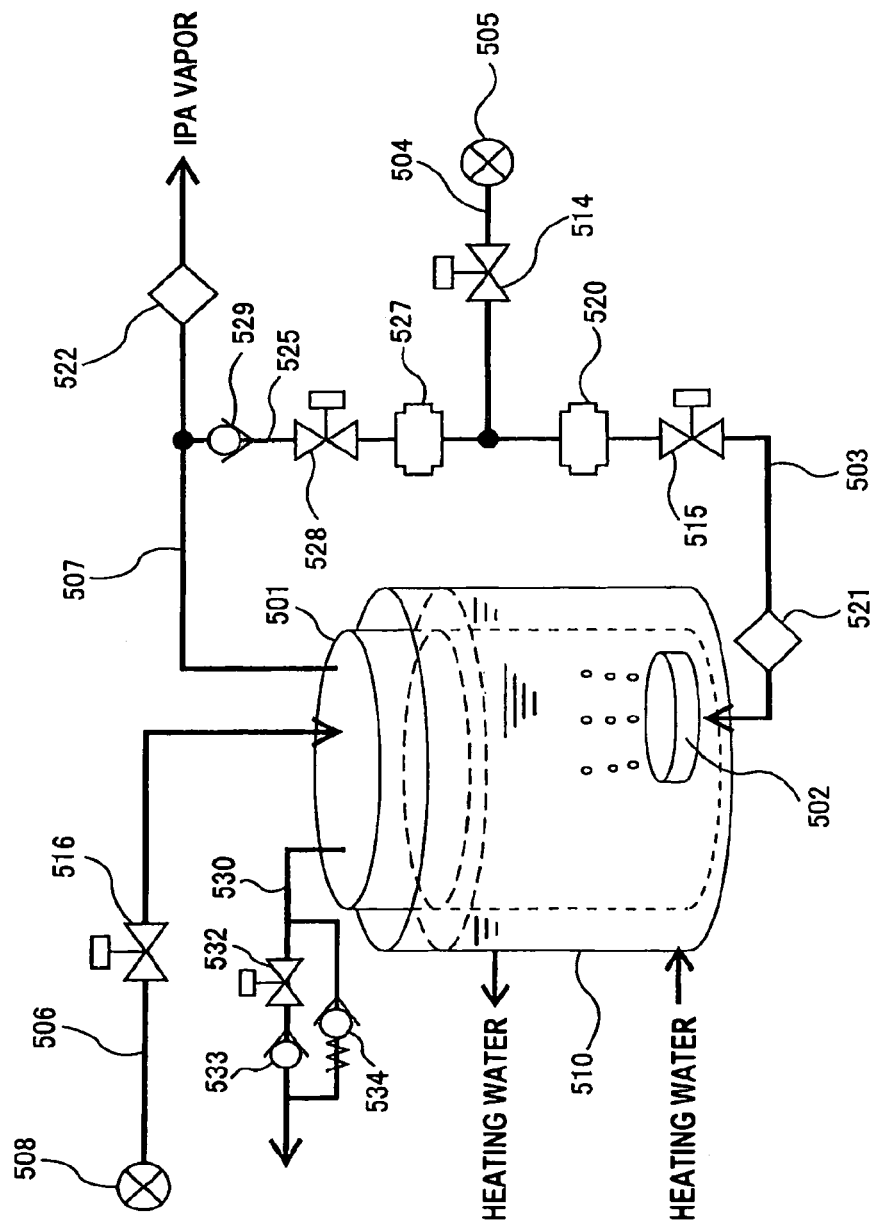
FIG. 47 is an IPA supply unit for supplying an IPA vapor to a nozzle of the drying module.

FIG. 47 is an IPA supply unit for supplying the IPA vapor (a mixture of isopropyl alcohol and the $N_2$ gas) to the nozzle 460. This IPA supply unit is installed in the substrate processing apparatus. As shown in FIG. 47, the IPA supply unit includes a bubbling tank 501 made of metal, such as stainless steel. Inside the bubbling tank 501, a bubbler 502 for creating bubbles of the N₂ gas is installed on a bottom of the bubbling tank 501. This bubbler 502 is coupled to an N₂ gas bubbling line 503, which is coupled to an N₂ gas introduction line 504. This N₂ gas introduction line 504 is coupled to an N₂ gas supply source 505. Regulating valves 514 and 515 are provided on the N₂ gas introduction line 504 and the N₂ gas bubbling line 503.

A mass flow controller 520 and a filter 521 are provided on the N₂ gas bubbling line 503. The N₂ gas is supplied from the N₂ gas supply source 505 to the bubbler 502 via the N₂ gas introduction line 504, the N₂ gas bubbling line 503, and the filter 521. A flow rate of the N₂ gas is kept constant by the mass flow controller 520. The preferable flow rate of the N₂ gas to the bubbler 502 is in the range of about 0 to 10 SLM. The term "SLM" is an abbreviation of "Standard Litter per Minute" and is a unit expressing a flow rate of a gas at a temperature of 0 degree under 1 atm.

An IPA liquid supply line 506 and an IPA vapor delivery line 507 are further coupled to the bubbling tank 501. The IPA vapor delivery line 507 is coupled to the nozzles 460 (see FIG. 45) of the upper drying module 205A and the lower drying module 205B through a filter 522. The IPA liquid supply line 506 is coupled to an IPA supply source 508, which supplies an IPA liquid (isopropyl alcohol) to the bubbling tank 501 through the IPA liquid supply line 506. A liquid-level sensor (not shown in the drawing) is provided in the bubbling tank 501 for detecting a liquid level of the IPA liquid in the bubbling tank 501. A regulating valve 516 is provided on the IPA liquid supply line 506. This regulating valve 516 is operated so as to regulate a flow rate of the IPA liquid to be supplied to the bubbling tank 501 such that an output signal of the liquid-level sensor (i.e., the level of the IPA liquid in the bubbling tank 501) is maintained within a predetermined range. For example, the IPA liquid in the range of 200 mL to 700 mL is stored in the bubbling tank 501.

Generally, when bubbling is continuously performed, a temperature of the IPA liquid in the bubbling tank 501 is lowered due to heat of vaporization of IPA. The drop in the temperature of the IPA liquid causes a decrease in concentration of the IPA vapor, which can result in a failure in stable drying of the wafer. Thus, in order to keep the temperature of the IPA liquid constant, a water jacket 510 is provided around the bubbling tank 501. Heating water is supplied to the water jacket 510 and flows through the water jacket 510, whereby the temperature of the IPA liquid retained in the bubbling tank 501 is kept constant. The heating water flows into the water jacket 510 through an inlet on a lower portion of the water jacket 510 and flows out through an outlet on an upper portion of the water jacket 510. A preferable flow rate of the heating water flowing through the water jacket 510 is in the range of 50 mL/min to 200 mL/min, and a preferable temperature of the heating water is in the range of 22 to 25 degrees. In this embodiment, DIW (ultra pure water) is used as the heating water. However, other medium may be used.

Bubbling of the N₂ gas in the IPA liquid generates the IPA vapor, which is stored in an upper space in the bubbling tank 501. This IPA vapor is delivered to the nozzles 460 (see FIG. 45) of the upper drying module 205A and the lower drying module 205B through the IPA vapor delivery line 507 and the filter 522. By passing the IPA vapor through the filter 522, the IPA vapor to be supplied to the wafer is kept clean. A preferable temperature of the IPA vapor is in the range of 18 to 25 degrees. This temperature range is determined in view of preventing a thermal stress on the wafer.

A preferable concentration of the IPA vapor produced in the bubbling tank 501 is in the range of about 0 to 4 vol %. When the temperature of the heating water itself is increased, the temperature of the IPA liquid in the bubbling tank 501 is increased. As a result, the concentration of the evaporated IPA is increased. Therefore, the concentration of the IPA vapor can be adjusted by the temperature of the heating water. The advantage of using the heating water for heating the IPA liquid is that no electric heat source, such as a heater, is used in the substrate processing apparatus and therefore safety of the substrate processing apparatus can be secured.

An N₂ dilution line 525 is provided as a bypass line coupling the N₂ gas introduction line 504 to the IPA vapor delivery line 507. A mass flow controller 527, a regulating valve 528, and a check valve 529 are provided on the N₂ dilution line 525. The IPA vapor can be diluted with the N₂ gas by directly delivering the N₂ gas to the IPA vapor delivery line 507 through the N₂ dilution line 525. A flow rate of the N₂ gas to be delivered to the IPA vapor delivery line 507 is controlled by the mass flow controller 527.

An IPA relief line 530 is connected to the upper portion of the bubbling tank 501. A regulating valve 532, a check valve 533, and a release valve 534 are provided on the IPA relief line 530. The regulating valve 532 and the release valve 534 are arranged in parallel. When pressure in the bubbling tank 501 exceeds a certain value, the release valve 534 is opened to release the IPA vapor in the bubbling tank 501 into the exterior of the bubbling tank 501. Further, when the bubbling tank 501 is replenished with IPA, the regulating valve 532 is opened to place the interior of the bubbling tank 501 under the atmospheric pressure. The regulating valves 515 and 528 may be shut-off valves. In this case, the flow rate of the N₂ gas is regulated by the mass flow controllers 520 and 527, and on the other hand, the flow of the N₂ gas is shut off by the shut-off valves 515 and 528.

Next, operations of the drying module 205A with the above-described structures will be described.

First, the wafer W and the spin cover 450 are rotated in unison by the motor 415. In this state, the front nozzle 454 and the back nozzle 463 supply the pure water onto the front surface (upper surface) and the rear surface (lower surface) of the wafer W so as to rinse the wafer W in its entirety with the pure water. The pure water, supplied to the wafer W, spreads over the front surface and the rear surface via the centrifugal force, thereby rinsing all the surfaces of the wafer W. The pure water, that is spun off from the rotating wafer W, is captured by the spin cover 450 and flows into the drain holes 451. When the wafer W is rinsed, the two nozzles 460 and 461 are in their given idle positions away from the wafer W.

Then, supply of the pure water from the front nozzle 454 is stopped, and the front nozzle 454 is moved to its given idle position away from the wafer W. The two nozzles 460 and 461 are moved to their operating positions above the wafer W. While the wafer W is being rotated at a low speed ranging from 30 to 150 min⁻¹, the nozzle 460 supplies the IPA vapor and the nozzle 461 supplies the pure water onto the front surface of the wafer W. During this operation, the back nozzle 463 supplies the pure water to the rear surface of the wafer W. The two nozzles 460 and 461 are simultaneously moved in the radial direction of the wafer W, whereby the front surface (upper surface) of the wafer W is dried.

Thereafter, the two nozzles 460 and 461 are moved to the their idle positions, and supply of the pure water from the back nozzle 463 is stopped. Then, the wafer W is rotated at a high speed ranging from 1000 to 1500 min.sup.−1, thereby removing the pure water from the rear surface of the wafer W. During this operation, the gas nozzle 464 supplies the drying gas to the rear surface of the wafer W. In this manner, the rear surface of the wafer W is dried. The dried wafer W is removed from the drying module 205A by the transfer robot 22 shown in FIG. 1, and returned to the wafer cassette. In this manner, a series of processes including polishing, cleaning, and drying of the wafer is performed. The drying module 205A according to the above-described structures can dry both upper and lower surfaces of the wafer W promptly and effectively, and can accurately controls an endpoint of the drying operation. Therefore, the drying process does not become a rate-limiting step in the overall cleaning process. Moreover, because the processing times in the multiple cleaning lines formed in the cleaning section 4 can be equalized, the throughput of the processes in their entirety can be improved.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims and equivalents.

What is claimed:

1. A polishing apparatus comprising:
    a wafer holder configured to hold a wafer;
    a top ring comprising a top ring body and a retainer ring movable relative to the top ring body;
    a ring supporter configured to support the retainer ring when the wafer is transferred from the wafer holder to the top ring and/or when the wafer is transferred from the top ring to the wafer holder;
    a polishing table configured to polish the wafer transferred to the top ring; and
    a sensor configured to detect whether the wafer is present on the wafer holder,
    wherein the top ring body comprises a wafer holding member configured to hold the wafer transferred from the wafer holder, the wafer holding member being located inside the retainer ring, and
    wherein a bottom face of the retainer ring moves, when the retainer ring is supported by the ring supporter, to a first position above a second position where the wafer is to be hold by the wafer holding member when the wafer is transferred from the wafer holder to the top ring and/or when the wafer is transferred from the top ring to the wafer holder.

2. The apparatus of claim 1, wherein the wafer is transferred from the wafer holder to the top ring and/or the wafer is transferred from the top ring to the wafer holder while the ring supporter is supporting the retainer ring.

3. The apparatus of claim 1 further comprising a guide configured to guide the top ring when the top ring and the wafer holder are brought close to each other such that the wafer held by the wafer holder contacts a bottom face of the top ring.

4. The apparatus of claim 3, wherein the top ring and the wafer holder are brought close to each other by moving the top ring and the wafer holder in a vertical direction.

5. The apparatus of claim 3, wherein the guide is on a circumference of the wafer holder.

6. The apparatus of claim 3, wherein an inner side of the guide is tapered.

7. The apparatus of claim 1 further comprising a wear measuring device configured to measure an amount of wear of the retainer ring.

8. The apparatus of claim 1, wherein the wafer holder is a transfer stage.

9. The apparatus of claim 1, wherein the ring supporter comprises a push-up mechanism configured to contact the retainer ring when the wafer is transferred from the wafer holder to the top ring and/or the wafer is transferred from the top ring to the wafer holder.

10. A polishing method comprising:
    detecting whether a wafer is present on a wafer holder;
    transferring the wafer from the wafer holder to a top ring comprising a top ring body and a retainer ring movable relative to the top ring body;
    polishing the wafer transferred to the top ring; and
    transferring the polished wafer from the top ring to the wafer holder,
    wherein
        the wafer is transferred from the wafer holder to the top ring while the retainer ring is supported, and/or
        the wafer is transferred from the top ring to the wafer holder while the retainer ring is supported,
    wherein the top ring body comprises a wafer holding member configured to hold the transferred wafer, the wafer holding member being located inside the retainer ring, and
    wherein a bottom face of the retainer ring moves, when the retainer ring is supported, to a first position above a second position where the wafer is to be hold by the wafer holding member.

11. The method of claim 10 further comprising, before transferring the wafer from the wafer holder to the top ring, bringing the top ring and the wafer close to each other while guiding the top ring such that the wafer contacts a bottom face of the top ring.

12. The method of claim 11, wherein the top ring and the wafer are brought close to each other by moving the top ring and the wafer in a vertical direction.

13. The method of claim 10 further comprising measuring an amount of wear of the retainer ring.

14. A polishing method comprising:
    transferring a wafer from a front loader to a transfer apparatus;
    transferring the wafer from the transfer apparatus to a wafer holder;
    detecting whether the wafer is present on the wafer holder;
    bringing a top ring and the wafer held by the wafer holder close to each other, the top ring comprising a top ring body and a retainer ring movable relative to the top ring body, and supporting the retainer ring;
    transferring the wafer to the top ring while the retainer ring is supported; and
    polishing the wafer transferred to the top ring,
    wherein the top ring body comprises a wafer holding member configured to hold the transferred wafer, the wafer holding member being located inside the retainer ring, and wherein a bottom face of the retainer ring moves, when the retainer ring is supported, to a first position above a second position where the wafer is to be hold by the wafer holding member.

15. The method of claim 14 further comprising transferring the polished wafer from the top ring to the wafer holder while the retainer ring is supported.

16. A polishing apparatus comprising:
a wafer holder configured to hold a wafer;
a top ring comprising a top ring body and a retainer ring movable relative to the top ring body;
a ring supporter configured to support the retainer ring when the wafer is transferred from the wafer holder to the top ring and/or when the wafer is transferred from the top ring to the wafer holder;
a polishing table configured to polish the wafer transferred to the top ring; and
a wear measuring device configured to measure an amount of wear of the retainer ring,
wherein the top ring body comprises a wafer holding member configured to hold the wafer transferred from the wafer holder, the wafer holding member being located inside the retainer ring, and
wherein a bottom face of the retainer ring moves, when the retainer ring is supported by the ring supporter, to a first position above a second position where the wafer is to be hold by the wafer holding member.

17. A polishing method comprising:
transferring a wafer from a wafer holder to a top ring comprising a top ring body and a retainer ring movable relative to the top ring body;
polishing the wafer transferred to the top ring;
measuring an amount of wear of the retainer ring; and
transferring the polished wafer from the top ring to the wafer holder,
wherein
the wafer is transferred from the wafer holder to the top ring while the retainer ring is supported, and/or
the wafer is transferred from the top ring to the wafer holder while the retainer ring is supported,
wherein the top ring body comprises a wafer holding member configured to hold the transferred wafer, the wafer holding member being located inside the retainer ring, and
wherein a bottom face of the retainer ring moves, when the retainer ring is supported, to a first position above a second position where the wafer is to be hold by the wafer holding member.

18. A polishing method comprising:
transferring a wafer from a front loader to a transfer apparatus;
transferring the wafer from the transfer apparatus to a wafer holder;
bringing a top ring and the wafer hold by the wafer holder close to each other, the top ring comprising a top ring body and a retainer ring movable relative to the top ring body, and supporting the retainer ring;
transferring the wafer to the top ring while the retainer ring is supported;
polishing the wafer transferred to the top ring; and
measuring an amount of wear of the retainer ring,
wherein the top ring body comprises a wafer holding member configured to hold the transferred wafer, the wafer holding member being located inside the retainer ring, and
wherein a bottom face of the retainer ring moves, when the retainer ring is supported, to a first position above a second position where the wafer is to be hold by the wafer holding member.

19. A polishing apparatus comprising:
a wafer holder configured to hold a wafer;
a top ring comprising a top ring body and a retainer ring, the retainer ring being movable relative to the top ring body;
a ring supporter configured to support the retainer ring when the wafer is transferred from the wafer holder to the top ring and/or when the wafer is transferred from the top ring to the wafer holder; and
a polishing table configured to polish the wafer transferred to the top ring,
wherein the top ring body comprises a wafer holding member configured to hold the wafer transferred from the wafer holder, the wafer holding member being located inside the retainer ring, and
wherein a bottom face of the retainer ring moves, when the retainer ring is supported by the ring supporter, to a first position above a second position where the wafer is to be hold by the wafer holding member.

20. The apparatus of claim 19, wherein when the wafer is transferred from the wafer holder to the top ring, the ring supporter moves the retainer ring relative to the top ring body.

21. The apparatus of claim 19, wherein the top ring further comprises an elastic member between the retainer ring and the top ring body.

22. The apparatus of claim 19 further comprising a guide configured to guide the top ring when the top ring and the wafer holder are brought close to each other such that the wafer held by the wafer holder contacts a bottom face of the top ring.

23. The apparatus of claim 22, wherein the top ring and the wafer holder are brought close to each other by moving the top ring and the wafer holder in a vertical direction.

24. The apparatus of claim 22, wherein the guide is on a circumference of the wafer holder.

25. The apparatus of claim 22, wherein an inner side of the guide is tapered.

26. The apparatus of claim 19 further comprising a wear measuring device configured to measure an amount of wear of the retainer ring.

27. The apparatus of claim 19 further comprising a sensor configured to detect whether the wafer is present on the wafer holder.

28. The apparatus of claim 19, wherein the wafer holder is a transfer stage.

29. The apparatus of claim 19, wherein the ring supporter comprises a push-up mechanism configured to contact the retainer ring when the wafer is transferred from the wafer holder to the top ring and/or the wafer is transferred from the top ring to the wafer holder.

* * * * *